US005705807A

United States Patent [19]
Throngnumchai et al.

[11] Patent Number: 5,705,807
[45] Date of Patent: Jan. 6, 1998

[54] PHOTO DETECTING APPARATUS FOR DETECTING REFLECTED LIGHT FROM AN OBJECT AND EXCLUDING AN EXTERNAL LIGHT COMPONET FROM THE REFLECTED LIGHT

[75] Inventors: Kraisorn Throngnumchai; Kazunori Nousou, both of Yokohama, Japan

[73] Assignee: Nissan Motor Co., Ltd., Kanagawa-ken, Japan

[21] Appl. No.: 547,230

[22] Filed: Oct. 24, 1995

[30] Foreign Application Priority Data

Oct. 24, 1994 [JP] Japan .................. P06-258287
May 8, 1995 [JP] Japan .................. P07-109465
May 5, 1995 [JP] Japan .................. P07-109540
Jun. 21, 1995 [JP] Japan .................. P07-154574

[51] Int. Cl.[6] ............................................ H01J 40/14
[52] U.S. Cl. .................... 250/214 P; 250/214 B; 356/221; 396/80
[58] Field of Search ............... 250/214 P, 214 A, 250/214.1, 214 R, 214 B; 356/221, 225, 226; 327/509, 514, 517; 330/308, 59, 9, 51; 396/80, 111, 120

[56] References Cited

U.S. PATENT DOCUMENTS 4,924,081  5/1990  Arima et al. .................... 250/214 R
5,448,056  9/1995  Tsuruta ............................ 250/214 A
5,521,555  5/1996  Tazartes et al. .................. 330/308

FOREIGN PATENT DOCUMENTS 62-54189  3/1987  Japan .
6-243381  9/1994  Japan .

OTHER PUBLICATIONS

AMI (Amplified MOS Intelligent Imager), by Ando Fumihiko et al., *Television Society Paper*, vol. 41, No. 11, pp. 1075-1082, Jan. 1987.

"Highway Automatic Driving System by Toyota", by Tachibana Akihide et al., *Toyota Technical Review*, vol. 43, No. 1, May 1993, pp. 20–25.

Primary Examiner—Que Le
Attorney, Agent, or Firm—Lowe, Price, LeBlanc & Becker

[57] ABSTRACT

There is provided a photosensor having a photoelectric converter for converting incident light into a photoelectric current, and a function of removing noise light from imaging light including noise light and reflected from an object to be photographed. A plurality of photosensors each having the arrangement are used as an image sensor. A single photosensor having the arrangement or a plurality of photosensors each having the arrangement are used as a distance sensor. There is provided a photosensor in which a storage unit stores electric quantity corresponding to fixed light, and electric quantity corresponding to reflected light in the state wherein electric quantity stored in the storage unit is reproduced by a reproduction unit is introduced, and the difference therebetween is reproduced as an electric signal. A single photosensor having the arrangement or a plurality of photosensors each having the arrangement are used as a distance sensor. The plurality of photosensors are used as an image or distance image sensor.

31 Claims, 38 Drawing Sheets

PHOTO DETECTING APPARATUS FOR DETECTING REFLECTED LIGHT FROM AN OBJECT AND EXCLUDING AN EXTERNAL LIGHT COMPONET FROM THE REFLECTED LIGHT

BACKGROUND OF THE INVENTION

1. Technical Field of the Invention

The present invention relates to a photosensor and a method of using the same and, more particularly, to a photosensor used in an image/distance sensing system for preventive safety device or an automatic driving device for an automobile and a method of using the photosensor.

2. Prior Art

In a recent automobile, a preventive safety device or an automatic driving device in which circumstances are input as an image, a distance to a forward automobile or obstacle is measured, a danger is avoided, and the automobile can be automatically driven is developed. An image/distance sensing system is the core of such a device. In particular, a photosensor of the image/distance sensing system considerably influences the performance of the device.

As a conventional image/distance sensing system, for example, the system shown in FIG. 1 (["Highway Automatic Driving System by Toyota" Tachibana Akihide, Aoki Keiji, TOYOTA TECHNICAL REVIEW, Vol. 43, No. 1, May 1993, pp.20–25) is available. Its arrangement and operation is as follows. That is, for detection of a white line required for lane keeping or the like, an image sensor sub-system 113 constituted by an image processing unit 112 and an image sensor 111 constituted by a CCD camera is arranged. In order to calculate a distance to a forward automobile, a distance sensor sub-system 116 constituted by a processing unit 115 and an laser radar 114 using a laser beam is arranged independently of the image sensor sub-system 113. Outputs from the image sensor sub-system 113 and the distance sensor sub-system 116 are input to a host microcomputer 117 and used to control an accelerator, a steering, a brake, or the like at last.

In this manner, a preventive safety device or an automatic driving device for an automobile requires an image sensor and a distance sensor. In a conventional system, these sensors are independently arranged. However, an image sensor is similar to an optical radar serving as a distance sensor because these sensors have photodiodes, respectively. If a distance can be measured by using the image sensor like the optical radar, the number of constituent elements of the system can be reduced, and it is expected that cost reduction and miniaturization can be realized. However, although an output from a conventional optical radar must be continued with time, an output from an image sensor is discrete with time. For this reason, the image sensor cannot be easily used as the conventional optical radar.

In this manner, in the conventional image/distance sensing system, the functions of the image sensor and the optical radar cannot be realized by the same sensor. For this reason, these sensors must be independently arranged. As a result, two light-receiving units and two optical systems such as lens systems for guiding light to these light-receiving units must be arranged, the system disadvantageously increases in size and cost. It is difficult to accurately adjust the relative positions of the two optical systems to each other.

As a conventional image sensor, a sensor shown in FIG. 2 ("Amplified-type Charged Coupled Device" AMI (Amplified MOS Intelligent Imager), Ando Fumihiko, Takekura Kazuhisa, Nakamura Kazuhiko, Imai Masaharu, Television Society Paper, Vol.41, No. 11, pp. 1075–1082, 1987) is available. FIG. 2 shows the arrangement of one pixel of an image sensor called an AMI. Its arrangement and operation will be described below. Light is converted by a photodiode PD into a photoelectric current, and charges corresponding to the converted current are amplified by an amplifying MOS transistor TA and then output. When the charges converted as described above are not directly read out, but are read out through the amplifying MOS transistor TA, a signal can be non-destructively read out. A switch SR is used to reset stored signal charges and set the gate potential of the amplifying MOS transistor TA to be an initial value $V_b$. For example, a p- or n-type MOSFET or an analog switch is used as the switch SR. Reference symbol $V_d$ denotes a power supply; and OUT, an output.

In an actual image sensor, as shown in FIG. 3, AMIs each corresponding to one pixel shown in FIG. 2 are one- or two-dimensionally arranged, and each pixel 1 is connected to a read out amplifier 2 by pixel selection switches S1, S2, S11, S12, S21, and S22. Reference symbol CS denotes an electrostatic capacitor for holding a readout signal. Although a specific electrostatic capacitor may be formed as the electrostatic capacitor CS, the input parasitic capacitor of a read out line and the read amplifier 2 can be used as the electrostatic capacitor CS.

For example, in order to select the pixel 1 at the intersection between lines X1 and Y1, the row selection line Y1 is selected first. As a result, the switches S11 and S21 are rendered conductive, output from all the pixels 1 arranged on the Y1 row are output to vertical signal lines. When the column selection line X1 is selected, the switch S1 is rendered conductive, only the vertical signal line of the X1 column is connected to the read out line and the read out amplifier 2. Therefore, a signal from the pixel (X1,Y1) is read out and stored in the electrostatic capacitor CS. The X-Y address scheme described above can select an arbitrary pixel easier than a charge transfer scheme used in a CCD camera, and is especially suitable for image processing.

FIG. 4 shows the equivalent circuit of the photodiode PD. Irradiation of light causes the photodiode PD to generate a current $I_{ph}$. The photodiode PD operates as not only a current generator but also a diode. A diode D which does not generate a photoelectric current is used to realize the diode operation of the photodiode PD,. Reference symbol C denotes the sum of the junction electrostatic capacitor of the diode D and the gate electrostatic capacitor of the amplifying MOS transistor TA. The electrostatic capacitor C is reset by the switch SR. When the switch SR is opened, the electrostatic capacitor C is charged by the photoelectric current $I_{ph}$. As a result, a voltage V across both the terminals is boosted, and the diode D is forwardly biased. When an exposure time is long, or light has a high intensity, a large number of charges are stored in the electrostatic capacitor C, and the voltage becomes high. When the voltage exceeds a forward-direction turn-on voltage $V_f$ (about 0.7 V at room temperature when Si is used) at last, a current I flows in the diode D. As a result, charges larger in number than a predetermined number defined by $C \cdot V_f$ cannot be stored in the electrostatic capacitor C. This means that an output from each pixel is saturated not to exceed a predetermined value.

FIG. 5 shows an application of a conventional image sensor. Its arrangement and operation will be described below. A light-emitting means 5 irradiates light on an object 7 to be photographed, and the reflected light or transmitted light are imaged by an image sensor 3 through an optical system such as a lens (not shown). The object 7 is irradiated with not only the light from the light-emitting means 5 but also, e.g., external light such as solar light. When imaging is to be performed outdoor, external light causes noise because the external light cannot be controlled. For this reason, although a method in which imaging is performed such that the emission amount of the light-emitting means 5 is made available, this method cannot be used when the external light has a very high intensity like solar light. This is because a large the object 7 or the environment. For this reason, the following method is considered. That is, the light-emitting means 5 intermittently emits light, and a difference between a signal obtained when light from the light-emitting means 5 is irradiated on the object and a signal obtained when only external light is irradiated on the object is calculated to cause the influence of the external light to cancel out. The light-emitting means 5 is turned on, and imaging is performed by the image sensor 3. The imaged image is transferred to an image memory 4 through a switch SA1. Next, the light-emitting means 5 is turned off, and imaging is performed again by the image sensor 3. Since, switches SA2 and SA3 are rendered conductive, and the signal in the image memory 4 and imaging signal are respectively transferred to the non-inversion input terminal (+) and inversion input terminal (−) of a differential amplifier 6. Therefore, the differential amplifier 6 an image signal outputs an image signal free from the influence of the external light.

In order to image a moving image on real time, an output time of the differential amplifier 6 per frame must be set to be 30 ms or less. That is, an output time of the image sensor 3 per frame must be set to be about 15 ms or less. Assume that the number of pixels of the image sensor is set to be 512×128. When the image sensor 3 sequentially scans in X and Y directions, row selection frequency is higher than 8.5 kHz (230 µs), and pixel selection frequency is higher than 4.4 MHz (230 ns). A time interval between when a pixel, e.g., (X1,Y1) in the image sensor 3 and when the same pixel is selected again is about 15 ms. An output signal from the image sensor 3 when the whole time interval is used to store charges is as indicated by a solid line (A) shown in FIG. 6. As is apparent from FIG. 6, since the output is larger than a saturation value, an actual output is saturated, and the signal cannot be extracted. For this reason, assume that an exposure time (=storing time of charges) is shortened by processing such as an increase in frame transfer speed to prevent the output from being saturated. An output from the image sensor 3 at this time is indicated by an alternate long and short dash line (B) in FIG. 6. In this case, an output component $V_3$ of signal light also decreases ($V_3 \ll V_1$), the signal cannot be easily detected. Therefore, the signal $V_3$ free from the influence of external light is extracted from the output (B), the signal $V_3$ is stored in another image memory to be amplified like a signal $V_4$. In this case a large output can be obtained, and detection can be easily performed.

However, in the conventional image sensor, in order to extract the signal component $V_3$, a 2-frame image signal is transferred from the image sensor to the image memory 4. For this reason, a frame transfer speed must be increased to store and amplify the signal component $V_3$. For example, the frame transfer time of the image sensor is set to be about 150 µs or less to store the signal component $V_3$ 100 times. Therefore, a selection time per pixel becomes very short, i.e., 2.3 ns (440 MHz), and such a ultra-high-speed switching operation cannot be easily realized.

FIG. 7 shows a conventional photosensor serving as a distance sensor. A loading resistor 122 is connected in series with a photoelectric converter 121, and the connection point is connected to an AC amplifier 123. In this case, only the photoelectric converter 121 constituted by a simple element such as a photodiode, a PIN photodiode, or an avalanche photodiode serves as a light-receiving sensor. A photoelectric current converted by the photoelectric converter 121 flows in the loading resistor 122 to be converted into a voltage, and the voltage is amplified by the AC amplifier 123 to be output.

An optical radar can be constituted by using the photosensor described above. In this case, when a time from when a light-emitting unit emits light to when the light reflected from an object returns to the photosensor is measured, a distance to the object can be measured. The concrete arrangement of the photosensor is described in, e.g., Japanese Patent Application No. 6-243381. However, as described above, the photosensor receives not only light returning from the light-emitting unit but also external light (to be referred to as background light hereinafter) at once. Background light generally has an intensity higher than that of signal light. For this reason, a photoelectric current obtained by the photoelectric converter 121 has time characteristics shown in FIG. 8. In FIG. 8, t is a time difference between light emission and light reception, and is in proportion to a distance. When the AC amplifier 123 is used as an amplifier, a background light component serving as a DC component can be removed.

However, in the conventional photosensor, the following three problems are posed. As the first problem, a large background light current is input to the AC amplifier 123. On the other hand, the shot noise of the amplifier is in proportion to an average current as shown in the following expression:

$$i_n^2 = 2q \cdot I_d \cdot \Delta f \quad (1)$$

where $i_n^2$ is a shot noise power, q is a unit charge (1.6 ×10$^{-19}$ coulomb), $I_D$ is an average current, and $\Delta f$ is a frequency band width of the amplifier.

When the background light current is large, $I_D$ is becomes large. As a result, shot noise increases.

As second problem, the background light current is not a complete DC current, and moderately changes. Depending on the change in the background light current, the frequency characteristic of the AC amplifier 123 must be changed. That is, the frequency characteristic of the AC amplifier 123 must be designed again every system, and the cost of developing a s increases.

The third problem is when the AC amplifier 123 and the photoelectric converter 121 are integrated on the same chip. When the AC amplifier 123 and the photoelectric converter 121 are integrated on the same chip to increase the degree of amplification, influence of noise can be suppressed. As a result an S/N ratio increases. However, as shown in FIG. 7, the AC amplifier 123 requires a large capacitor for coupling, the AC amplifier 123 is not suitable for an integrated circuit. When a DC amplifier which can be integrated is used, a background light component is also amplified. For this reason, when the degree of amplification is increased, the amplifier is saturated, and a signal component cannot be extracted. Therefore, the degree of amplification cannot be increased, a low S/N ratio is disadvantageously obtained.

SUMMARY OF THE INVENTION

The present invention has been made in consideration of the above circumstances, and has as its object to provide a photosensor in which shot noise can be reduced to increase an S/N ratio, and the cost can be reduced by facilities for design and integration.

It is another object of the present invention to provide a photosensor in which an output is not easily saturated without an ultra-high-speed switching operation, high controllability can be obtained, and pixels can be micropatterned when the photosensor is used as an image sensor.

It is still another object to provide a low-cost, compact, high-accurate photosensor capable of realizing both the functions of an image sensor and a distance sensor.

In order to achieve the above objects, the present invention provides a photosensor, comprising: photoelectric conversion means for converting incident light into a photoelectric current; and differential electric quantity generation means for calculating a difference between electric quantity based on a photoelectric current obtained by the photoelectric conversion means in a first period and electric quantity based on a photoelectric current obtained by the photoelectric conversion means in a second period.

In a preferable embodiment of the present invention, the differential electric quantity generation means comprises: a first storing electrostatic capacitor in which charges serving as electric quantity corresponding to the first period are stored; a second storing electrostatic capacitor in which charges serving as electric quantity corresponding to the second period are stored; transfer means for subtracting the charges stored in the second storing electrostatic capacitor from the charges stored in the first storing electrostatic capacitor and transferring resultant charges; and a holding electrostatic capacitor in which the charges transferred by the transfer means are stored.

In this manner, since a charge storing time to the charging electrostatic capacitor can be set independently of a timing of reading a pixel, i.e., a timing of reading charges from the holding electrostatic capacitor, the stored charges can be suppressed from being saturated without an ultra-high-speed switching operation. Therefore, the capacitance and size of the storing electrostatic capacitor can be smaller than those of a conventional storing electrostatic capacitor. In addition, in the holding electrostatic capacitor, saturation can be suppressed because only a signal charge component is added and stored in one frame. As in the above description, the capacitance and the size can be reduced, and a large output can be obtained.

In a preferable embodiment of the present invention, the differential electric quantity generation means comprises: a storing electrostatic capacitor in which charges serving as electric quantity corresponding to the first or second period are stored; transfer means for transferring charges serving as electric quantity corresponding to the second or first period converted by the photoelectric conversion means and the charges stored in the storing electrostatic capacitor in characteristics opposite to each other; and a holding electrostatic capacitor in which the charges transferred by the transfer means are stored.

In this manner, since only one storing electrostatic capacitor is required, pixels can be micropatterned further.

In a preferable embodiment of the present invention, the differential electric quantity generation means comprises: transfer means for transferring charges serving as electric quantity corresponding to the first period converted by the photoelectric conversion means and charges serving as electric quantity corresponding to the second period in characteristics opposite to each other; and a holding electrostatic capacitor in which the charges transferred by the transfer means are stored.

In this manner, since the holding electrostatic capacitor directly performs subtraction of a noise charge component, a storing electrostatic capacitor is unnecessary, and pixels are micropatterned further.

In a preferable embodiment of the present invention, the differential electric quantity generation means comprises: a storing electrostatic capacitor in which, after charges serving as electric quantity corresponding to the first period converted the photoelectric conversion means are stored, charges serving as electric quantity corresponding to the second period are stored in opposite characteristics; transfer means for transferring the charges stored in the storing electrostatic capacitor; and a holding electrostatic capacitor in which the charges transferred by the transfer means are stored.

In a preferable embodiment of the present invention, the differential electric quantity generation means comprises: a storing electrostatic capacitor for storing charges serving as electric quantity corresponding to the first period converted by the photoelectric conversion means and charges serving as electric quantity corresponding to the second period in characteristics opposite to each other; transfer means for transferring the charges serving as electric quantity corresponding to the first period stored in the storing electrostatic capacitor, and after that, transferring the charges serving as electric quantity corresponding to the second period stored in the storing electrostatic capacitor; and a holding electrostatic capacitor for storing the charges transferred by the transfer means.

In this manner, since only one storing electrostatic capacitor is required, pixels can be micropatterned further.

In a preferable embodiment of the present invention, the differential electric quantity generation means further comprises: storing time change means for amplifying a current stored as charges in the first storing electrostatic capacitor by a predetermined plural number, and storing, in the second storing electrostatic capacitor, charges in a period which is the predetermined plural number times as long as a predetermined period stored in the first storing electrostatic capacitor.

In this manner, since a time for storing incident light in the storing electrostatic capacitor can be set to be longer than a time for detecting background light, sensitivity can be improved. The number of times of a switching operation between positive and negative phases decreases, and loss of signal charges in the switching operation decreases. For this reason, sensitivity can be further improved. When the intensity of signal light has a sufficiently high intensity, and a large output can be obtained within a short storing time in the positive phase, in contrast to the above case, by storing the background light charge component for a long time, influence of noise of the background light decreases, and an image signal can be detected at high accuracy.

In a preferable embodiment of the present invention, the differential electric quantity generation means further comprises: storing time change means for amplifying a voltage based on charges stored in the first storing electrostatic capacitor in a predetermined period by a predetermined plural number, and storing, in the second storing electrostatic capacitor, charges in a period which is the predetermined plural number times as long as the predetermined period.

In a preferable embodiment of the present invention, the differential electric quantity generation means further comprises: storing time change means for setting a capacitance of the first storing electrostatic capacitor to be 1/(a predetermined number) times as large as a capacitance of the second storing electrostatic capacitor.

In a preferable embodiment of the present invention, the differential electric quantity generation means further comprises: storing time change means for holding charges stored in the first storing electrostatic capacitor in a predetermined period in a period which is a predetermined plural number times as long as the predetermined period, and storing charges in the second storing electrostatic capacitor every predetermined period.

In this manner, since a time for storing incident light charges in a positive phase can be set to be a plural number times as long as a background light detecting time, sensitivity can be improved.

In a preferable embodiment of the present invention, the differential electric quantity generation means further comprises: storing time changing means for storing, in the first storing electrostatic capacitor, charges obtained by performing detection for a time which is a predetermined plural number times as long as a predetermined time, for the predetermined time, or storing, in the first storing electrostatic capacitor, 1/(the predetermined plural number) charges obtained by performing detection for a time which is a predetermined plural times as long as a predetermined time, for storing charges in the second storing electrostatic capacitor for the predetermined time, and subtracting the charges stored for the predetermined time or the 1/(the predetermined plural number) charges from the charges stored in the second storing electrostatic capacitor, and for transferring resultant charges to the holding electrostatic capacitor.

In the manner, when the intensity of signal light has a sufficiently high intensity, and a large output can be obtained within a short storing time in the positive phase, in contrast to the above case, by storing the background light charge component for a long time, influence of noise of the background light decreases, and an image signal can be detected at high accuracy.

In a preferable embodiment of the present invention, the transfer means comprises an electric switch comprising an arithmetic amplifier and a MOSFET, an electric switch comprising a unit gain buffer comprising a voltage follower and a MOSFET, or an electric switch including a source follower type MOSFET and a MOSFET.

In this manner, since all positive and negative charges stored in the storing electrostatic capacitor can be transferred to the holding electrostatic capacitor regardless of the capacitance of the holding electrostatic capacitor, degradation of an image cause by a latent image can be prevented.

In a preferable embodiment of the present invention, at least part of the storing electrostatic capacitor, the first storing electric capacitor, or the second storing electric capacitor is formed by a junction capacitor of the photoelectric conversion means or a parasitic capacitor of a wiring.

In this manner, pixels can be micropatterned further.

In a preferable embodiment of the present invention, at least part of the holding electrostatic capacitor is formed by an input capacitor of the arithmetic amplifier or the unit gain buffer or a parasitic capacitor of a wire.

In this manner, pixels can be micropatterned further.

In a preferable embodiment of the present invention, the differential electric quantity generation comprises: a high-pass filter or a bandpass filter for cutting a time frequency component, having a frequency lower than a predetermined frequency, of an output from the photoelectric conversion means to extract a signal component.

In this manner, since the signal component can be extracted in an asynchronous system, high controllability can be obtained.

In a preferable embodiment of the present invention, a holding electrostatic capacitor which is at least part of an integrator is arranged, an output terminal of the high-pass filter or the bandpass filter is connected to the integrator constituted by the holding electrostatic capacitor, and the high-pass filter or the bandpass filter has a order of not less than 2.

In this manner, the cut-off characteristic curve of the filter becomes sharp, and only a signal component can be reliably integrated and amplified, so that a pixel output can be increased.

In a preferable embodiment of the present invention, the high-pass filter or the bandpass filter is constituted by a switched capacitor type circuit.

In this manner, the high-pass filter or the bandpass filter can be realized with high characteristic accuracy.

In order to achieve the above objects, the present invention provides a photosensor group comprising: a plurality of photosensors each comprising photoelectric conversion means for converting incident light into a photoelectric current, and differential electric quantity generation means for calculating a difference between electric quantity based on a photoelectric current obtained by the photoelectric conversion means in a first period and electric quantity based on a photoelectric current obtained by the photoelectric conversion means in a second period; a wire for one- or two-dimensionally connecting the plurality of photosensors to each other; and a plurality of scanning switches for selecting the plurality of photosensors, respectively.

In order to achieve the above objects, the present invention provides a method of using a photosensor group as a image sensor, characterized in that: a photosensor group comprising a plurality of photosensors each comprising photoelectric conversion means for converting incident light into a photoelectric current; and differential electric quantity generation means for calculating a difference between electric quantity based on a photoelectric current obtained by the photoelectric conversion means in a first period and electric quantity based on a photoelectric current obtained by the photoelectric conversion means in a second period; a wire for one- or two-dimensionally connecting the plurality of photosensors to each other; and a plurality of scanning switches for selecting the plurality of photosensors, respectively, functions as an image sensor such that the incident light related to the first period is regarded as noise light, and the incident light related to the second period is regarded as imaging light including the noise light and reflected from an object to be photographed.

In a preferable embodiment of the present invention, a timing at which charges or negative charges stored in the storing electrostatic capacitor, the first storing electrostatic capacitor, or the second storing electrostatic capacitor are transferred to the holding electrostatic capacitor is set to be synchronized with a timing of floodlighting to the object to be photographed.

In this manner, since a signal charge component can be stored in the holding electrostatic capacitor in each cycle, a pixel output can be increased.

In a preferable embodiment of the present invention, a frequency at which charges or negative charges are transferred to the holding electrostatic capacitor is set to be higher than a frequency at which a signal is read from the holding electrostatic capacitor.

In this manner, a pixel output can be increased without saturating the pixel output.

In a preferable embodiment of the present invention, charges or negative charges stored in the storing electrostatic capacitor, the first storing electrostatic capacitor, or the second storing electrostatic capacitor are transferred to a holding electrostatic capacitor belonging to another photosensor.

In this manner, a transfer timing need not be synchronized with a floodlighting timing, high controllability can be obtained.

In order to achieve the above objects, the present invention provides a method of using a photosensor as a distance sensor comprising: a photosensor comprising photoelectric conversion means for converting incident light into a photoelectric current, and differential electric quantity generation means for calculating a difference between electric quantity based on a photoelectric current obtained by the photoelectric conversion means in a first period and electric quantity based on a photoelectric current obtained by the photoelectric conversion means in a second period; and a light-emitting unit, characterized in that the incident light related to the first period is regarded as fixed light, the incident light related to the second period is regarded as reflected light related to light emitted from the light-emitting unit, and the photosensor operates as a distance sensor by measuring a time from light emission of the light-emitting unit to light reception of the light-emitting unit.

In this manner, the arrangement which originally functions as an image sensor can function as a distance sensor.

In order to achieve the above objects, the present invention provides a method of using a photosensor as a distance sensor comprising: a plurality of photosensors each comprising photoelectric conversion means for converting incident light into a photoelectric current, and differential electric quantity generation means for calculating a difference between electric quantity based on a photoelectric current obtained by the photoelectric conversion means in a first period and electric quantity based on a photoelectric current obtained by the photoelectric conversion means in a second period; and a light-emitting unit, characterized in that the incident light related to the first period is regarded as fixed light, the incident light related to the second period is regarded as reflected light related to light emitted from the light-emitting unit, and the photosensors operate as a distance sensor by measuring a time from light emission of the light-emitting unit to light reception of the light-emitting unit.

In a preferable embodiment of the present invention, time at which the reflected light is read is common in each of the plurality of photosensors, and is changeable.

In this manner, controllability and sensitivity are improved, and the presence/absence of an object to be detected can be determined at high accuracy. In addition, not only the presence/absence of the object to be detected but also a distance to the object can be detected.

In a preferable embodiment of the present invention, addition of the reflected light component is performed a plurality of times.

In this manner, detection sensitivity can be improved, and an S/N ratio can be increased.

In a preferable embodiment of the present invention, the shorter a time from the light emission of the light-emitting unit to reading the reflected light is, the smaller the number of times of addition is set be.

In this manner, a whole processing time can be shortened with keeping detection sensitivity at a predetermined level.

In a preferable embodiment of the present invention, the differential electric quantity generation means comprises: storage means for storing electric quantity based on a photoelectric current in the first period; reproduction means for reproducing, in the second period, the electric quantity stored in the storage means; and generation means for performing addition or subtraction of electric quantity based on a photoelectric current in the second period and the electric quantity reproduced by the reproduction means to generate a difference therebetween as electric quantity.

In this manner, in an application to, e.g., an optical radar or the like, only background light having an intensity higher than signal light is received in the first period to store a background light DC component in a current storage unit, and the background light and the signal light are received while the background light DC component is reproduced in the second period. Processing for subtracting the background light DC component from the converted photoelectric current is additionally performed to remove influence of the background light, thereby outputting a signal component. Therefore, when the signal component is to be amplified by an amplifier, the background light DC component having a large value is removed. For this reason, shot noise of the amplifier is reduced, and an S/N ratio can be increased. Since a DC amplifier can be used as the amplifier, the developing cost of a system can be decreased. In addition, since a capacitor for coupling is not required, facilities for integration can be obtained.

In a preferable embodiment of the present invention, the reproduction means comprises a MOSFET, and the storage means comprises a gate capacitor of the MOSFET.

In this manner, the arrangement is simplified, and great facilities for integration can be obtained.

In order to achieve the above objects, the present invention provides a method of using a photosensor as a distance sensor comprising: a photosensor comprising a photoelectric conversion means for converting incident light into a photoelectric current, storage means for storing electric quantity based on a photoelectric current in the first period, reproduction means for reproducing, in the second period, the electric quantity stored in the storage means, and generation means for performing addition or subtraction of electric quantity based on a photoelectric current in the second period and the electric quantity reproduced by the reproduction means to generate a difference therebetween as electric quantity; and a light-emitting unit, characterized in that the incident light related to the first period is regarded as fixed light, the incident light related to the second period is regarded as reflected light related to light emitted from the light-emitting unit, and the photosensor operates as a distance sensor by measuring a time from light emission of the light-emitting unit to generation of electric quantity by the generation means.

In order to achieve the above objects, the present invention provides a photosensor group comprising: a plurality of photosensors each comprising a photoelectric conversion means for converting incident light into a photoelectric current, and differential electric quantity generation means comprising storage means for storing electric quantity based on a photoelectric current in the first period, reproduction means for reproducing, in the second period, the electric quantity stored in the storage means, and generation means for performing addition or subtraction of electric quantity based on a photoelectric current in the second period and the electric quantity reproduced by the reproduction means to generate a difference therebetween as electric quantity; a wire for one- or two-dimensionally connecting the plurality of photosensors to each other; and a plurality of scanning switches for selecting the plurality of photosensors, respectively.

In order to achieve the above objects, the present invention provides a method of using a photosensor group as a image sensor characterized in that: a photosensor group comprising a plurality of photosensors each comprising photoelectric conversion means for converting incident light into a photoelectric current, and differential electric quantity generation means comprising storage means for storing electric quantity based on a photoelectric current in the first period, reproduction means for reproducing, in the second period, the electric quantity stored in the storage means, and generation means for performing addition or subtraction of electric quantity based on a photoelectric current in the second period and the electric quantity reproduced by the reproduction means to generate a difference therebetween as electric quantity; a wire for one- or two-dimensionally connecting the plurality of photosensors to each other; and a plurality of scanning switches for selecting the plurality of photosensors, respectively, functions as an image sensor such that the incident light related to the first period is regarded as noise light, and the incident light related to the second period is regarded as imaging light including the noise light and reflected from an object to be photographed.

In this manner, the arrangement which originally functions as an image sensor can function as a distance sensor. A reduction in size, a reduction in cost, and improvement of accuracy can be achieved.

The nature, principle and utility of the invention become more apparent from the following detailed description when read in conjunction with the accompanying drawings.

DESCRIPTION OF THE PREFERRED EMBODIMENT

Embodiments of the present invention will be described below with reference to the accompanying drawings.

Figure 9:
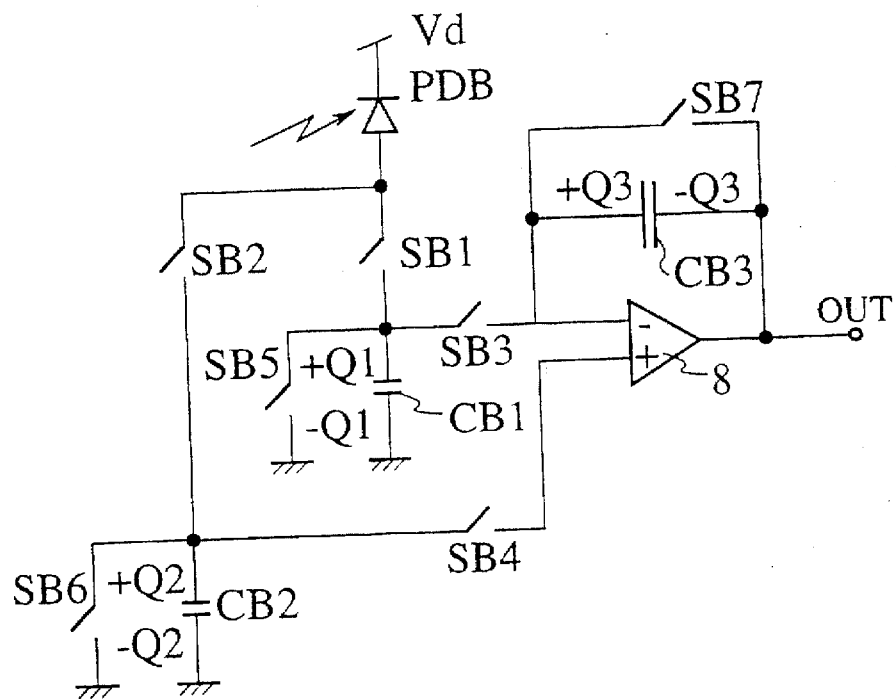
FIG. 9 is a circuit diagram of the first embodiment when a photosensor according to the present invention is constituted as an image sensor.

FIG. 9 is a circuit diagram of the first embodiment in which a photosensor according to the present invention is constituted as an image sensor. An arrangement is described first. A PIN photodiode PDB is used as a photoelectric converting unit for photoelectrically converting incident light, and the output side of the PIN photodiode PDB is connected, through switches SB1 and SB2, to storing electrostatic capacitors $CB_1$ and $CB_2$ for temporarily storing charges. Both the negative electrodes of the storing electrostatic capacitors $CB_1$ and $CB_2$ are grounded. The positive electrode of the storing electrostatic capacitor $CB_1$ is connected to the inversion input terminal (−) of an operation amplifier 8 through a switch SB3, and the positive electrode of the storing electrostatic capacitor $CB_2$ is connected to the non-inversion input terminal (+) of the operation amplifier 8 through a switch SB4. The output terminal of the operation amplifier 8 is connected to the negative electrode of a holding electrostatic capacitor $CB_3$ for storing an arithmetic result, and this connection point is used as an output terminal OUT. The positive electrode of the holding electrostatic capacitor $CB_3$ is connected to the inversion input terminal (−) of the operation amplifier 8. Switches SB5, SB6, and SB7 are reset switches of the electrostatic capacitors $CB_1$, $CB_2$, and $CB_3$. Reference symbol Vd denotes a power supply.

An operation of the image sensor arranged as described above will be described below. The reset switches SB5 SB6 are rendered conductive to reset the storing electrostatic capacitors $CB_1$ and $CB_2$. The reset switches SB5 and SB6 are turned off to render the switch SB1 conductive. Charges $Q_1$ corresponding to a photoelectric current photoelectrically converted by the PIN photodiode PDB while the switch SB1 is in an ON state are stored in the storing electrostatic capacitor $CB_1$. The switch SB1 is turned off, and the switch SB2 is turned on. Charges $Q_2$ corresponding to a photoelectric current photoelectrically converted by the PIN photodiode PDB while the switch SB2 is in an ON state are stored in the storing electrostatic capacitor $CB_2$. The switch SB2 is turned off, and the switches SB3 and SB4 are turned on. The electrostatic potential of the inversion input terminal (−) of the operation amplifier 8 becomes equal to the electrostatic potential of the non-inversion input terminal (+), i.e., the electrostatic potential ($=Q_2/CB_2$) of the storing electrostatic capacitor $CB_2$ by virtual grounding. As a result, the potential of the storing electrostatic capacitor $CB_1$ must change from $Q_1/CB_1$ to $Q_2/CB_2$. For descriptive convenience, $CB_1=CB_2=CB$ is established. In this case, charges ($Q_1$–$Q_2$) stored in the storing electrostatic capacitor $CB_1$ must flow from the storing electrostatic capacitor $CB_1$. Since the input impedance of the operation amplifier 8 is ideally infinite, the charges ($Q_1$–$Q_2$) flows into the positive electrode the holding electrostatic capacitor $CB_3$. As a result, charges of the holding electrostatic capacitor CB3 changes from $Q_3$ to ($Q_3$+$Q_1$–$Q_2$). In this manner, charges obtained by integrating the difference between $Q_1$ and $Q_2$ are stored in the holding electrostatic capacitor $CB_3$. As described above, the switches SB3 and SB4 and the operation amplifier 8 constitutes a subtraction transfer means for obtaining the difference between the charges stored in the storing electrostatic capacitors $CB_1$ and $CB_2$ to transfer the result to the holding electrostatic capacitor $CB_3$ In this case, when synchronization is established such that the switch SB1 is turned on when the light-emitting means 5 is in an ON state and the switch SB2 is turned on when the light-emitting means 5 is in an OFF state, the influence of external light is eliminated, and the signal of only light emitted from the light-emitting means 5 can be added and stored in the holding electrostatic capacitor $CB_3$. At this time, since the timings of the switches SB1, SB2, SB3, and SB4 can be set completely independently of a pixel read timing, for example, the ON time of the switches SB1, SB2, SB3, and SB4 is set to be 150 µs (6.7 kHz). Since charges stored in the storing electrostatic capacitors $CB_1$ and $CB_2$ are in proportion to the ON time, the ON time becomes small, i.e., 1/100 compared with 15 ms of the prior art. Therefore, an output is not saturated by the storing electrostatic capacitors CB1 and CB2, and the capacitances of the storing electrostatic capacitors $CB_1$ and $CB_2$ can be smaller than those of the prior art. The number of charges stored in the holding electrostatic capacitor CB3 is small because the charges are constituted by the signal of the light emitted from the light-emitting means. Differential charges are transferred to and stored in the holding electrostatic capacitor $CB_3$ every about 300 µs, and the differential charges are additionally amplified 100 times in 1 frame (30 ms). For this reason, an output is not saturated by the holding electrostatic capacitor $CB_3$, and the capacitance of the holding electrostatic capacitor $CB_3$ can be smaller than that of a conventional pixel. Since the charges stored in the holding electrostatic capacitor $CB_3$ are read out once per frame, upon completion of the reading operation, the holding electrostatic capacitor $CB_3$ can be reset through the switch SB7. Note that the operation amplifier 8 also has a function of amplifying output charges like a amplifying MOS transistor TA of an AMI.

AS described above, according to this embodiment, an output from each pixel is not saturated unless a high-speed switching operation is performed, and signal charges obtained by differentiation can be integrated in 1 frame, thereby obtaining a large output. Since the output is not easily saturated, the capacitances of the storing electrostatic capacitors $CB_1$, $CB_2$, and $CB_3$ can be decreased, pixels can be micropatterned compared with conventional pixels. Since the output is not easily saturated as the switching frequencies of the switches SB1, SB2, SB3, and SB4, the switching frequencies are preferably increased in a design for the layout pattern of pixels. For example, control signal lines for controlling these switches are preferably wired by using a metal such as aluminum to decrease a wiring resistance, thereby increasing the switching frequencies. In contrast to this, since a readout frequency is low, although the wiring resistance of the control signal Lines for switches S11, S21, S12, and S22 or switches S1 and S2 increases to some extent, wiring may be performed by using polycrystalline Si which can be easily micropatterned.

However, this embodiment has the following points to be improved. (1) Since different storing electrostatic capacitors are respectively used in a positive phase and a negative phase, the two storing electrostatic capacitors CB1 and $CB_2$ are required. On the other hand, the storing electrostatic capacitor $CB_2$ does not operate to be set in a standby state while the storing electrostatic capacitor $CB_1$ is stored. In contrast to this, the storing electrostatic capacitor $CB_1$ does not operate while the storing electrostatic capacitor $CB_2$ is stored. If one storing electrostatic capacitor can be constituted by both the storing electrostatic capacitors $CB_1$ and $CB_2$, the pixels can be more micropatterned. (2) The operation amplifier 8 must be formed in each pixel. Since an operation amplifier generally has a large size, the operation amplifiers prevent the pixels from being micropatterned. (3) The storing electrostatic capacitors $CB_1$ and $CB_2$ must be reset. As a result, the number of reset switches increases, and the pixels are not easily micropatterned.

Figure 10:
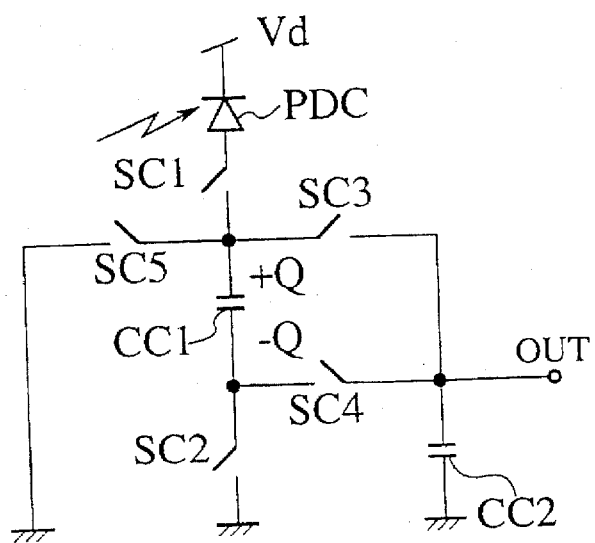
FIG. 10 is a circuit diagram of the second embodiment when a photosensor according to the present invention is constituted as an image sensor.

FIG. 10 is a circuit diagram of the second embodiment when a photosensor according to the present invention is constituted as an image sensor. According to this embodiment, one of the points to be improved in the first embodiment, i.e., two storing electrostatic capacitors are required, is improved. The arrangement of the second embodiment will be described. A PIN photodiode PDC is used as a photoelectric converter, and its output terminal is connected to the positive electrode of a storing electrostatic capacitor $CC_1$ through a switch SC1. The negative electrode of the storing electrostatic capacitor $CC_1$ is grounded through a switch SC2 and connected to the positive electrode of a holding electrostatic capacitor $CC_2$ through a switch SC4, and the connection point is used as an output terminal. The negative electrode of the holding electrostatic capacitor $CC_2$ is grounded, and the positive electrode of the storing electrostatic capacitor $CC_1$ is grounded through a switch SC5. The positive electrode of the storing electrostatic capacitor $CC_1$ is connected to the positive electrode of the holding electrostatic capacitor $CC_2$ through a switch SC3.

An operation of this embodiment will be described. When the switches SC1 and SC2 are turned on, charges corresponding to a photoelectric current output from the PIN photodiode PDC are stored in the storing electrostatic capacitor $CC_1$. When the switches SC1 and SC2 are turned off, and the switches SC2 and SC3 are turned on, charges $Q_1$ present at the positive electrode of the storing electrostatic capacitor CC1 moves to the holding electrostatic capacitor $CC_2$, and are stored in the holding electrostatic capacitor $CC_2$. At this time, the holding electrostatic capacitor $CC_2$ is designed to have a capacitance considerably larger than that of the storing electrostatic capacitor $CC_1$, most of charges of the storing electrostatic capacitor $CC_1$ move to the holding electrostatic capacitor $CC_2$, and the storing electrostatic capacitor $CC_1$ becomes vacant. The switches SC2 and SC3 are turned off, and the switches SC1 and SC2 are turned on again, thereby storing optically generated charges in the storing electrostatic capacitor CC1. The switches SC1 and SC2 are turned off, and the switches SC4 and SC5 are turned on. At this time, charges –$Q_2$ present at the negative electrode of the storing electrostatic capacitor $CC_1$ moves to the positive electrode of the holding electrostatic capacitor $CC_2$. As a result, in one cycle, a total of charges ($Q_1$–$Q_2$) move to the holding electrostatic capacitor $CC_2$, and are stored therein. For example, when the charges $Q_1$ stored in the storing electrostatic capacitor $CC_1$ when a light-emitting means 5 is in an ON state are of a positive phase, and the charges $Q_2$ stored in the storing electrostatic capacitor $CC_1$ when the light-emitting means 5 is in an OFF state are of a negative phase, the charges of both the positive and negative phases can be stored in the same storing electrostatic capacitor CC1, and pixels can be micropatterned. In this case, since most of the charges stored in the storing electrostatic capacitor $CC_1$ are transferred to the holding electrostatic capacitor $CC_2$, the storing electrostatic capacitor CC1 need not be reset, and the number of switches decreases. According to this embodiment, the switches SC3 and SC4 are used as a transfer means for charges stored in the storing electrostatic capacitor $CC_1$ to the holding electrostatic capacitor $CC_2$.

However, this embodiment has the following points to be improved. (1) Since the capacitance of the holding electrostatic capacitor $CC_2$ must be increased, the pixels cannot be easily micropatterned. (2) Since the charges stored in the storing electrostatic capacitor $CC_1$ cannot be completely moved to the holding electrostatic capacitor $CC_2$, an image may be degraded due to a after-image.

Figure 11:
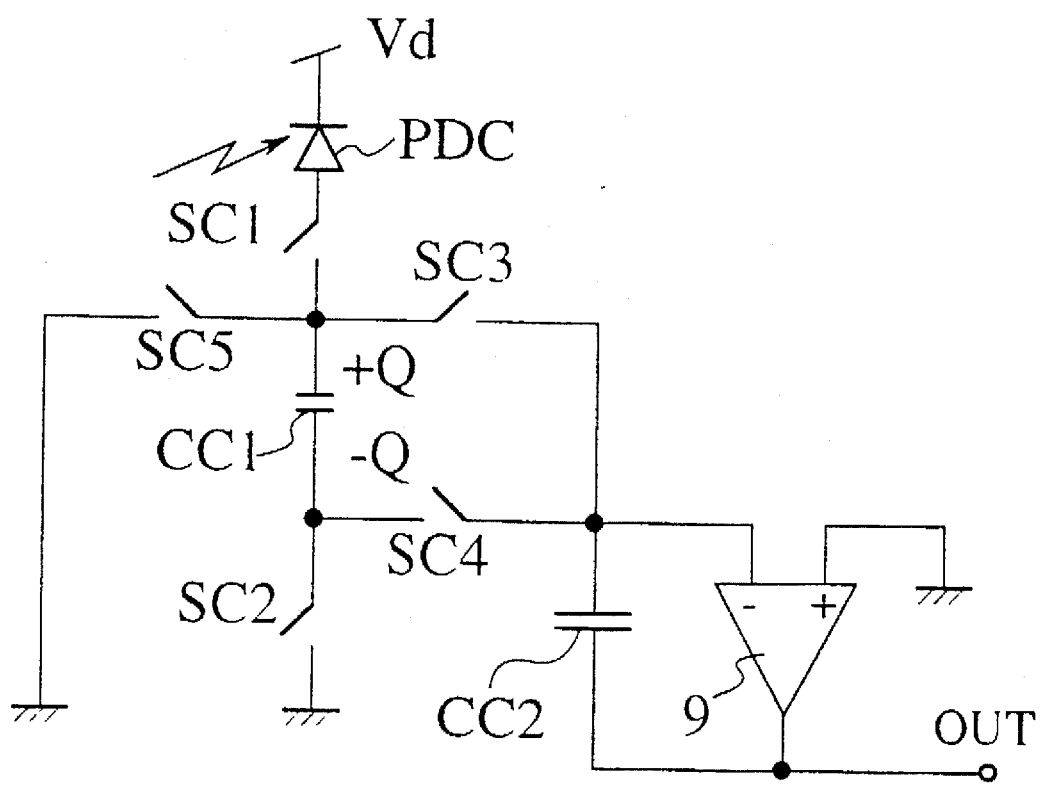
FIG. 11 is a circuit diagram of the third embodiment when a photosensor according to the present invention is constituted as an image sensor.

FIG. 11 is a circuit diagram of the third embodiment when an optical sensor according to the present invention. According to this embodiment, the points to be improved in the second embodiment are improved. According to this embodiment, the negative electrode of a holding electrostatic capacitor $CC_2$ is not grounded, and is connected to the output terminal of an operation amplifier 9, and the connection point is used as an output terminal OUT. The inversion input terminal (−) of the operation amplifier 9 is connected to the positive electrode of the holding electrostatic capacitor $CC_2$, and the non-inversion input terminal (+) of the operation amplifier 9 is grounded. With the above arrangement, when charges are moved from the positive or negative electrode of a storing electrostatic capacitor $CC_1$ to the holding electrostatic capacitor $CC_2$, the inversion input terminal (−) of the operation amplifier 9 is virtually grounded, and the input impedance of the operation amplifier 9 is high. For this reason, all the charges of the storing electrostatic capacitor $CC_1$ are moved to the holding electrostatic capacitor $CC_2$ regardless of the capacitance of the holding electrostatic capacitor $CC_2$. As a result, the capacitance of the holding electrostatic capacitor $CC_2$ can be decreased, and degradation of an image caused by a after-image -can be prevented. The operation amplifier 9 has the function of the transfer means as described above and a function of amplifying output charges.

Figure 12:
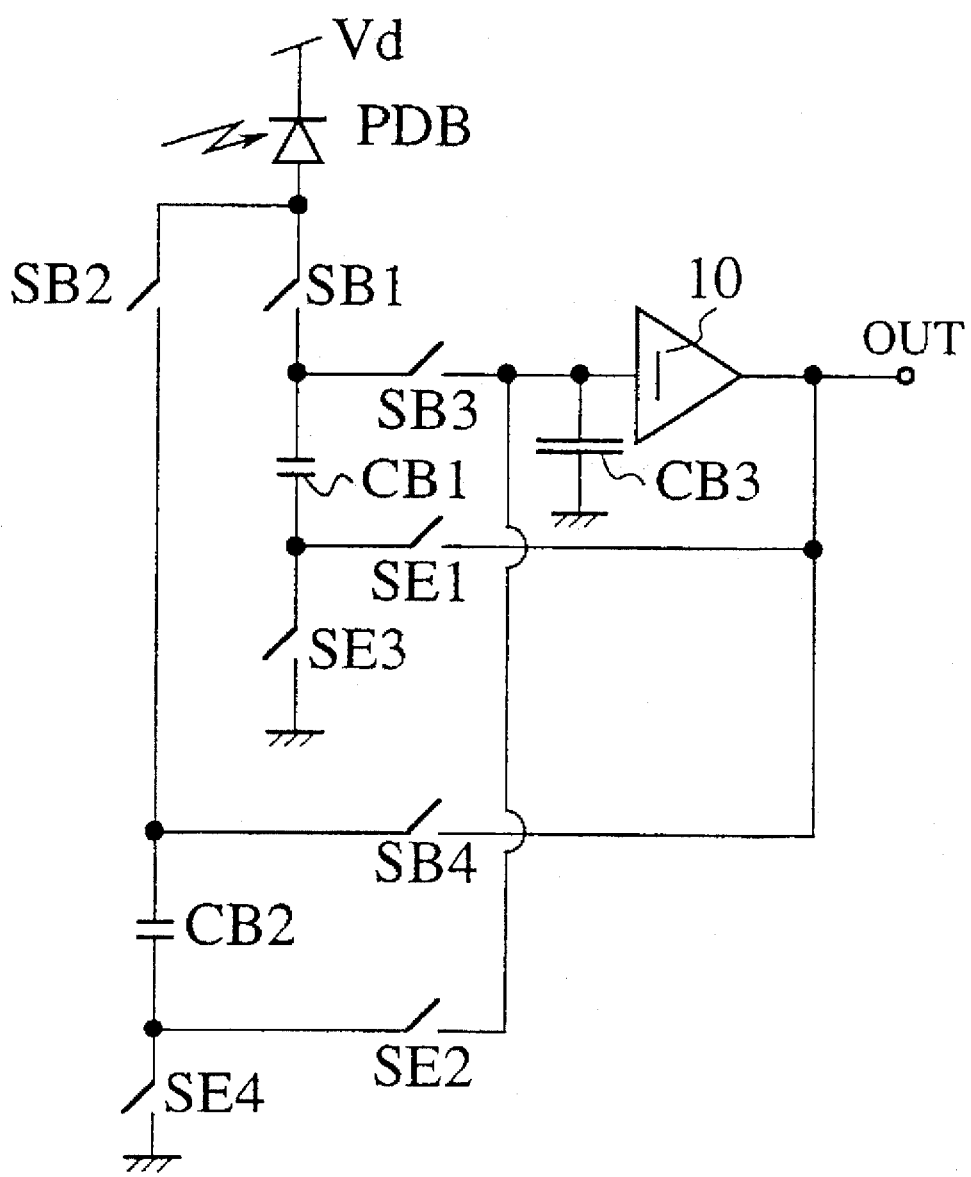
FIG. 12 is a circuit diagram of the fourth embodiment when a photosensor according to the present invention is constituted as an image sensor.

FIG. 12 is a circuit diagram showing the fourth embodiment when a photosensor according to the present invention is constituted as an image sensor. According to this embodiment, a unit gain buffer 10 is used in place of the operation amplifier in the first embodiment. The unit gain buffer 10 has a high input impedance, and outputs a potential equal to an input potential. The arrangement shown in FIG. 12 will be described below. The output terminal of a PIN photodiode PDB is connected to the positive electrodes of storing electrostatic capacitors $CB_1$ and $CB_2$ through switches SB1 and SB2, respectively, and the negative electrodes of the storing electrostatic capacitors $CB_1$ and $CB_2$ are grounded through switches SE3 and SE4. The positive electrodes of storing electrostatic capacitors $CB_1$ and $CB_2$ are connected to the input and output terminals of the unit gain buffer 10 through switches SB3 and SB4, respectively, and the negative electrodes of storing electrostatic capacitors $CB_1$ and $CB_2$ are connected to the input and output terminals of the unit gain buffer 10 through switches SE1 and SE2, respectively. The positive electrode of a holding electrostatic capacitor CB3 is connected to the input terminal of the unit gain buffer 10, and the negative electrode of the holding electrostatic capacitor $CB_3$ is grounded. Charges are stored in the storing electrostatic capacitors $CB_1$ and $CB_2$ through the switches SB1 and SE3 and the switches SB2 and SE4, respectively. In order to move charges Q1 stored in the positive electrode of the storing electrostatic capacitor CB1 to the holding electrostatic capacitor $CB_3$, the switches SB3 and SE1 are turned on. Since the input and output potentials of the unit gain buffer 10 are equal to each other, when the switches SB3 and SE1 are turned on, a voltage across both the electrodes of the storing electrostatic capacitor $CB_1$ becomes zero, and all the charges stored in the storing electrostatic capacitor $CB_1$ move to the holding electrostatic capacitor $CB_3$, and are stored in the holding electrostatic capacitor $CB_3$. In order to move charges −$Q_2$ stored in the negative electrode of the storing electrostatic capacitor CB2 to the holding electrostatic capacitor $CB_3$, as described above, the switches SB4 and SE2 are turned on. The holding electrostatic capacitor $CB_3$ can be reset by, e.g., the switches SE2 and SE4. Even if a dedicated electrostatic capacitor is formed as the holding electrostatic capacitor $CB_3$, the parasitic capacitor of the wiring or the input parasitic capacitor of the unit gain buffer 10 can be used.

Figure 13:
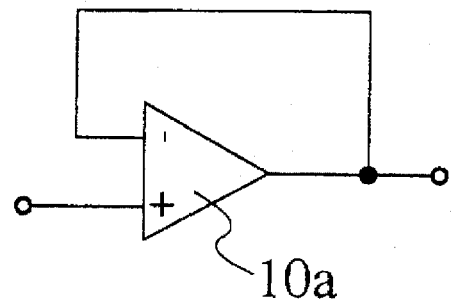
FIG. 13 is a view showing an arrangement in which a unit gain buffer in the fourth embodiment is constituted by a voltage follower.

FIG. 13 shows an example in which the unit gain buffer 10 in the fourth embodiment is constituted by a voltage follower 10a. The unit gain buffer 10 can be theoretically constituted by an operation amplifier. However, electrostatic potentials input to the inversion input terminal (−) and the non-inversion input terminal of the unit gain buffer 10 are almost equal to each other, and the input range is very small. For this reason, an operation amplifier for constituting the unit gain buffer 10 can be easily constituted compared with a general operation amplifier (for example, indicated by 8 in FIG. 9). The size of the operation amplifier can be half or less the general operation amplifier. The voltage follower 10a amplifies output charges like the operation amplifier 8.

Figure 14:
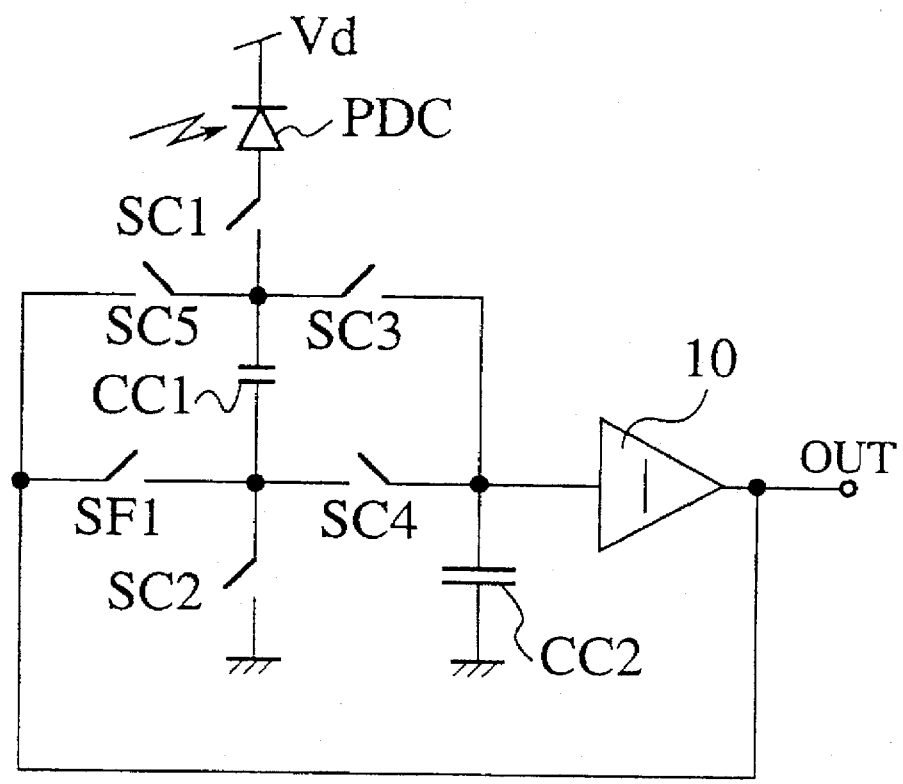
FIG. 14 is a circuit diagram of the fifth embodiment when a photosensor according to the present invention is constituted as an image sensor.

FIG. 14 is a circuit diagram of the fifth embodiment when a photosensor according to the present invention is constituted as an image sensor. According to this embodiment, a unit gain buffer 10 is used in place of the operation amplifier in the third embodiment (FIG. 11). Charges are stored in a storing electrostatic capacitor $CC_1$ through switches SC1 and SC2. The positive and negative charges of the storing electrostatic capacitor CC1 are moved to the positive electrode of a holding electrostatic capacitor CC2 through switches SC3 and SF1 and switches SC4 and SC5, respectively.

Figure 15A:
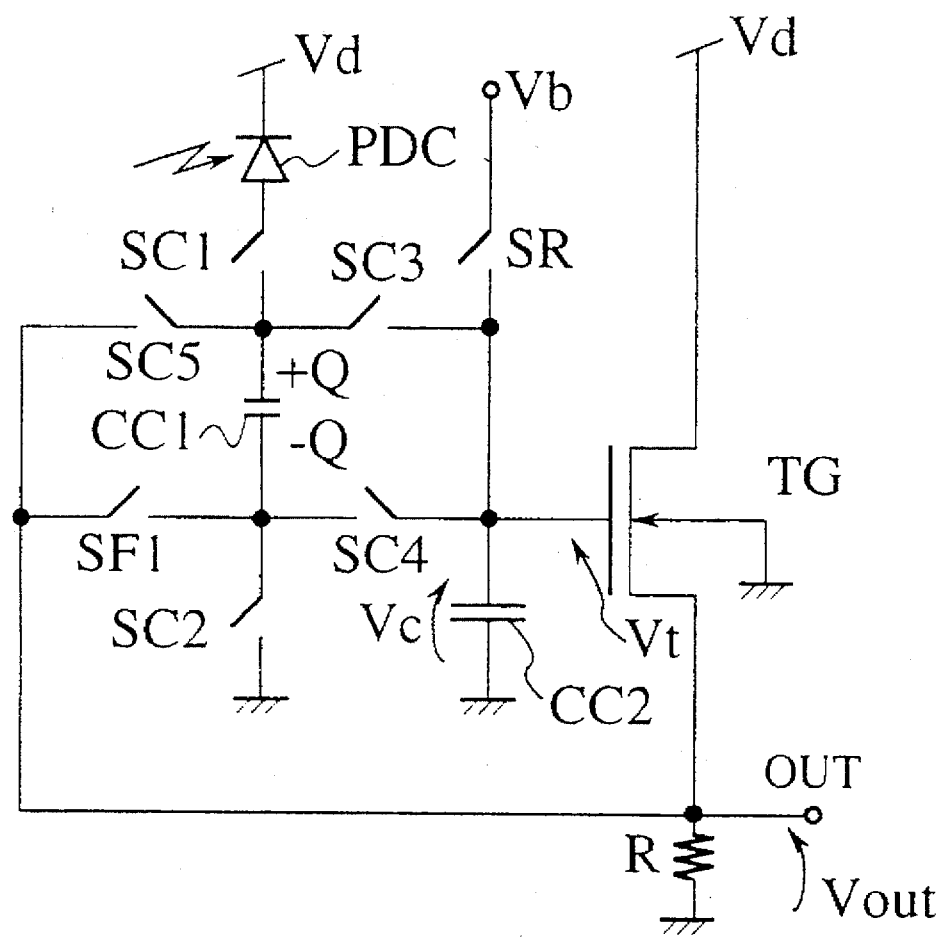
FIGS. 15A and 15B are circuit diagrams of the sixth embodiment when a photosensor according to the present invention is constituted as an image sensor.
Figure 15B:
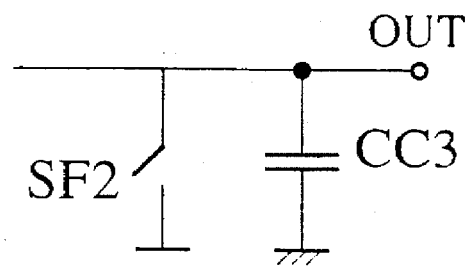

FIGS. 15A and 15B are circuit diagrams of the sixth embodiment when a photosensor according to the present invention is constituted as an image sensor. According to this embodiment, a source follower type MOS transistor TG is used in place of the unit gain buffer in the fifth embodiment (FIG. 14). Referring to FIG. 15A, reference numeral R denotes a load resistor. In place of the load resistor R, an enhancement type or depletion type MOS transistor or the like can be used as a load. Even if the loading resistor R is specially formed, as shown in FIG. 15B, a parasitic capacitor $CC_3$ of wiring or the like can be used as a load. Reference symbol SF2 denotes a reset switch of the parasitic capacitor $CC_3$. Reference symbol SR denotes a rest switch of a holding capacitor $CC_2$. The switch SR is used to set the gate voltage of the MOS transistor TG to be an initial value Vb. However, the reset switch SR is not necessarily required, and the MOS transistor TG can be reset through switches SC4 and SC2. Since the source potential $V_{out}$(=output potential) of the MOS transistor TG is equal to ($V_c$−$V_T$) when $V_T$ is the threshold voltage of the MOS transistor TG and $V_c$ is the electrostatic potential at the positive electrode of the holding electrostatic capacitor CC2, the MOS transistor TG operates as a unit gain buffer. When the source follower is used as described above, the function of the unit gain buffer can be realized by only one transistor, and each pixel can be decreased in size. Note that, in FIG. 15A, as shown in FIG. 15B, although it is described that the parasitic capacitor $CC_3$ of the wiring can be substituted for the load R, the parasitic capacitor of the wiring and the gate capacitor of the MOS transistor TG can be substituted for the holding electrostatic capacitor $CC_2$. Since the MOS transistor TG must operates in an analog manner, the MOS transistor TG is generally designed to have a size larger than a switch SC1 or the like. For this reason, the MOS transistor TG has a large gate capacitance and can be satisfactorily substituted for the holding electrostatic capacitor $CC_2$.

Figure 16:
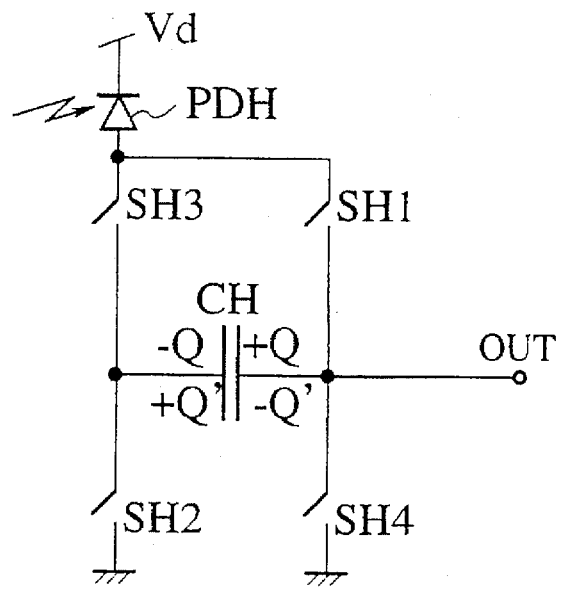
FIG. 16 is a circuit diagram of the seventh embodiment when a photosensor according to the present invention is constituted as an image sensor.

FIG. 16 is a circuit diagram of the seventh embodiment when a photosensor according to the present invention is constituted as an image sensor. In each of the above embodiments, positive charges are stored in the positive electrode of the storing electrostatic capacitor $CB_1$, $CB_2$, or $CC_1$, and negative charges are stored in the negative electrode. According to the seventh embodiment, differentiation can also be performed such that the positive and negative electrodes of an electrostatic capacitor CH are alternately connected to the output terminal of a photoelectric converter. When switches SH1 and SH2 are turned on, positive charges are stored in the positive electrode of the electrostatic capacitor CH. When switches SH1 and SH2 are turned off, and switches SH3 and SH4 are turned on, negative charges $-Q'$ are stored in the positive electrode of the electrostatic capacitor CH. As a result, in one cycle, only charges $(Q-Q')$ are stored in the electrostatic capacitor CH. With this arrangement, since the storing electrostatic capacitor also functions as a holding electrostatic capacitor, the holding electrostatic capacitor can be omitted.

Figure 17:
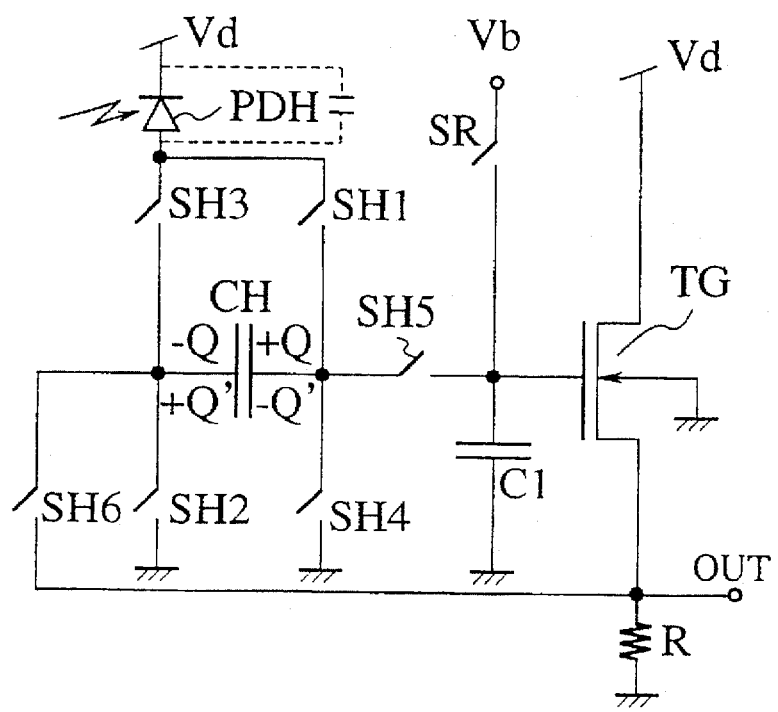
FIG. 17 is a circuit diagram of the eighth embodiment when a photosensor according to the present invention is constituted as an image sensor.

FIG. 17 is a circuit diagram of the eighth embodiment when a photosensor according to the present invention is constituted as an image sensor. In this embodiment, a source follower type buffer is arranged in the output unit of the seventh embodiment (FIG. 16). According to this embodiment, since the relatively large gate capacitance of a MOS transistor TG can be used as a holding electrostatic capacitor CI, the capacitance of a storing electrostatic capacitor CH can be smaller than that in the seventh embodiment. The arrangement of this embodiment has three operation modes. More specifically, (1) switches SH1 and SH2 are turned on to store positive charges Q in the electrostatic capacitor CH. Subsequently, the switches SH1 and SH2 are turned off, and switches SH3 and SH4 are turned on, thereby storing charges $-Q'$ in the electrostatic capacitor CH. As a result, charges $(Q-Q')$ are stored in the electrostatic capacitor CH per cycle. This operation is repeated, and differentiated and integrated charges stored in the electrostatic capacitor CH in predetermined cycles are transferred to the holding electrostatic capacitor CI through switches SH5 and SH6 and integrated and held in the holding electrostatic capacitor CI. (2) The switches SH1 and SH2 are turned on to store the charges Q in the electrostatic capacitor CH. Subsequently, the switches SH1 and SH2 are turned off, and the switches SH5 and SH6 are turned on, thereby moving the charges Q to the holding electrostatic capacitor CI. After the switches SH5 and SH6 are turned off, the switches SH3 and SH4 are turned on to store the charges $-Q'$ in the holding electrostatic capacitor CH. Subsequently, the switches SH5 and SH6 are turned on again to move the charges $-Q'$ to the holding electrostatic capacitor CI. (3) The switches SH1 and SH5 are turned on to directly send the charges Q to the holding electrostatic capacitor CI. After the switches SH1 and SH5 are turned off, the switches SH3 and SH4 are turned on to store the charges $-Q'$ in the electrostatic capacitor CH. After the switches SH3 and SH4 are turned off, the switches SH5 and SH6 are turned on to move the charges $-Q'$ to the holding electrostatic capacitor CI. According to any one of the three operation modes, the same charges are hold in the holding electrostatic capacitor CI.

Figure 18:
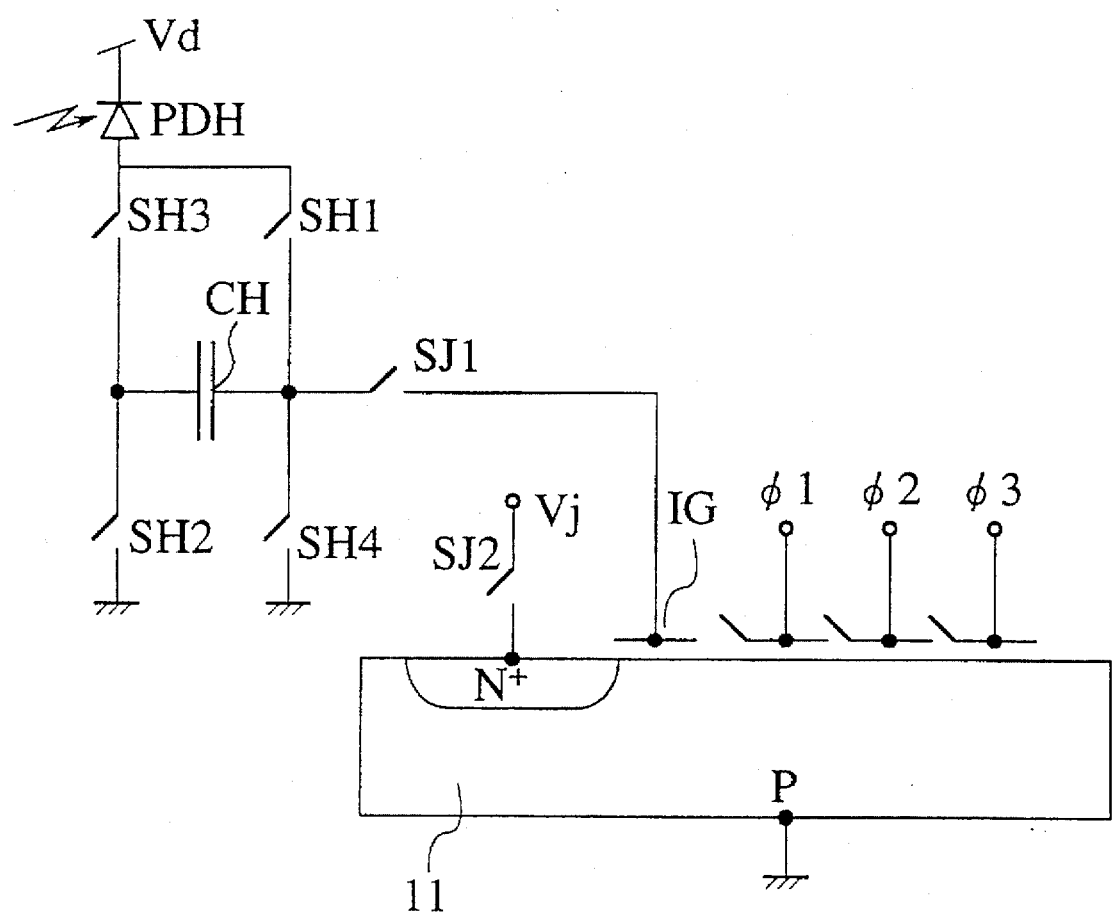
FIG. 18 is a circuit diagram of the ninth embodiment when a photosensor according to the present invention is constituted as an image sensor.

FIG. 18 is a circuit diagram of the ninth embodiment when a photosensor according to the present invention is constituted as an image sensor. In this embodiment, the output terminal in the seventh embodiment (FIG. 16) is connected to an injection gate IG of a CCD 11 through a switch SJ1. When the switch SJ1 is turned on, most of charges in an electrostatic capacitor CH move to the injection gate IG. In order to read the charges from the injection gate IG, a switch SJ2 is set in an ON state for a predetermined period of time. In this case, charges which are in proportion to the charges of the injection gate IG are injected from a power supply $V_j$ to a gate $\phi 1$ of the CCD 11. The injected charges sequentially move from the gate $\phi 1$ to gates $\phi 2$ and $\phi 3$, and are finally output. In this embodiment, as in the seventh embodiment, in order to move all the charges in the electrostatic capacitor CH to the injection gate, an operation amplifier, a unit gain buffer, or a source follower are inserted between the electrostatic capacitor CH and the injection gate IG.

Figure 19:
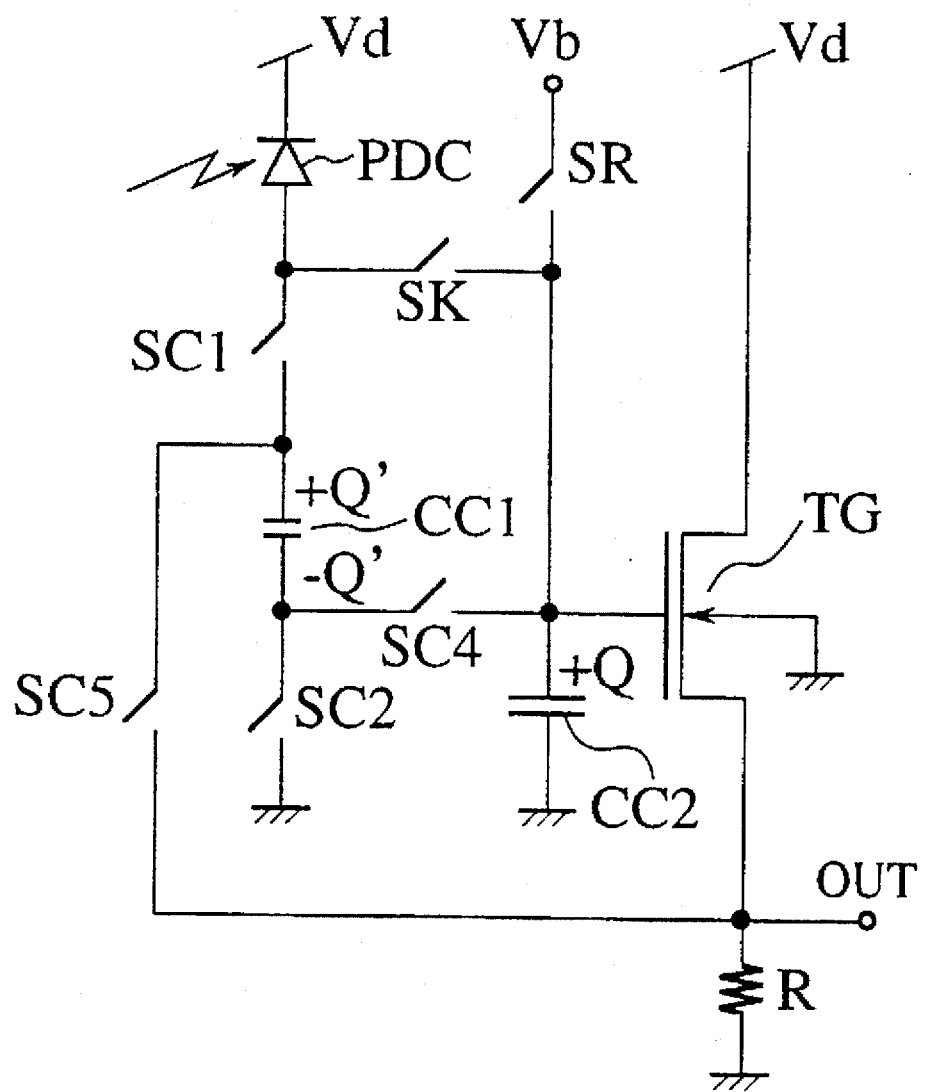
FIG. 19 is a circuit diagram of the tenth embodiment when a photosensor according to the present invention is constituted as an image sensor.

FIG. 19 is a circuit diagram of the tenth embodiment when a photosensor according to the present invention is constituted as an image sensor. In this embodiment, the number of switches in the sixth embodiment (FIG. 15) is decreased, and a facility for micropatterning pixels is greater than that of the sixth embodiment. Positive charges are directly stored in a holding electrostatic capacitor $CC_2$ through a switch SK to decrease the number of switches, the switches SC3 and SF1 in FIG. 15 are made unnecessary. In the negative phase, as in the sixth embodiment, switches SC1 and SC2 are turned on to store charges in a storing electrostatic capacitor $CC_1$. After the switches SC1 and SC2 are turned off, switches SC4 and SC5 are turned on to move negative charges to the holding electrostatic capacitor $CC_2$, and the negative charges are stored in the holding electrostatic capacitor $CC_2$.

Figure 20:
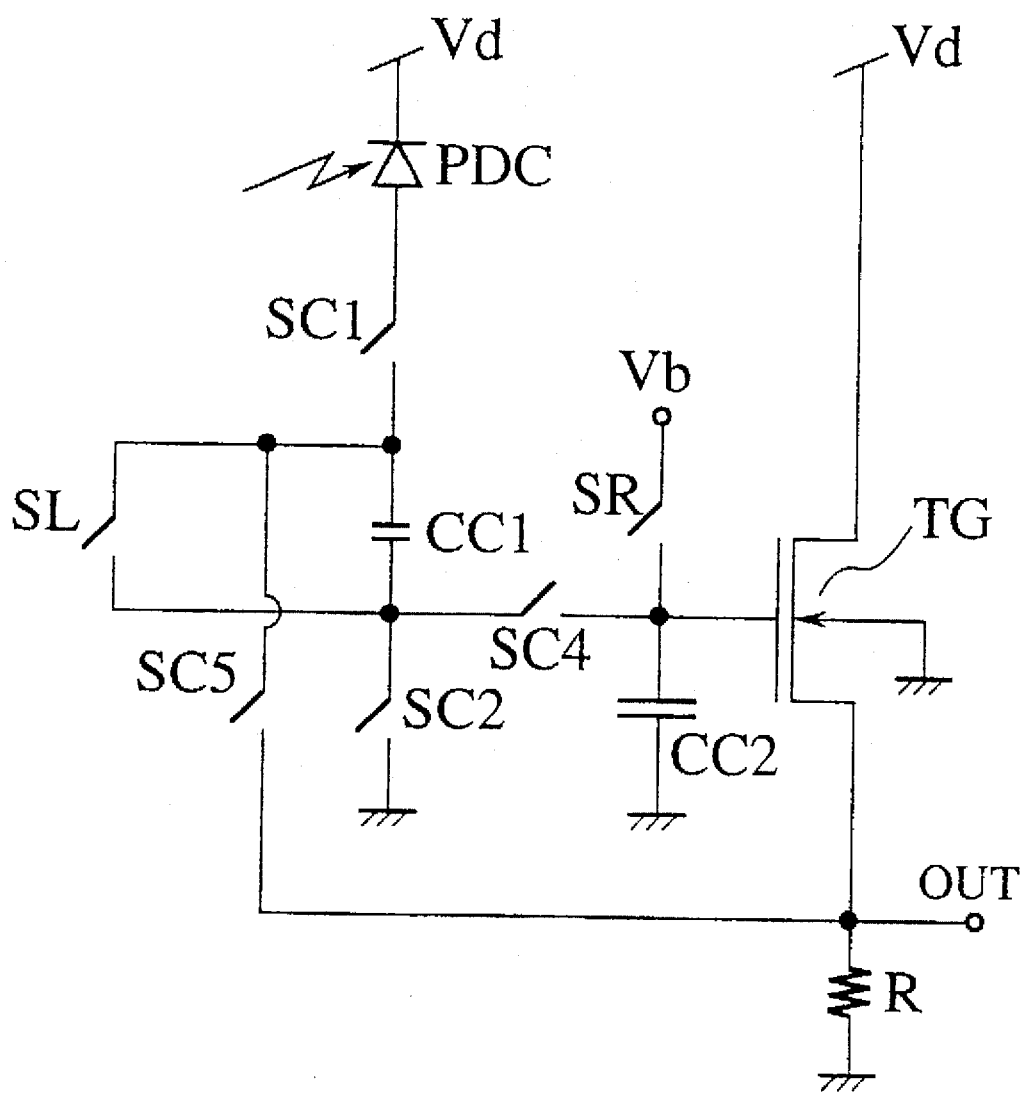
FIG. 20 is a circuit diagram of the eleventh embodiment when a photosensor according to the present invention is constituted as an image sensor.

FIG. 20 is a circuit diagram of the eleventh embodiment when a photosensor according to the present invention is constituted as an image sensor. In this embodiment, as in the tenth embodiment, the number of switches is decreased. According to this embodiment, the switch SK in FIG. 19 is omitted, and positive charges are stored as follows. That is, when switches SC1 and SC4 are turned on, a storing electrostatic capacitor $CC_1$ and a holding electrostatic capacitor $CC_2$ are connected in series with each other. Therefore, charges Q of a PIN photodiode PDC are stored in the positive electrode of the storing electrostatic capacitor $CC_1$, and charges $-Q$ are generated by the negative electrode. The quantity of this charges $-Q$ are equal to that of output charges Q from the photodiode PDC, and this charges $-Q$ induces charges in the positive electrode of the holding electrostatic capacitor $CC_2$. Storing in the negative phase can be performed in the same manner as described in the tenth embodiment. A switch SL is used to reset the charges stored in the storing electrostatic capacitor $CC_1$. When the switch SL is turned on, charges in the storing electrostatic capacitor $CC_1$ are reset.

Figure 21:
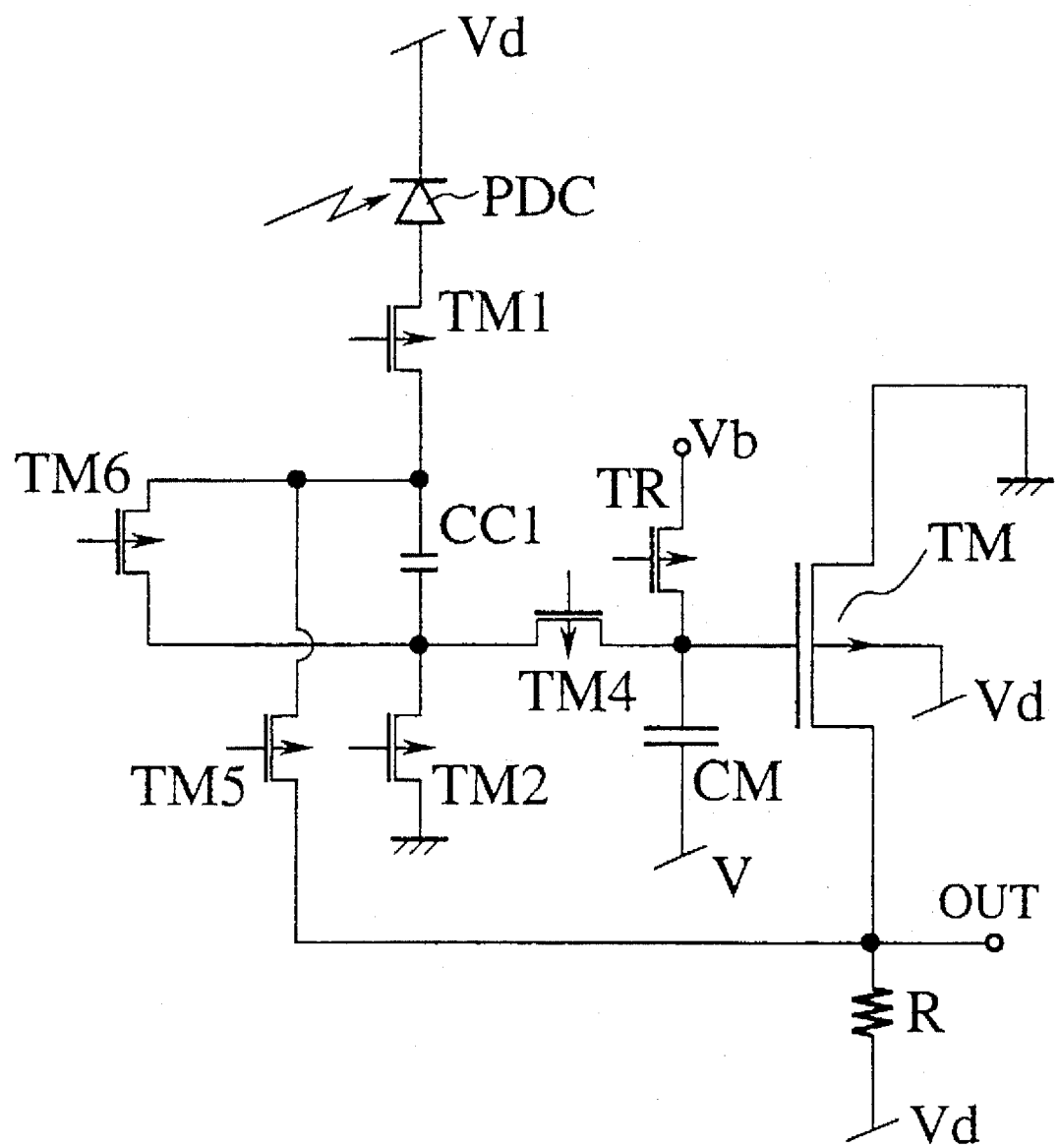
FIG. 21 is a circuit diagram of the twelfth embodiment when a photosensor according to the present invention is constituted as an image sensor.

FIG. 21 is a circuit diagram of the twelfth embodiment when a photosensor according to the present invention is constituted as an image sensor. According to this embodiment, each switch in the eleventh embodiment (FIG.

Figure 22A:
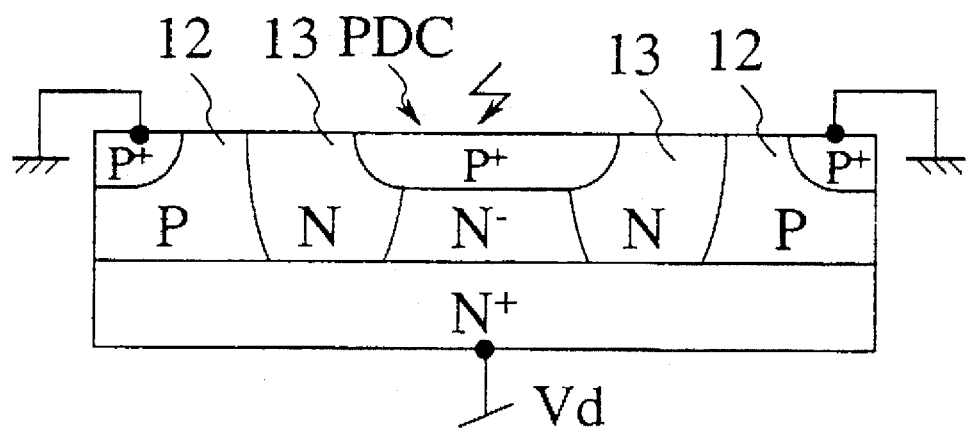
FIG. 22A is a sectional view of isolation region necessary for separating an n-type MOSFET to an photodiode.
Figure 22B:
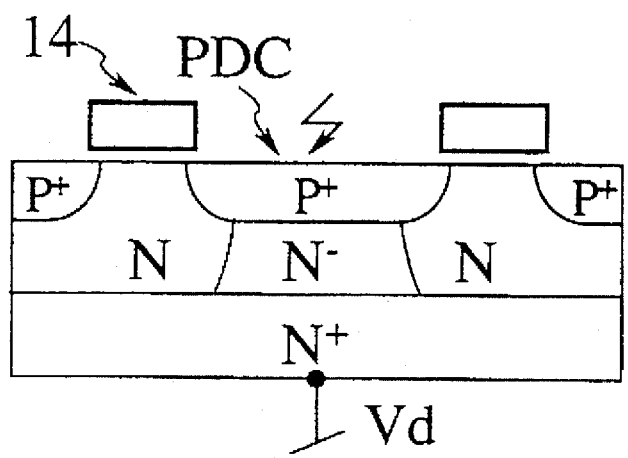
FIG. 22B is a sectional view of a p-type MOSFET.

20) is realized by a p-type MOSFET, and also a p-type MOSFET is used as a source follower. When an n-type MOSFET must be formed, as shown in FIG. 22A, an n-type isolation region 13 is required to isolate a PIN photodiode PDC from a p-type well 12 for forming the n-type MOSFET, whereby each pixel is increased in size. In order to solve this problem, a p-type substrate of a type opposite to the substrate shown in FIG. 22A or a p-type MOSFET is preferably used. FIG. 22B is a schematic sectional view in a case wherein a p-type MOSFET 14 is used. When the p-type MOSFET 14 is used, an isolation region is not necessary, and the output terminal of the photodiode PDC is directly used as the source of the p-type MOSFET 14. For this reason, each pixel can be decreased in size.

Figure 23:
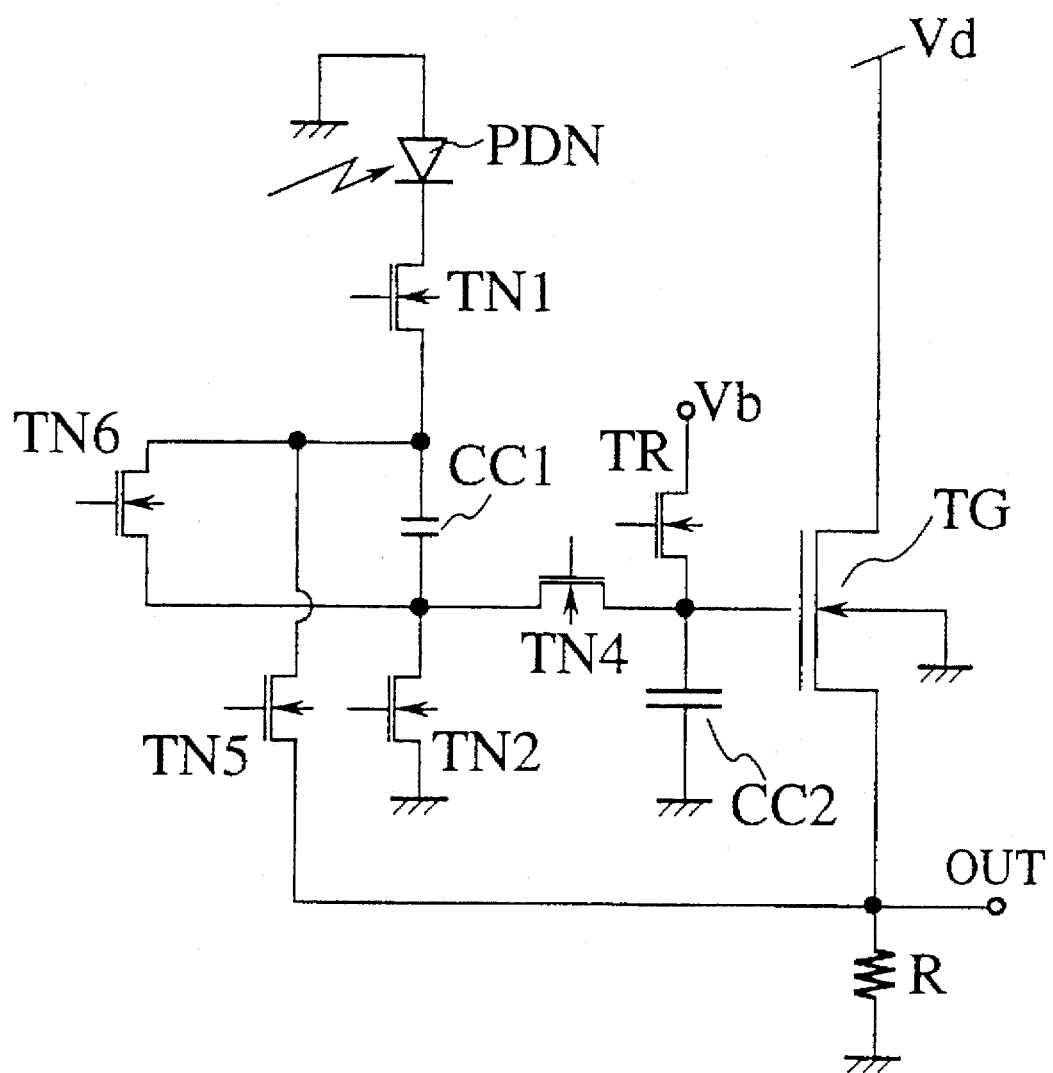
FIG. 23 is a circuit diagram of the thirteenth embodiment when a photosensor according to the present invention is constituted as an image sensor.
Figure 24:
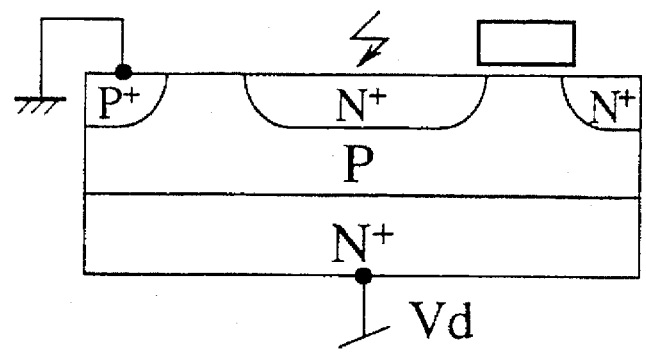
FIG. 24 is a view showing a photodiode which operates in a solar battery mode.

FIG. 23 is a circuit diagram of the thirteenth embodiment when a photosensor according to the present invention is constituted as an image sensor. According to this embodiment, a photodiode PDN which operates in a solar-battery mode is used in place of the PIN photodiode PDC in the twelfth embodiment (FIG. 21). FIG. 24 is a schematic sectional view showing the photodiode PDN. In this embodiment, when an n-type MOSFET is used in place of a p-type MOSFET, an isolation region is not necessary, and pixels can be micropatterned.

Figure 25:
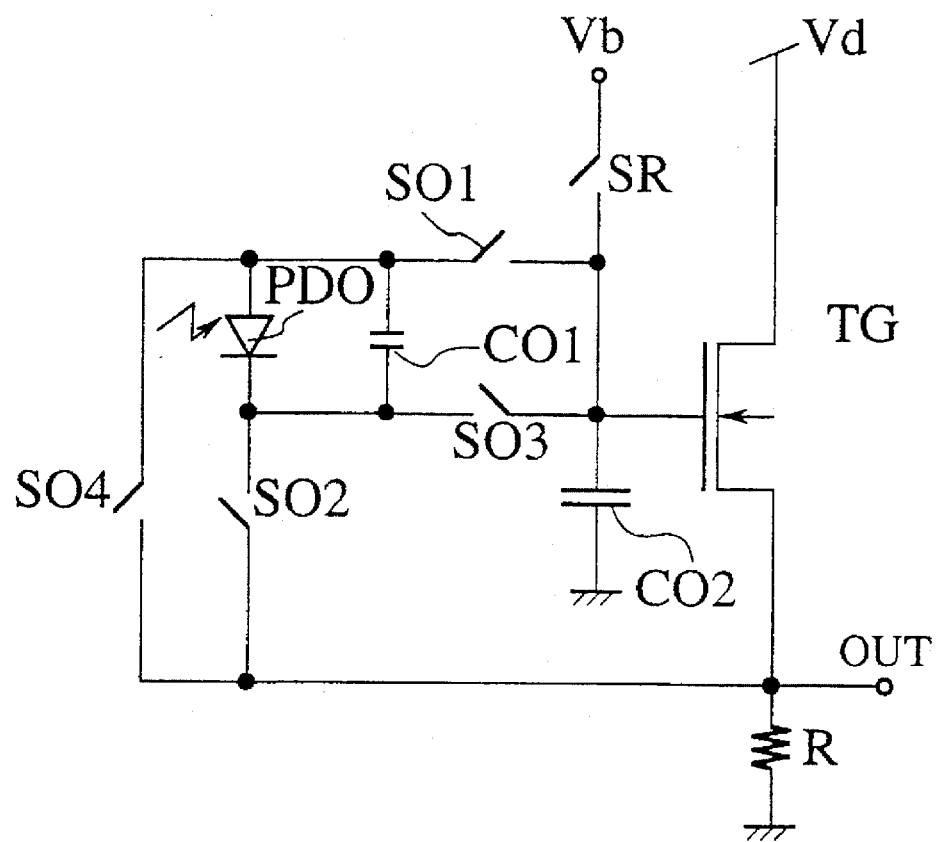
FIG. 25 is a circuit diagram of the fourteenth embodiment when a photosensor according to the present invention is constituted as an image sensor.

FIG. 25 is a circuit diagram of the fourteenth embodiment when a photosensor according to the present invention is constituted as an image sensor. According to this embodiment, a photodiode PDO which operates in a solar-battery mode is used, a storing electrostatic capacitor CO1 is connected to the photodiode PDO in parallel. The anode and cathode of the photodiode PDO are connected to the gate of a source follower MOSFET TG through switches SO1 and SO3, respectively, and are connected to the source of the MOSFET TG through switches SO4 and SO2, respectively. Reference symbol CO2 denotes a holding electrostatic capacitor. Note that the storing electrostatic capacitor $CO_1$ need not be specially arranged, and the junction capacitor of the photodiode PDO can be used as the storing electrostatic capacitor $CO_1$. The operation of this embodiment will be described below. The switches SO1, SO2, SO3, and SO4 are turned off to store photoelectric charges in the storing electrostatic capacitor $CO_1$. If a positive phase is set, the switches SO1 and SO2 are turned on, positive charges are transferred to the holding electrostatic capacitor CO2. If a negative phase is set, the switches SO3 and SO4 are turned on, and negative charges are transferred to the holding electrostatic capacitor $CO_2$.

Figure 26:
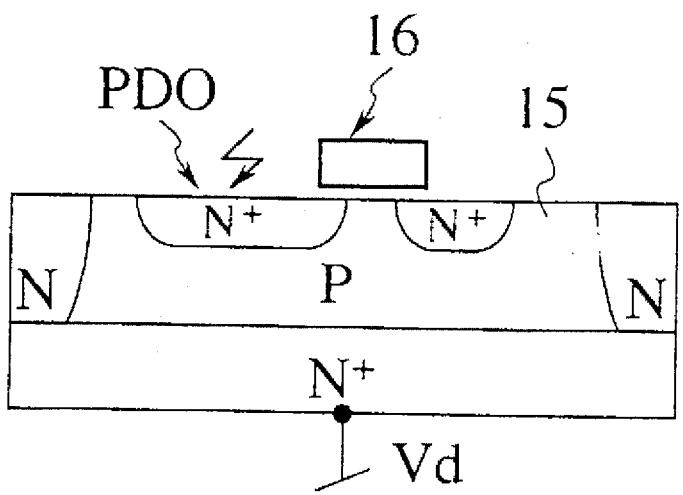
FIG. 26 is a sectional view showing a substrate structure for realizing the arrangement in FIG. 25.
Figure 27:
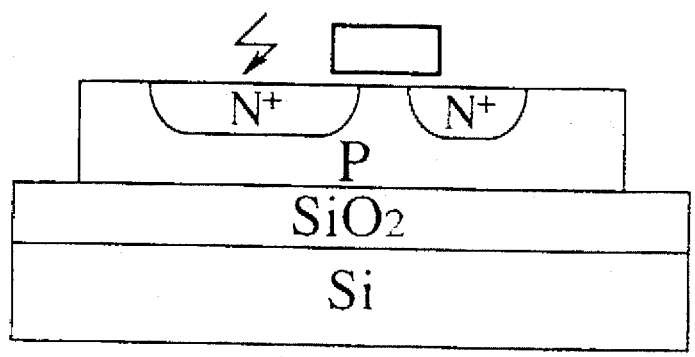
FIG. 27 is a sectional view of an SOI substrate.

FIG. 26 is a schematic sectional view showing a substrate structure for realizing the arrangement in FIG. 25. In this substrate structure, an n-type substrate is used, and a floating p-type well 15 is also used as a well for forming the anode of the photodiode PDO and an n-type MOSFET 16. Since the p-type well 15 floats, a vertical NPN bipolar transistor constituted by the n-type substrate, the p-type well 15, and the cathode of an nhu +-type diode may be turned on. However, since the rise time of the bipolar transistor is long, i.e., several ms, if charges are transferred to the holding electrostatic capacitor CO2 before the bipolar transistor rises, the parasitic bipolar transistor can be prevented from being turned on. Although each pixel can be decreased in size by using the p-type well 15 as both the anode of the photodiode PDO and the well of the n-type MOSFET 16, linearlity may be degraded due to a change in well potential of the MOSFET. However, in this case, the potential of the p-type well falls within the range of 0 to 0.7 V, and the range is small. For this reason, the linearlity is not considerably degraded. As shown in FIG. 27, when an SOI substrate is used, a parasitic bipolar transistor can be easily eliminated, or the well of the MOSFET can be easily isolated from the anode of the photodiode to fix the well potential.

Figure 1:
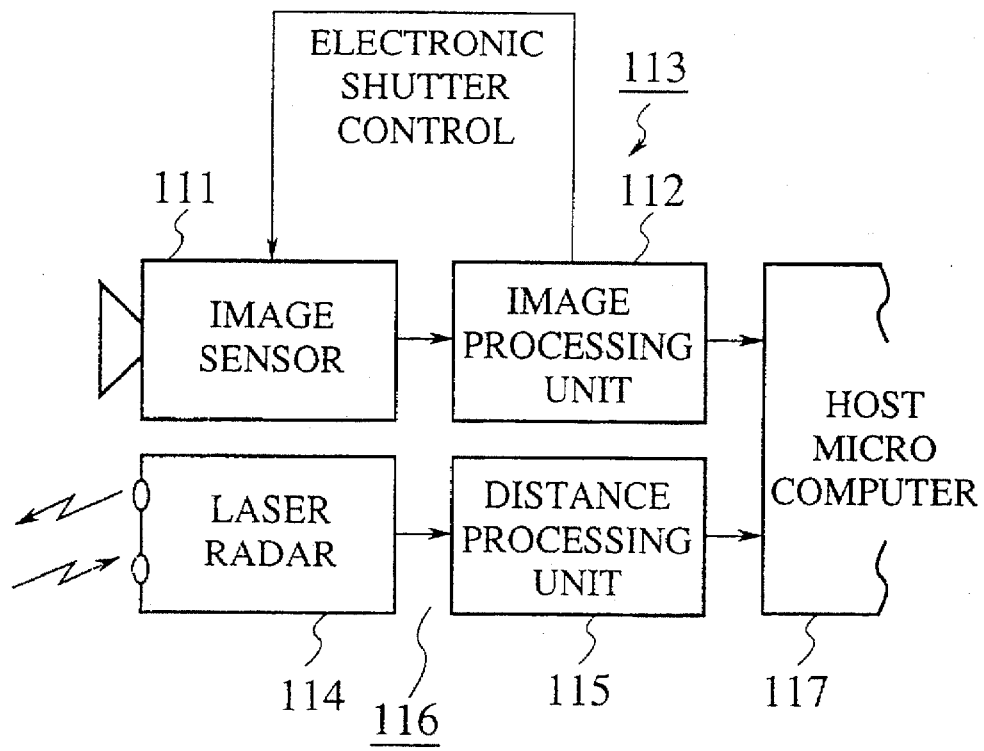
FIG. 1 is a block diagram showing the arrangement of a conventional image/distance detection system.
Figure 2:
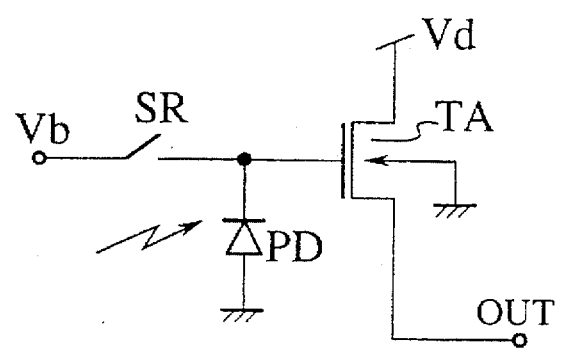
FIG. 2 is a circuit diagram of a conventional image sensor.
Figure 3:
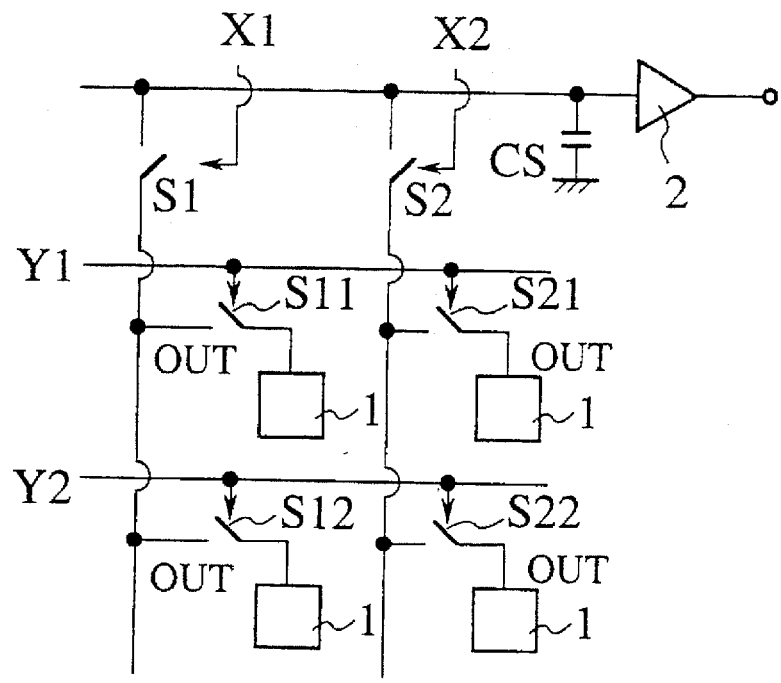
FIG. 3 is a view showing the arrangement of an actual image sensor.
Figure 4:
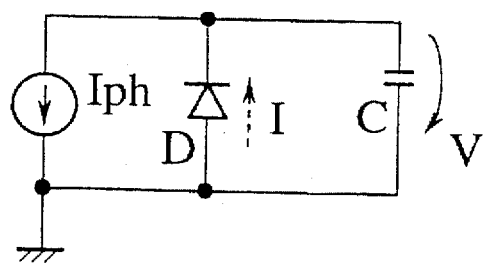
FIG. 4 is a view showing the equivalent circuit of a photodiode.
Figure 5:
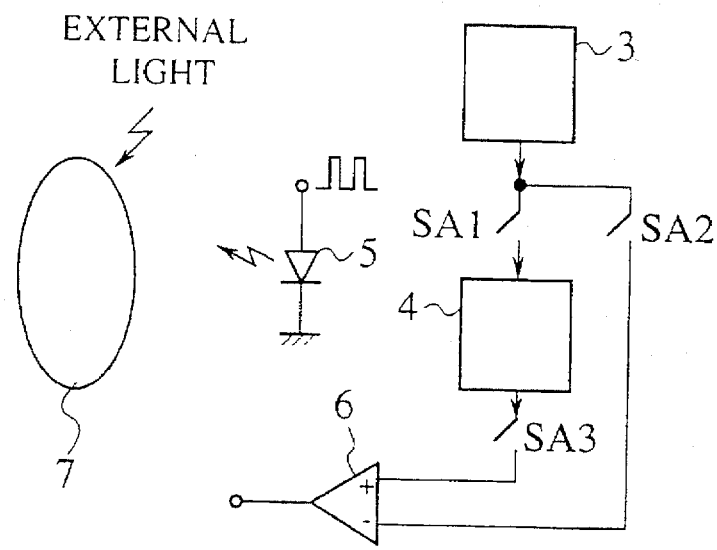
FIG. 5 is a view showing an application of a conventional image sensor.
Figure 6:
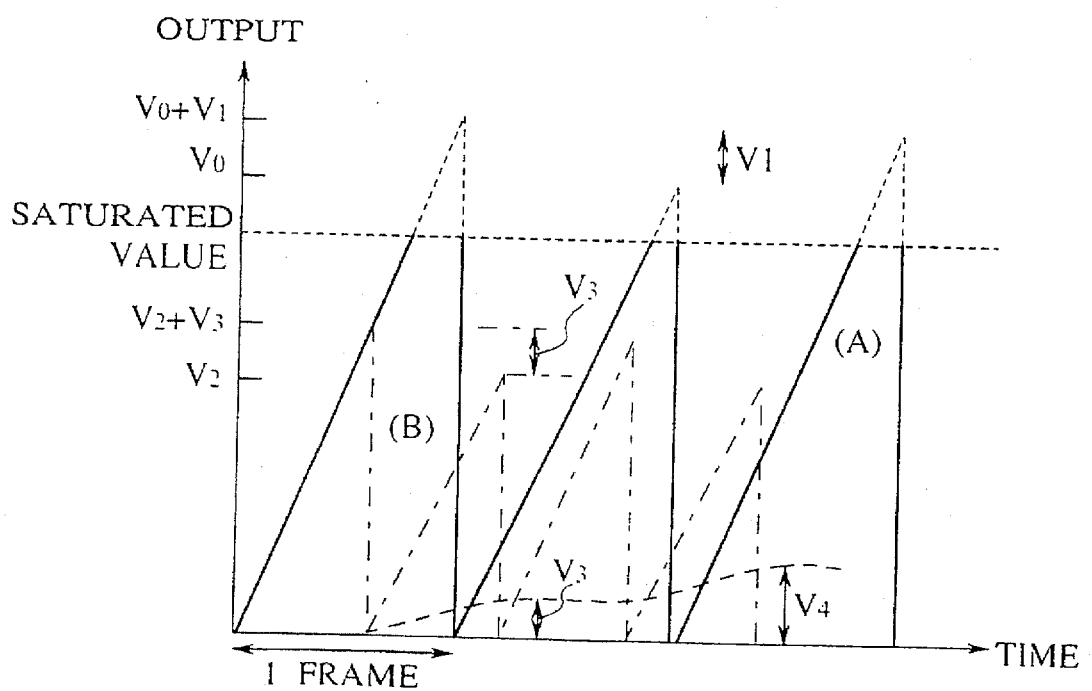
FIG. 6 is a graph for explaining the operation of a conventional image sensor.
Figure 28:
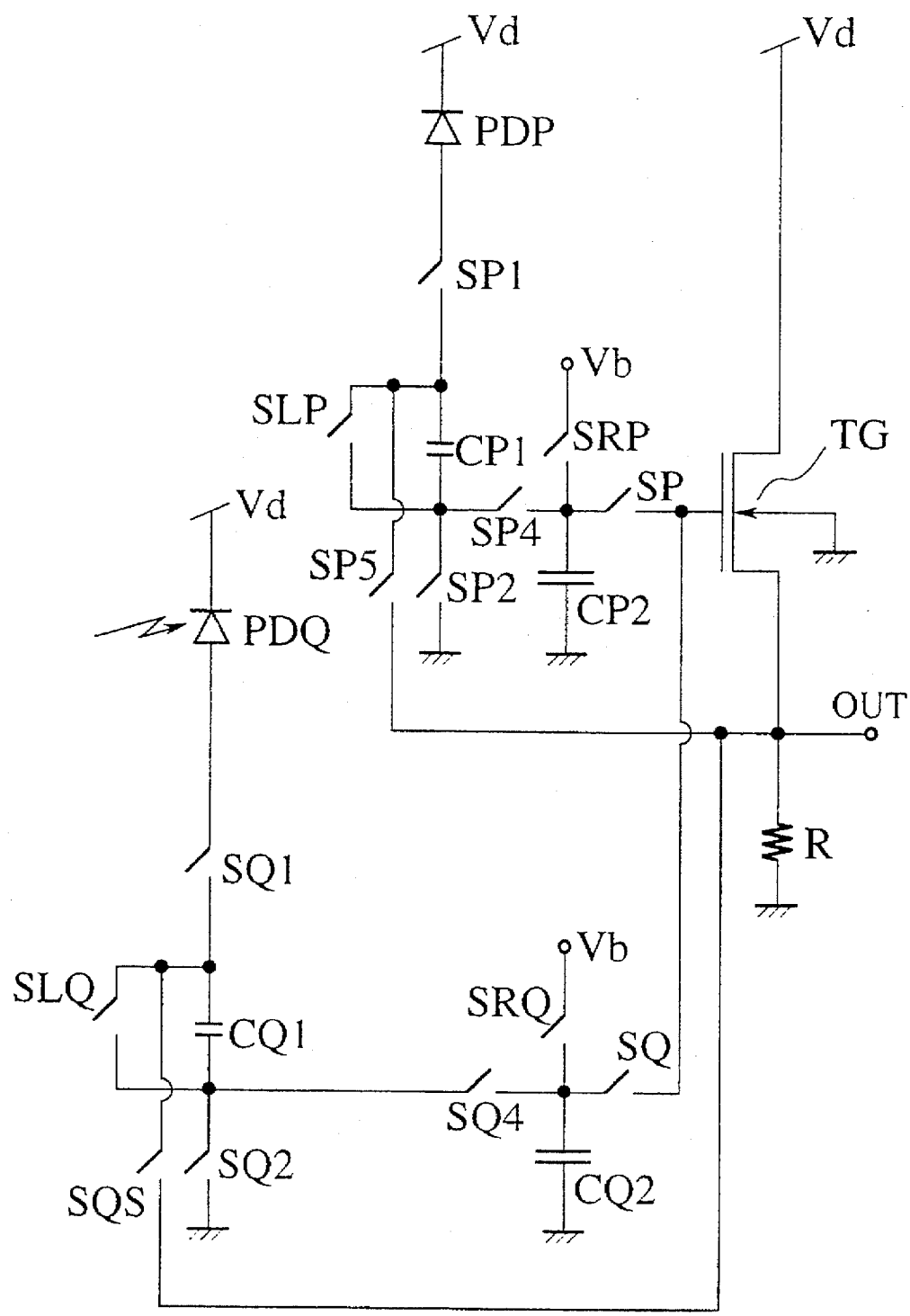
FIG. 28 is a circuit diagram of the fifteenth embodiment when a photosensor according to the present invention is constituted as an image sensor.

FIG. 28 is a circuit diagram of the fifteenth embodiment when a photosensor according to the present invention is constituted as an image sensor. According to this embodiment, a source follower MOSFET TG which operates in an analog manner and must be designed to have a relatively large size is shared by a plurality of pixels to micropattern the pixels. FIG. 28 shows an arrangement in which one source follower is shared by two pixels each having the arrangement in the eleventh embodiment (FIG. 20). Switches SP and SQ are used to select a pixel and connect it to the source follower. With this arrangement, the number of source follower MOSFETs can be decreased, and the pixels can be more micropatterned. For example, when one source follower is arranged for pixels in one row, the switches SP and SQ can be selected in synchronism with a timing at which column selection lines X1 and X2 (see FIG. 3) are selected. For this reason, timing control can be simplified.

Although positive charges are extracted from a photoelectric converter in each of the above embodiments, negative charges may be extracted from the photoelectric converter. In this case, the positive charges described in the above embodiments are exchanged for negative charges.

Each of the above embodiment describes that differentiation is performed in synchronism with floodlighting. However, in a synchronous system, the timing of such differentiation must be controlled to be synchronized with floodlighting. Embodiments each using an asynchronous system will be described below.

Figure 29:
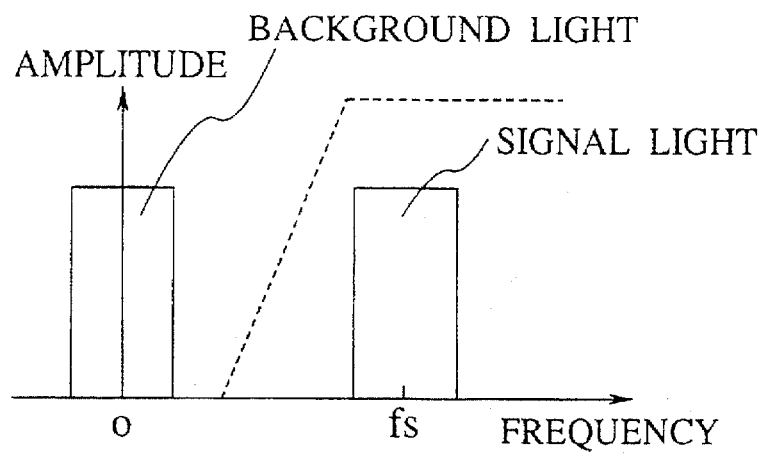
FIG. 29 is a graph for explaining the sixteenth embodiment when a photosensor according to the present invention is constituted as an image sensor.
Figure 30:
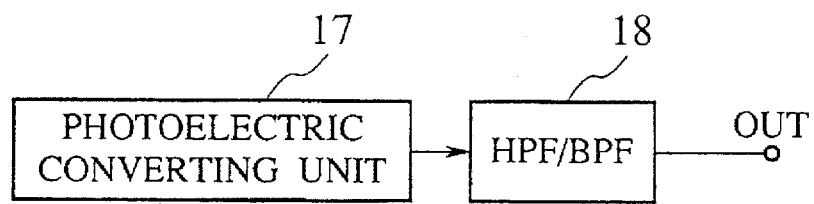
FIG. 30 is a view for explaining the sixteenth embodiment when a photosensor according to the present invention is constituted as an image sensor.

FIGS. 29 and 30 are views for explaining the sixteenth embodiment when a photosensor according to the present invention is constituted as an image sensor. FIG. 29 shows the frequency component of light reaching the image sensor. Referring to FIG. 29, reference symbol $f_s$ denotes a projection-light frequency. Noise caused by external light is concentrated on a low-frequency side. Signal light is concentrated on a high-frequency side about the frequency $f_s$ because projecting light is chopped at the frequency $f_s$. When the frequency $f_s$ is made high, the spectrum of the external light can be isolated from the spectrum of the signal light as shown in FIG. 29. FIG. 30 shows an arrangement for extracting only signal light. The external light is cut off by connecting a high-pass filter or a bandpass filter 19 to the output terminal of a photoelectric converting unit 17 of each pixel, so that only the signal light can be extracted. The frequency characteristics of the filter 18 is set as indicated by a dotted line in FIG. 29.

Figure 31:
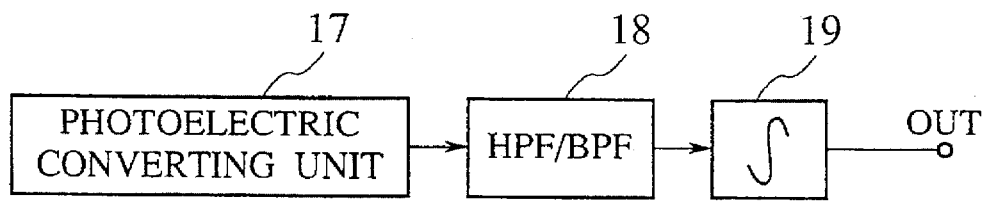
FIG. 31 is a view showing the arrangement of the seventeenth embodiment when a photosensor according to the present invention is constituted as an image sensor.
Figure 32:
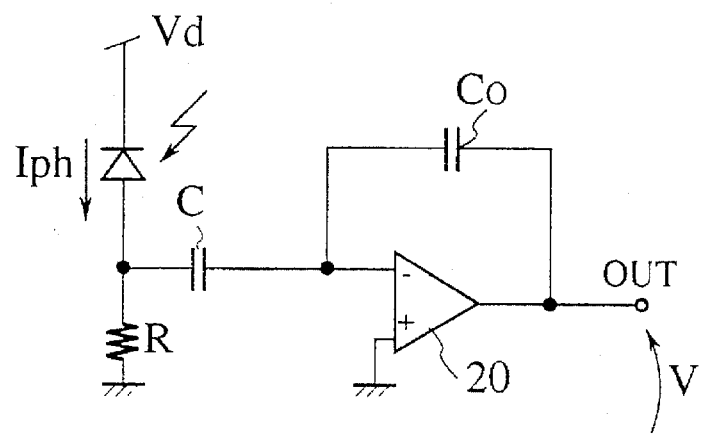
FIG. 32 is a view showing an example in which an integrator is arranged at the output of a primary order filter.
Figure 33:
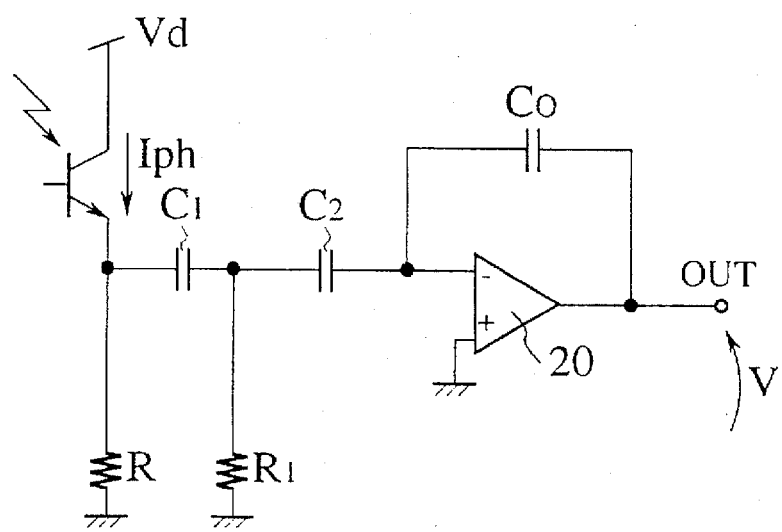
FIG. 33 is a view showing an arrangement in which a secondary order filter is used.

FIGS. 31 to 33 are views showing the arrangements of the seventeenth embodiment when a photosensor according to the present invention is constituted as an image sensor. According to this embodiment, an integrator is arranged in the filter output unit in the sixteenth embodiment (FIG. 30). Since a projecting light intensity has the highest limit, a signal output from a bandpass filter 18 is so weak that the signal cannot easily detected. When an integrator 19 is arranged, the signal is additionally amplified. For this reason, the signal can be amplified to have a sufficient large magnitude, and the signal can be easily detected. However, when the integrator 19 is arranged, a secondary or higher order filter must be used as the filter 18. For explaining this, FIG. 32 shows an example in which an integrator is arranged at the output of a primary order filter, and its operation is analyzed. The photoelectric current of a PIN photodiode is denoted as $I_{ph}$, and the photoelectric current $I_{ph}$ is converted into a voltage by using a resistor R. This output is received by a differentiating circuit (=primary order high-pass filter) constituted by a electrostatic capacitor C. The output is additionally amplified by an integrator constituted by an operation amplifier 20 and an electrostatic capacitor $C_o$. When output voltage is denoted as V. The result of frequency analysis is expressed as follows:

$$V/I_{ph} = -C \cdot R/[C_o(1+j\omega CR)] \quad (1)$$

where $j=\sqrt{(-1)}$ and $\omega(=2\pi f)$ is an angular frequency.

In this case, the frequency is set to be high, $V/I_{ph}$ can be approximated by $-1/j\omega C_o$, the structure operates as an integrator. However, the frequency is set to be low, $V/I_{ph}$ is close to $-C \cdot R/C_o$, and $V/I_{ph}$ does not become zero even if the frequency is set to be the lowest limit. This means that external light cannot be removed by using the arrangement in FIG. 32. This is because the sharpness of cut-off characteristics of the primary order filter is not sufficient, a low-frequency input partially leaks to be output, and the leakage low-frequency component is integrated and amplified by the integrator 19 to be output. When a secondary or higher order filter is used, the above problem can be solved.

FIG. 33 shows an arrangement in which a secondary order filter is used. In this arrangement, the secondary order filter is constituted by capacitors $C_1$ and $C_2$ and a resistor $R_1$. When frequency analysis is performed in the same manner as described above, the following result can be obtained:

$$V/I_{ph} = (-j\omega C_1 \cdot C_2 \cdot R_1 \cdot R) / [(C_o(1+j\omega C_1 \cdot R_1 + j\omega C_2 \cdot R1 + j\omega C_1 \cdot R - \omega^2 C_1 \cdot C_2 \cdot R_1 \cdot R)] \quad (2)$$

Since $V/I_{ph}$ Can be approximated by $-1/j\omega C_o$ at the limit of a high frequency, this structure operates as an integrator for additionally amplifying a signal obtained by signal light. $V/I_{ph}$ can be approximated by $-j\omega C_1 \cdot C_2 \cdot R_1 \cdot R/C_o$ at the limit of a low frequency, and V is close to 0 at the limit of $\omega \to 0$. Therefore, noise caused by external light can be sufficiently cut off. In the arrangement in FIG. 33, a phototransistor is substituted for a PIN photodiode. When the phototransistor is used, a photoelectric current can be initially amplified, and a large signal current can be obtained. However, since the rise time of the phototransistor is generally long, i.e., several ms, the frequency of projection light must be low according to the rise time. The order of the filter is sequentially increased, i.e., 3, 4, . . . , the cut-off characteristics can be more sharpened. However, the number of constituent elements disadvantageously increases. When the projection-light frequency $f_s$ is increased, even if the order of the filter is decreased, the signal can be sufficiently isolated from noise.

Figure 34:
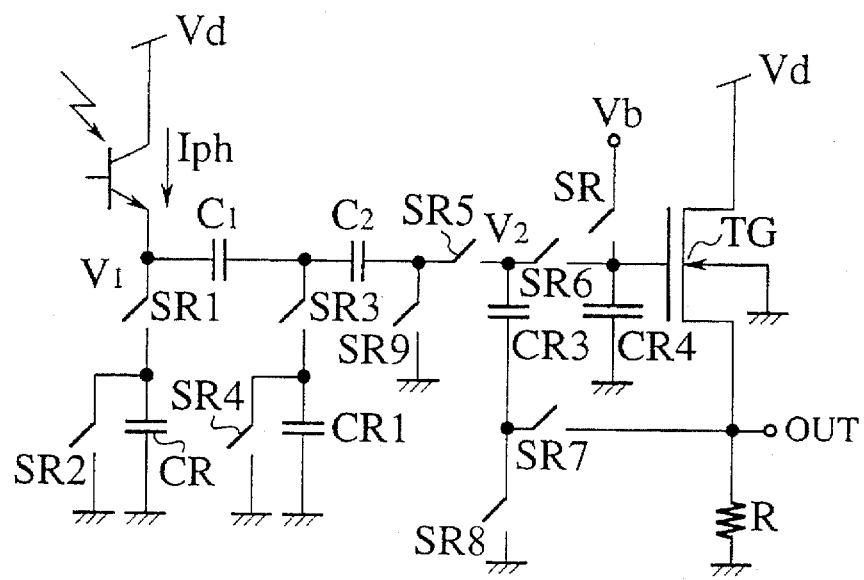
FIG. 34 is a circuit diagram of the eighteenth embodiment when a photosensor according to the present invention is constituted as an image sensor.

FIG. 34 is a circuit diagram of the eighteenth embodiment when a photosensor according to the present invention is constituted as an image sensor. According to this embodiment, a switched capacitor type filter is used in place of a CR type filter. As shown in FIG. 34, an electrostatic capacitor CR and switches SR1 and SR2 are used in place of the resistor R in the seventeenth embodiment (FIG. 33), and an electrostatic capacitor CR1 and switches SR3 and SR4 are used in place of the resistor R1. For example, the operation of the electrostatic capacitor CR and the switches SR1 and SR2 will be described below. When the switch SR1 is turned on, the electrostatic capacitor CR is charged by part of a photoelectric current $I_{ph}$. When the switches SR1 is turned off, and the switch SR2 is turned on, the electrostatic capacitor CR performs discharge. When f denotes the switching frequencies of the switches SR1 and SR2 and $V_1$ denotes a potential at the output terminal of the phototransistor, a current corresponding to an average $f \cdot C \cdot V_1$ flows in the electrostatic capacitor CR in one cycle. Reference symbol C denotes the capacitance of the electrostatic capacitor CR. Therefore, when the frequency f is sufficiently high, the electrostatic capacitor CR can be regarded as a resistor $R = 1/(f \cdot C)$. In this embodiment, no operation amplifier is used, and an output is obtained by a source follower MOSFET TG. For this reason, signal charges are temporarily stored in an electrostatic capacitor $CR_3$ through switches SR5 and SR8. At this time, the capacitance and ON time of the electrostatic capacitor CR3 are adjusted such that a potential $V_2$ of the electrostatic capacitor $CR_3$ is not excessively high. The switches SR5 and SR8 are turned off, and switches SR9, SR6, and SR7 are turned on. Accordingly, the right terminal of an electrostatic capacitor $C_2$ is set at an almost ground potential in the entire period of time, and it can be regarded that the right terminal is virtually grounded. All the charges temporarily stored in the electrostatic capacitor $CR_3$ are transferred to a holding electrostatic capacitor $CR_4$ and stored therein. As a result, the holding electrostatic capacitor $CR_4$ operates as an integrator to additionally amplifies the signal charges.

Figure 35:
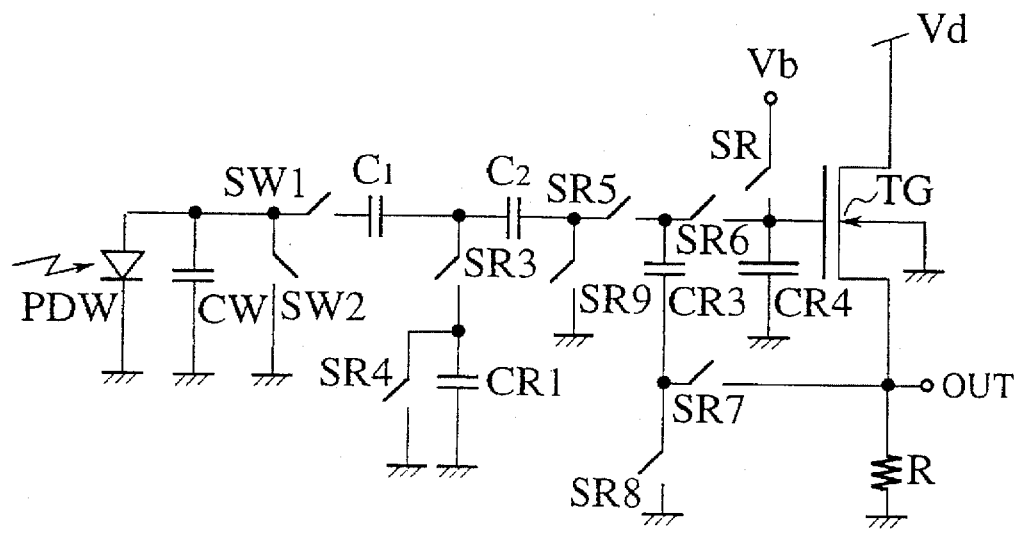
FIG. 35 is a circuit diagram of the nineteenth embodiment when a photosensor according to the present invention is constituted as an image sensor.

FIG. 35 is a circuit diagram of the nineteenth embodiment when a photosensor according to the present invention is constituted as an image sensor. According to this embodiment, a photodiode PDW which operates in a solar-battery mode is used in place of a phototransistor in the eighteenth embodiment (FIG. 34). Reference symbol CW denotes the parasitic capacitor of the photodiode PDW.

Figure 36:
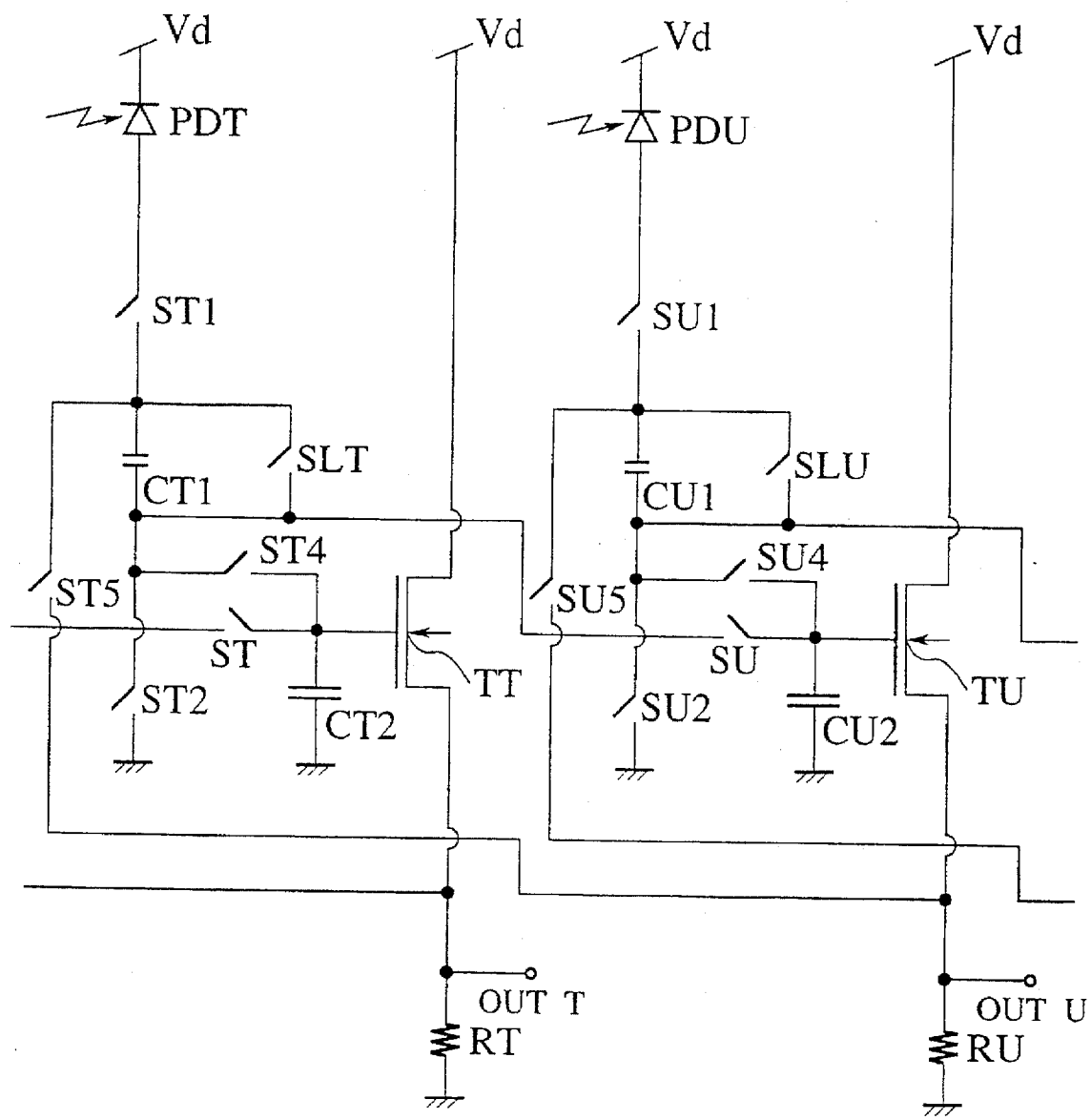
FIG. 36 is a circuit diagram of the twentieth embodiment when a photosensor according to the present invention is constituted as an image sensor.

FIG. 36 is a circuit diagram of the twentieth embodiment when a photosensor according to the present invention is constituted as an image sensor. The asynchronous system as described above is characterized in that control of the asynchronous system is easier than that of a synchronous system. In contrast to this, the asynchronous system disadvantageously has a large circuit scale. The synchronous system can be applied to not only differentiation and integration for time but also differentiation and integration for a space. This embodiment corresponds to an example of the application. FIG. 36 shows an arrangement in which two pixels for the synchronous system in the eleventh embodiment (FIG. 20) are arranged adjacent to each other. The positive electrode of a storing electrostatic capacitor $CT_1$ of a pixel T on the left side in FIG. 36 is not connected to a source follower TT of the pixel T, but is connected to the source of a source follower TU of a pixel U on the right side in FIG. 36 through a switch ST5. The negative electrode of the storing electrostatic capacitor $CT_1$ is connected to a holding electrostatic capacitor $CU_2$ of the pixel U through a switch SU.

The operation will be described below. When switches SU1 and SU4 are turned on, photoelectric charges of the positive phase in the pixel U are stored in the holding electrostatic capacitor CU2 through a electrostatic capacitor CU1. When the switches SU1 and SU4 are turned off, and switches ST1 and ST2 are turned on, photoelectric charges in the pixel T are stored in the storing electrostatic capacitor CT1. When the switches ST1 and ST2 are turned off, and the switches SU and ST5 are turned on, charges corresponding to the charges stored in the storing electrostatic capacitor CT1 are transferred to the holding electrostatic capacitor $CU_2$. For this reason, when the light intensities of the pixels U and T are represented by U and T, respectively, a total of charges (U−aT) are integrated in the holding electrostatic capacitor $CU_2$. In this case, a denotes an arbitrary constant which is determined by the ratio of a positive-phase exposure time in the pixel U and a negative-phase exposure time in the pixel T. Since the light intensities of adjacent pixels generally have strong correlation, a value (U−aT) is small. Therefore, as in the embodiment in which time differentiation is performed, when the twentieth embodiment is applied to space differentiation, an output from an image sensor is not easily saturated even without ultra-high-speed switching, and the pixel size can be advantageously can be decreased. In addition, when the number of lines is increased, differentiation and integration of one or more pixels such as both adjacent pixels or adjacent pixels arranged in four directions. As a result, local filtering used as pre-processing for image processing can be easily realized in the image sensor. Since synchronization with floodlighting is not necessary in the application of space differentiation and integration, an imaging operation can be performed by only external light without floodlighting.

An embodiment in which a photosensor serving as the above image sensor is improved will be described below.

Figure 37:
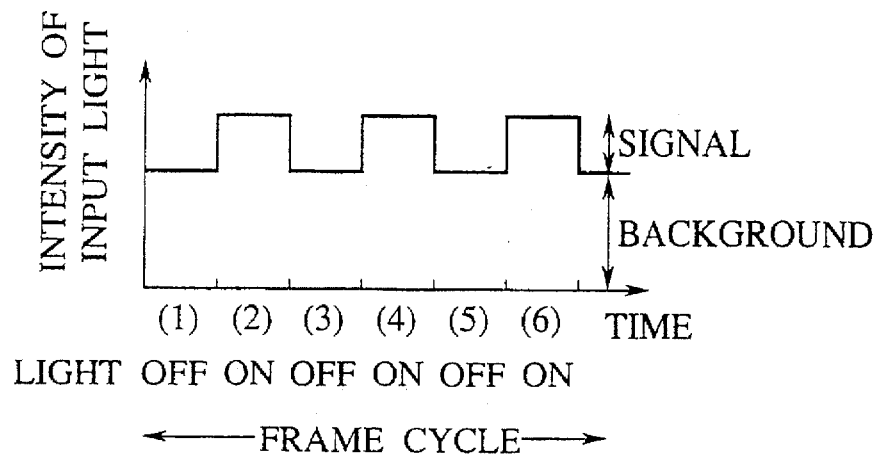
FIG. 37 is a graph for explaining the operation of the photosensor shown in FIG. 17.

The operation of the image sensor shown in FIG. 17 will be described below again with reference to FIG. 37.

In period (1), a light-emitting unit is turned off, and only background light is received. At this time, switches SH1 and SH2 are turned off, switches SH3 and SH4 are turned on, and a background light charge component corresponding to the background light is stored in a storing electrostatic capacitor CH in a negative phase. In period (2), the light-emitting unit is turned on, the background light and signal light are received. At this time, the switches SH3 and SH4 are turned off, the switches SH1 and SH2 are turned on, incident light charges corresponding to incident light including the background light and the signal light are stored in the storing electrostatic capacitor CH in the positive phase. As a result, in one cycle, a signal charge component obtained by subtracting the background light charge component from the incident light charges is stored in the storing electrostatic capacitor CH. When the storing in the positive and negative phases is repeated, only the signal charge component can be integrated and amplified while removing the background light charge component which causes noise, and a large output can be obtained. In order to read a signal, the switches SH5 and SH6 are turned on in a predetermined cycle, the signal charge component is transferred from the storing electrostatic capacitor CH to a holding electrostatic capacitor CI. That is, the switches SH5 and SH6 constitutes a transfer means for transferring the signal charge component stored in the storing electrostatic capacitor CH to the holding electrostatic capacitor CI. In this case, since storing in positive and negative phases is performed in a short cycle to remove a background light charge component, the background light does not change in one cycle for storing in the positive and negative phases. That is, as the storing cycles in the positive and negative phases are short, the image sensor is strong against a quick change in background light. However, the background light does not quickly change in long-distance photographing, the cycles need not be so short.

However, in the image sensor described above, since half of the frame cycle is designed to be used for storing, in the negative phase, the background light charge component corresponding to the background light serving as noise, a time for storing the signal charge component is half of the frame cycle at most. For this reason, sensitivity becomes lower than that in a case wherein the entire period of the frame cycle can be used to store the signal charge component. In addition, an electrostatic capacitor indicated by a dotted line is parasitic in a photodiode PDH of the light-receiving unit. In a switching operation between the positive and negative phases, signal charges stored in a storing electrostatic capacitor CH partially flow into the parasitic capacitor or the like to generate loss. In the image sensor described above, the switching operation between the positive and negative phases is frequently performed. For this reason, the loss of the signal charges is large, and sensitivity becomes lower than that in a case wherein the number of times of switching is small. Therefore, the image sensor described above must be improved with respect to this point.

Figure 38:
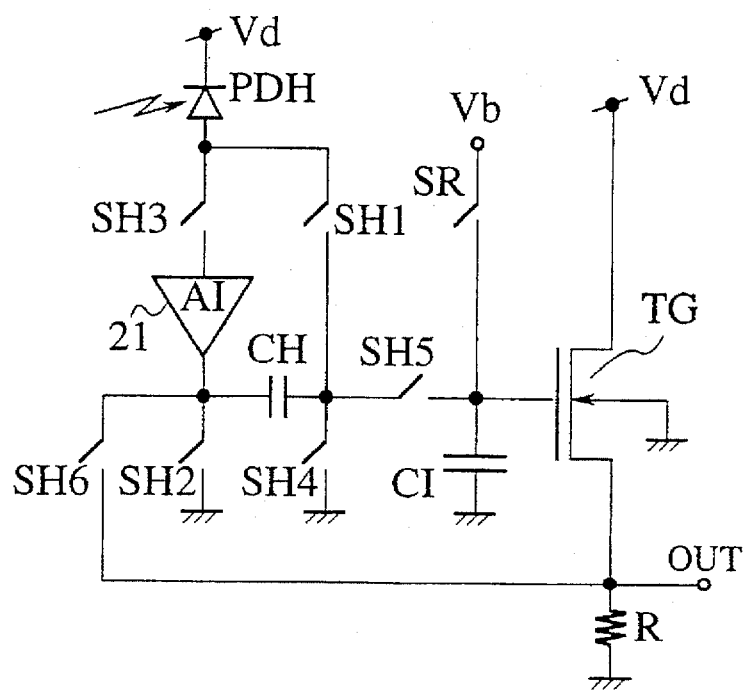
FIG. 38 is a circuit diagram of the twenty-first embodiment when a photosensor according to the present invention is constituted as an image sensor.
Figure 39:
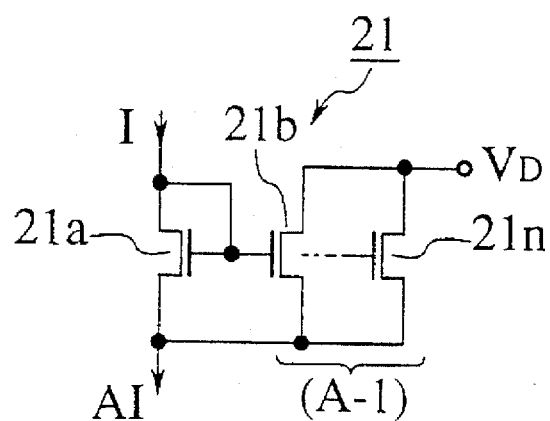
FIG. 39 is a view showing an arrangement of a current amplifier.
Figure 40:
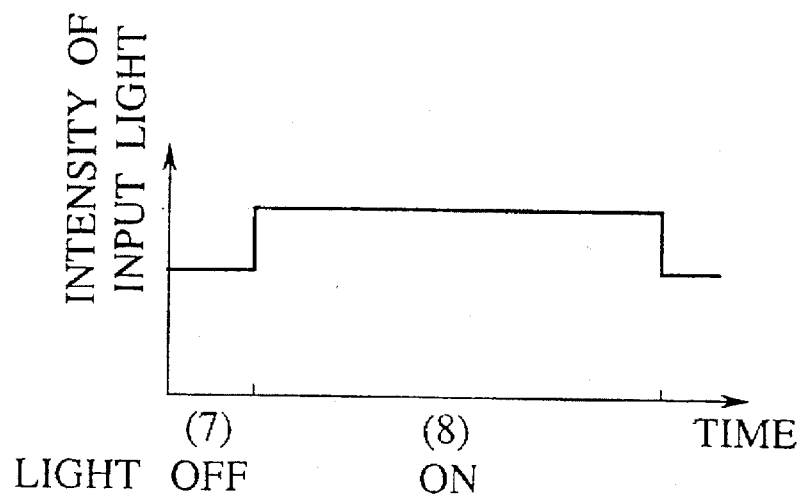
FIG. 40 is a graph for explaining the operation of the photosensor shown in FIG. 38.

An improved embodiment will be described below. FIGS. 38 to 40 show the twenty-first embodiment when a photosensor according to the present invention is constituted as an image sensor. The same reference numerals as in FIG. 38 and drawings showing embodiments following the twenty-second embodiment denotes the same parts in FIG. 17, and overlapping description will be omitted.

The arrangement of the image sensor will be described. A current amplifier 21 for amplifying a background light current component corresponding to background light by a predetermined plural number is connected as a storage time change means between a switch SH3 and the negative electrode of a storing electrostatic capacitor CH. FIG. 39 shows an arrangement of the current amplifier 21. For example, a current mirror circuit in which (A−1) MOS transistors 21b to 21n are driven by a MOS transistor 21a to amplify a current I by a predetermined plural number AI is used.

An operation of the image sensor arranged as described above will be described below with reference to FIG. 40. In period (7), a light-emitting unit is turned off, and only background light is received. At this time, since a background light current component is amplified by a predetermined plural number by means of the current amplifier 21, a background light charge component in the negative phase stored in the storing electrostatic capacitor CH is a plural number times the photoelectric charges in this period. This multiplication factor is represented by A. In period (8), the light-emitting unit is turned on, background light and signal light are received, and incident light charges corresponding to incident light including the background light and the signal light are stored in the storing electrostatic capacitor CH in the positive phase. When period (8) in which storing in the positive phase is performed is set to be A times as long as period (7) of storing in the negative phase, the background light charge component stored in the positive phase just cancels out the background light charge component stored in the negative phase. As a result, only the signal charge component is stored in the storing electrostatic capacitor CH. In this manner, storing in the positive and negative phases is repeated to remove the background light charge component, and only the signal charge component is stored in the storing electrostatic capacitor CH. With respect to this point, this embodiment performs the same operation as in the embodiment described before. In the storage operation of the signal charge component described above, signal light can be stored for a longer time in this embodiment than in the embodiment described before. Therefore, sensitivity is improved. In addition, since the number of times of switching operation between the positive and negative phases decreases, loss of signal charges in the switching operation decreases, and the sensitivity is more improved.

Figure 41:
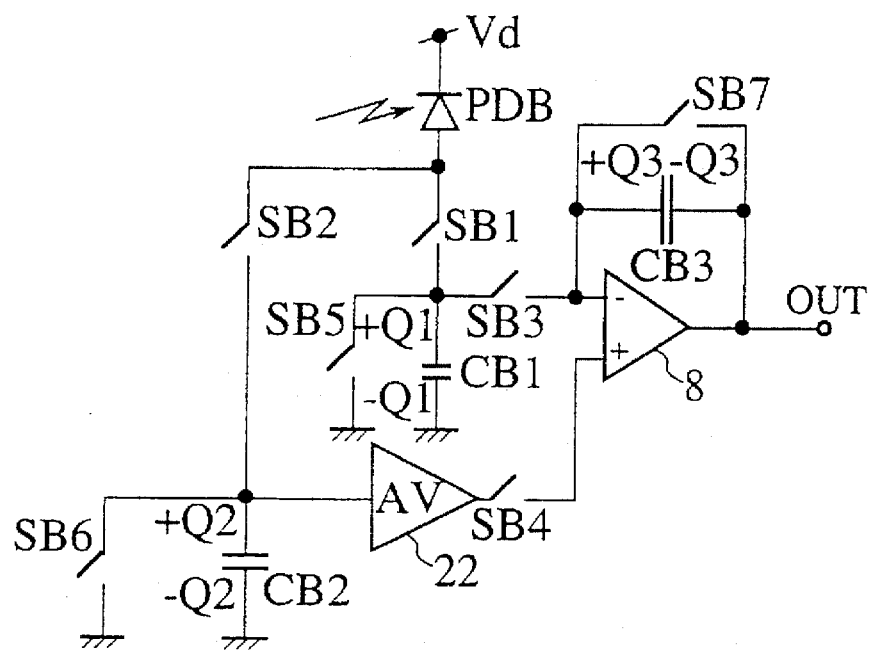
FIG. 41 is a circuit diagram of the twenty-second embodiment when a photosensor according to the present invention is constituted as an image sensor.

FIG. 41 is a circuit diagram of the twenty-second embodiment when a photosensor according to the present invention is constituted as an image sensor. The arrangement will be described below. According to this embodiment, the output side of a photodiode PDB is connected to the positive electrodes of a positive-phase storing electrostatic capacitor CB1 and a negative-phase storing electrostatic capacitor CB2 through switches SB1 and SB2, respectively. The negative electrodes of both the storing electrostatic capacitors CB1 and CB2 are grounded. The positive electrode of the positive-phase storing electrostatic capacitor CB1 is connected to the inversion input terminal (−) of an operation amplifier 8 through a switch SB3, and the positive electrode of the negative-phase storing electrostatic capacitor CB2 is connected to the non-inversion input terminal (+) of the operation amplifier 8. The output terminal of an operation amplifier 8 is connected to the negative electrode of a holding electrostatic capacitor CB3, and this connection point is directly used as an output terminal OUT. The positive electrode of the holding electrostatic capacitor CB3 is connected to the inversion input terminal (−) of the operation amplifier 8. Switches SB5, SB6, and SB7 are reset switches of the electrostatic capacitors CB1, CB2, and CB3, respectively. A voltage amplifier 22 for amplifying a background light charge component stored in the negative-phase storing electrostatic capacitor CB2 by a predetermined plural number A is connected as a storage time changing means between the positive electrode of the negative-phase storing electrostatic capacitor CB2 and the switch SB4.

An operation of the image sensor will be described below. A light-emitting unit is turned off, and only background light is received. At this time, the switch SB1 is turned off, the switch SB2 is turned on, and a background light charge component corresponding to the background light is stored in the negative-phase storing electrostatic capacitor CB2 in a negative phase. The light-emitting unit is turned on, the background light and signal light are received. At this time, the switch SB2 is turned off, the switch SB1 is turned on, incident light charges corresponding to incident light including the background light and the signal light are stored in the positive-phase storing electrostatic capacitor CB1 in the positive phase. Thereafter, when the switches SB3 and SB4 are turned on, a signal charge component obtained by subtracting the background light charge component from the incident light charges by the operation of the operation amplifier is transferred to the holding electrostatic capacitor CB3. More specifically, in the image sensor having this arrangement, the switches SB3 and SB4 and the operation amplifier 8 constitute a transfer means in which the signal charge component obtained by subtracting the background charge component from the incident light charges stored in the positive-phase storing electrostatic capacitor CB1 is transferred to the holding electrostatic capacitor CB3. In the subtraction operation in which the background light charge component is subtracted from the incident light charges, the background light charge component stored in the negative-phase storing electrostatic capacitor CB2 are amplified by the predetermined plural number A by means of the voltage amplifier 22 in this embodiment. For this reason, when a time required to store the incident light charges in the positive-phase storing electrostatic capacitor CB1 in the positive phase is A times as long as a negative-phase storage time, the background light charge component stored in the positive phase just cancels out the background light charge component stored in the negative phase. As a result, only the signal charge component is stored in the holding electrostatic capacitor CB3. Therefore, the same operations as shown in FIG. 40 can be performed. That is, a signal charge storage time can be elongated, and the number of times of a switching operation between the positive and negative phases can be decreased, thereby improving the sensitivity.

Figure 42:
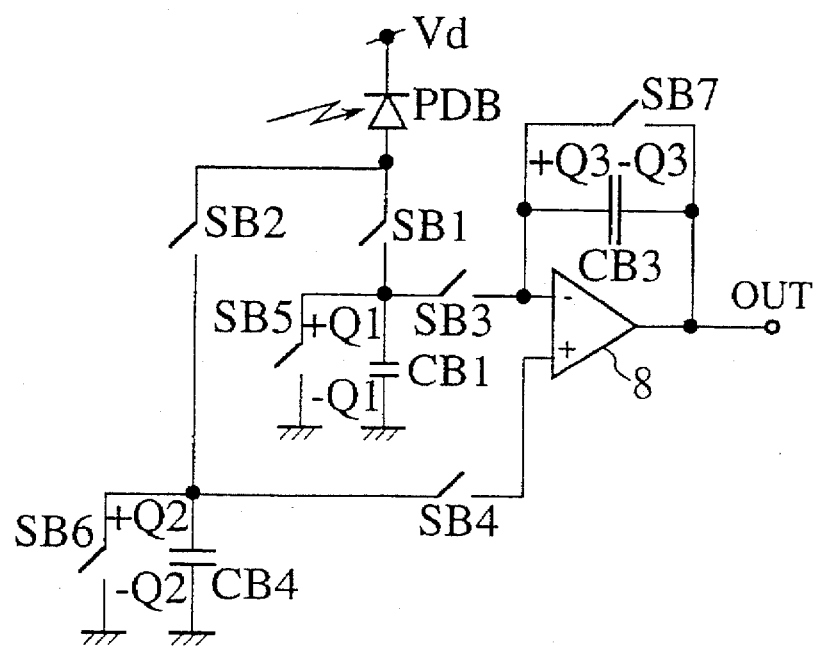
FIG. 42 is a circuit diagram of the twenty-third embodiment when a photosensor according to the present invention is constituted as an image sensor.

FIG. 42 is a circuit diagram of the twenty-third embodiment when a photosensor according to the present invention is constituted as an image sensor. According to this embodiment, the electrostatic capacitance of a negative-phase storing electrostatic capacitor CB4 is set to be 1/A times as large as that of the electrostatic capacitance of a positive-phase storing electrostatic capacitor CB1. A storing time changing means is constituted by the negative-phase storing electrostatic capacitor CB4 having the electrostatic capacitance set to be low. Due to the above arrangement, a storing time does not change, a voltage which is A times as high as the voltage of the positive-phase storing electrostatic capacitor CB1 is charged in the negative-phase storing electrostatic capacitor CB4. Therefore, according to this embodiment, as in the twenty-second embodiment, a time for storing the incident light charges in the positive-phase storing electrostatic capacitor CB1 in the positive phase can be set to be A times as long as the negative-phase storing time, the number of times of a switching operation between the positive and negative phases can be decreased, and sensitivity can be improved.

Figure 43:
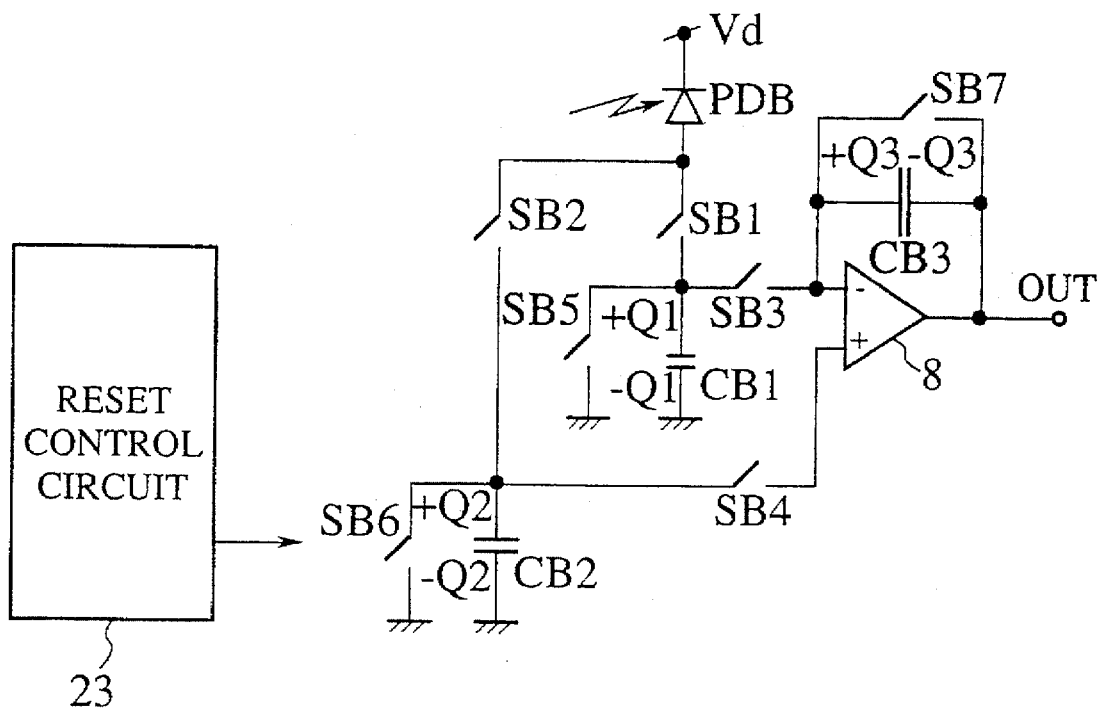
FIG. 43 is a circuit diagram of the twenty-fourth embodiment when a photosensor according to the present invention is constituted as an image sensor.
Figure 44:
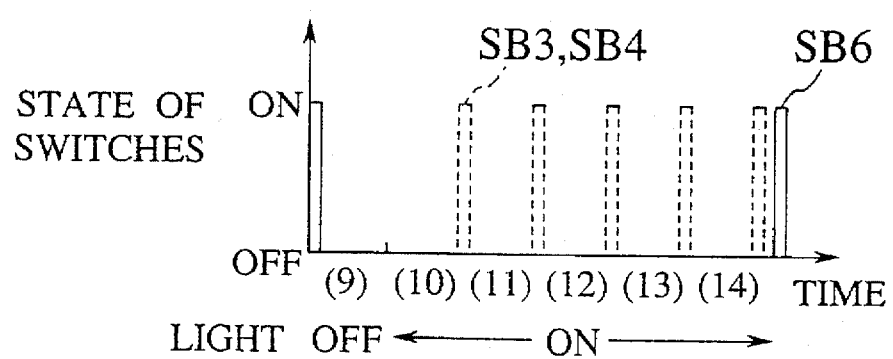
FIG. 44 is an operation timing chart of the photosensor shown in FIG. 43.

FIG. 43 is a circuit diagram of the twenty-fourth embodiment when a photosensor according to the present invention is constituted as an image sensor. According to this embodiment, in an image sensor having the same arrangement as that of the image sensor in the twenty-second embodiment, a reset control circuit 23 for controlling a reset switch SB6 of a negative-phase storing electrostatic capacitor $CB_2$ is arranged as a storing time changing means. The reset control circuit 23 is designed such that a background light charge component obtained by detecting background light for a predetermined time can be held in the negative-phase storing electrostatic capacitor CB2 for a time which is plural times as long as the predetermined time. FIG. 44 shows the operation timing chart. In period (9), a light-emitting unit is turned off, only background light is received, and the background light charge component is stored in the negative-phase storing electrostatic capacitor CB2 in the negative phase. In period (10), the light-emitting unit is turned on, background light and signal light are received, and incident light charges corresponding to incident light including the background light and the signal light are stored in a positive-phase storing electrostatic capacitor CB1 in the positive phase. Next, switches SB3 and SB4 are turned on to transfer only a signal charge component to a holding electrostatic capacitor CB3. In period (11), the light-emitting unit is kept in an ON state, the incident light charges are stored in the positive-phase storing electrostatic capacitor CB1 in the positive phase. At this time, unlike the embodiment described before, the reset switch SB6 is kept in a cut-off state not to reset the background light charge component stored in the negative-phase storing electrostatic capacitor CB2. At the end of period (11), the switches SB3 and SB4 are turned on, subtraction is performed by using the background light charge component stored in the negative-phase storing electrostatic capacitor CB2, and only the signal charge component is transferred to and stored in the holding electrostatic capacitor CB3. This operation is repeated A times. With the above operation, a time for storing the incident light charges including the signal charge component in the positive-phase storing electrostatic capacitor CB1 in the positive phase can be set to be plural times as long as a background light detecting time, and sensitivity can be improved.

Although the improved embodiments are described on the basis of the embodiments shown in FIGS. 17 and 9, the above description is also applicable to all the remaining embodiments.

In contrast to the above description, the negative-phase storing time of the background light charge component may be longer than the positive-phase storing time of the signal charge component. For example, when the intensity of signal light is sufficiently high, and a sufficiently high output can be obtained within a short positive-phase storing time, the background light charge component are stored for a long time. At this time, the influence of noise of the background light decreases, and an image signal having a high accuracy can be obtained. In this case, the amplification factor A or predetermined plural number A shown in FIGS. 38, 41, and 42 is preferably set to be smaller than 1, or, in contrast to the cases shown in FIGS. 38, 41, 42, and 43, an amplifier or a timing control circuit is preferably arranged on the positive-phase storing side.

A case wherein a photosensor according to the present invention is constituted as a distance sensor will be described below.

Figure 45:
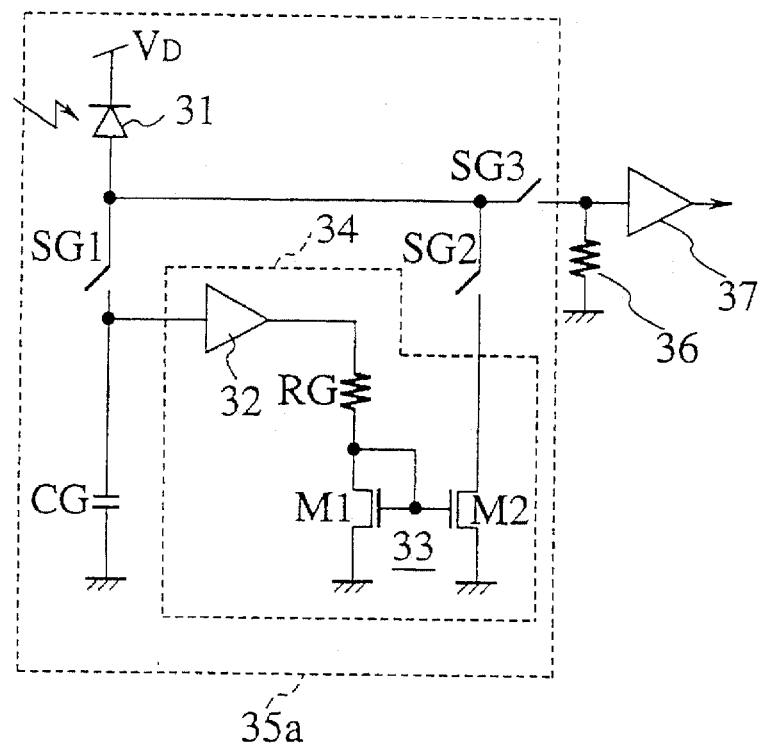
FIG. 45 is a circuit diagram of the twenty-fifth embodiment when a photosensor according to the present invention is constituted as a distance sensor.
Figure 46:
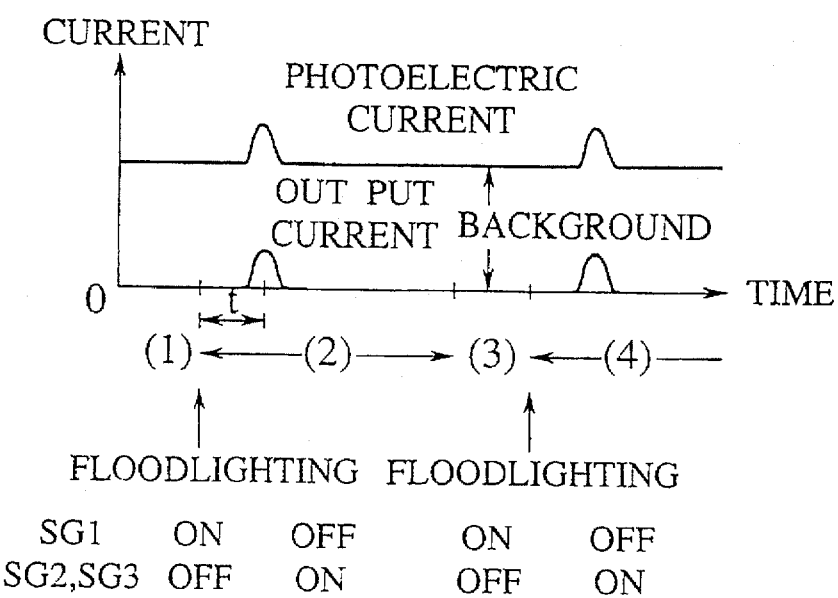
FIG. 46 is a graph for explaining the operation of the photosensor shown in FIG. 45.

FIGS. 45 and 46 are views showing the twenty-fifth embodiment when a photosensor according to the present invention is constituted as a distance sensor. The arrangement will be described below with reference to FIG. 45. The output terminal of a photoelectric converter 31 constituted by a photodiode, a PIN photodiode, an avalanche photodiode or a phototransistor, and the like is connected to a capacitor CG serving as a current storage unit through a switch SG1 constituted by, e.g., a MOSFET, an analog switch, and the like. The other terminal of the capacitor CG is grounded. The non-grounded terminal of the capacitor CG is connected to the input side of a current mirror 33 through a resistor RG and a unit gain buffer 32 constituted by, e.g., a voltage follower, a source follower, or the like. The current mirror 33 is constituted by first and second transistors M1 and M2 having the same structures (the ratio of its sizes is A) each constituted by a MOSFET, a bipolar transistor, or the like. The first transistor M1 is diode-connected and has a control terminal connected to the control terminal of the second transistor M2. The output side of the current mirror 33 is connected to the output terminal of the photoelectric converter 31 through a switch SG2. A current reproduction unit 34 for reproducing a photoelectric current stored in the capacitor CG is constituted by the unit gain buffer 32, the resistor RG, and the current mirror 33. A light-receiving unit (light-receiving sensor) 35a is constituted by the photoelectric converter 31, the switch SG1, the capacitor CG, and the current reproduction unit 34. A DC amplifier 37 is connected to the output terminal of the light-receiving unit 35a through a switch SG3. Reference numeral 36 denotes a load resistor.

The operation of the photosensor arranged as described above will be described below with reference to FIG. 46. The switch SG1 is turned on, and the switch SG2 and a switch SG3 are turned off. A photoelectric current photoelectrically converted by the photoelectric converter 31 flows into the capacitor CG, and the photoelectric current is stored as electric charge, whereby a voltage occurs. At this time, the voltage stored in the capacitor CG is a voltage which is in proportion to an average photoelectric current. The voltage in the capacitor CG is applied across the resistor RG and the first transistor M1 through the unit gain buffer 32, a current flows in the first transistor M1, but the first transistor M1 rarely causes voltage drop because the first transistor M1 is diode-connected. For this reason, a current flowing in the resistor RG and the first transistor M1 is in proportion to the voltage of the capacitor CG. In other words, a current flowing in the resistor RG and the first transistor M1 is proportion to the mean value of the photoelectric current. The switch SG1 is turned off. Since the photoelectric current is kept stored in the capacitor CG, the current flowing in the first transistor M1 is kept held. In this state, the switches SG2 and SG3 are turned on. In the second transistor M2 constituting the current mirror 33, the current flowing in the first transistor M1, i.e., a current which is in proportion to the stored average photoelectric current, flows. At this time, when the value of A in the current mirror 33 is set to be 1, the current flowing in the second transistor M2 becomes equal to the average photoelectric current stored in the capacitor CG. In other words, the second transistor M2 reproduces the average photoelectric current. Therefore, at the output terminal of the light-receiving unit 35a, a current corresponding to the difference between the photoelectric current converted by the photoelectric converter 31 at present and the average photoelectric current stored in the capacitor CG is generated.

When a light-emitting unit is in an OFF state when the switch SG1 is turned on and the switches SG2 and SG3 are turned off, a DC current component generated by background light can be stored in the capacitor CG. When the light-emitting unit is turned on when the switch SG1 is in an OFF state and the switches SG2 and SG3 are in an ON state, the light-receiving unit 35a output a current which is constituted by only a signal component and free from the influence of the background light. As described above, when the current storage unit for storing a photoelectric current and the current reproduction unit for reproducing the photoelectric current are added to the photoelectric converter 31, a current type synchronous differentiation function can be realized. Since a DC component generated by background light is removed from the current, shot noise of the DC amplifier 37 is reduced, and an S/N ratio increases. Since the DC amplifier 37 can be used as an amplifier as shown in FIG. 45, the cost of design for the system can be reduced. In addition, since a large coupling capacitor is not required, the system can be easily integrated.

FIG. 46 is a timing chart obtained when the synchronous differentiation function is realized. In first period (1), the photoelectric converter 31 receives only background light, and an average photoelectric current generated by the background light is stored in the capacitor CG. In second period (2) different from first period (1), while the average photoelectric current generated by the background light is reproduced, the photoelectric converter 31 receives the background light and signal light. The average photoelectric current generated by the background light is subtracted from the converted photoelectric current, thereby outputting only a signal component as shown in FIG. 46. At the start of period (3), the capacitor CG is reset by using the reset means (not shown) of the capacitor CG. In period (3), the average photoelectric current generated by the background light is loaded on the capacitor CG again and stored therein. When this operation cycle is sufficiently short, even if the background light quickly changes, the background light component can be removed. If it can be expected that the background light does not quickly change, period (3) is omitted, the average photoelectric current generated by the background light stored in first period (1) can be directly used. In this manner, the whole processing time can be shortened.

Figure 47:
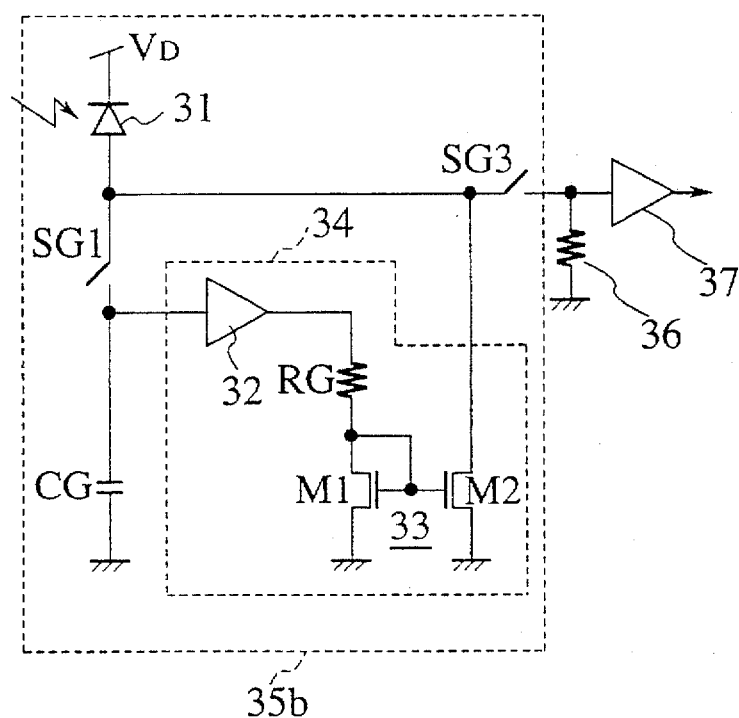
FIG. 47 is a circuit diagram of the twenty-sixth embodiment when a photosensor according to the present invention is constituted as a distance sensor.

FIG. 47 is a circuit diagram of the twenty-sixth embodiment when a photosensor according to the present invention is constituted as a distance sensor. In this embodiment, embodiment)SG2 in FIG. 45 (twenty-fifth embodiment) is omitted. When the switch SG2 is omitted, and a second transistor M2 in a current mirror 33 is kept connected to a photoelectric converter 31, an operation different from the operation in FIG. 45 is performed. More specifically, when a switch SG1 is turned on to read a background light current component, a current flows in the second transistor M2 as the capacitor CG is charged. Meantime, if the current decreases, charges stored in the capacitor CG are discharged through the second transistor M2, and only charges set such that all the photoelectric current can flow in the second transistor M2 stored in the capacitor CG. For this reason, a photoelectric current obtained at the moment when the switch SG1 is turned off is stored in the capacitor CG, and the photoelectric current is reproduced by the second transistor M2. In contrast to this, in FIG. 45, the average value of the photoelectric current obtained while the switch SG1 is in an ON state is stored in the capacitor CG. Except for the difference, both the photosensors according to the twenty-fifth and twenty-sixth embodiments perform the same operations, and can obtain the same effects. The twenty-sixth embodiment can also obtain the following effect. More specifically, according to this embodiment, since a small number of charges are stored in the capacitor CG, the capacitance of the capacitor CG can be made small. Even if the capacitor CG is not specially arranged, the input parasitic capacitor of the unit gain buffer 32 operates as a capacitor, the capacitor CG can be omitted. In FIG. 45, since an amplifying operation is performed between the storing operation and the reproducing operation, the amplification factor must be set to be, e.g., 1. In contrast to this, in FIG. 47, the storing and reproducing operations are simultaneously performed, the amplification factor is necessarily set to be 1 regardless of the constituent elements. That is, the setting of the structure in FIG. 47 is easier than that of the structure in FIG. 45. Since the storing operation can be almost instantaneously performed in FIG. 47, the storing time of the background light current component in period (1) or (3) can be extremely shortened. The structure in FIG. 47 can easily perform a high-speed operation. In contrast to this, a photoelectric current is stored in period (1) or (3) in FIG. 45, and the average value is stored. For this reason, a predetermined integrating time is required. That is, the operation of the structure in FIG. 45 is performed at a speed lower than that of the structure in FIG. 47. However, since random noise included in background light is removed by integration in FIG. 45, the structure in FIG. 45 is stronger against random noise than the structure in FIG. 47.

Figure 48:
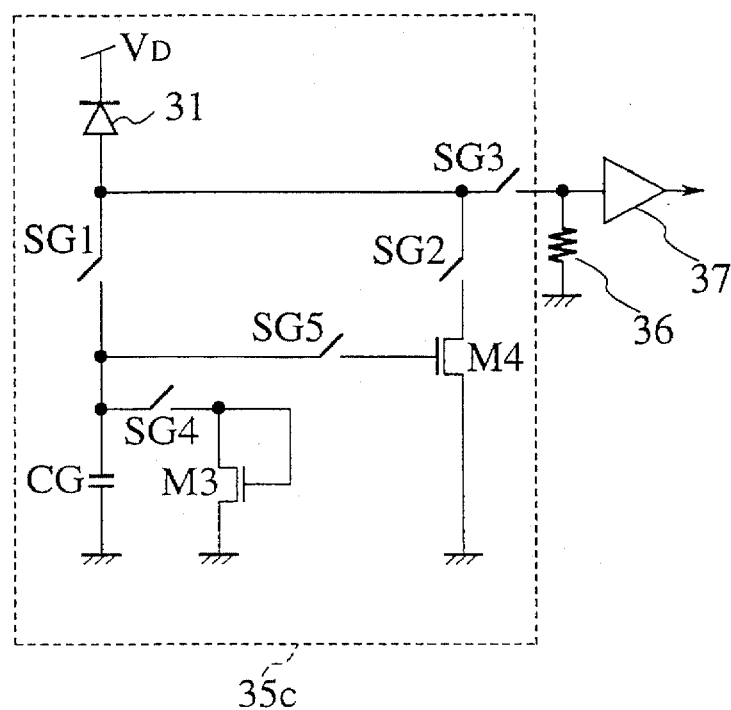
FIG. 48 is a circuit diagram of the twenty-seventh embodiment when a photosensor according to the present invention is constituted as a distance sensor.

FIG. 48 is a circuit diagram of the twenty-seventh embodiment when a photosensor according to the present invention is constituted as a distance sensor. Referring to FIG. 48, a third transistor M3 and a fourth transistor M4 have the same structure and the same size. The third transistor M3 is diode-connected. A capacitor CG is designed to have a capacitance larger than the parasitic capacitance between the gate and source of the third and fourth transistors M3 and M4. Switches SG1 and SG4 are turned on, and switches SG2, SG3, and SG5 are turned off. A photoelectric current obtained at this time charges the capacitor CG and flows in the third transistor M3 which is diode-connected. As described in FIG. 47, charges set such that all the photoelectric current flows in the third transistor M3 are stored in the capacitor CG. In this manner, a current storage unit is constituted by the capacitor CG, the switch SG4, and the third transistor M3. The switches SG1 and SG4 are turned off, and the switches SG2, SG3, and SG5 are turned on. Since the third transistor M3 and the fourth transistor M4 are designed to have the same size, a current flowing in the fourth transistor M4 is equal to the current flowing in the third transistor M3, i.e., the current stored in the capacitor CG. In this manner, a current reproducing unit can be constituted by only the fourth transistor M4.

Figure 49:
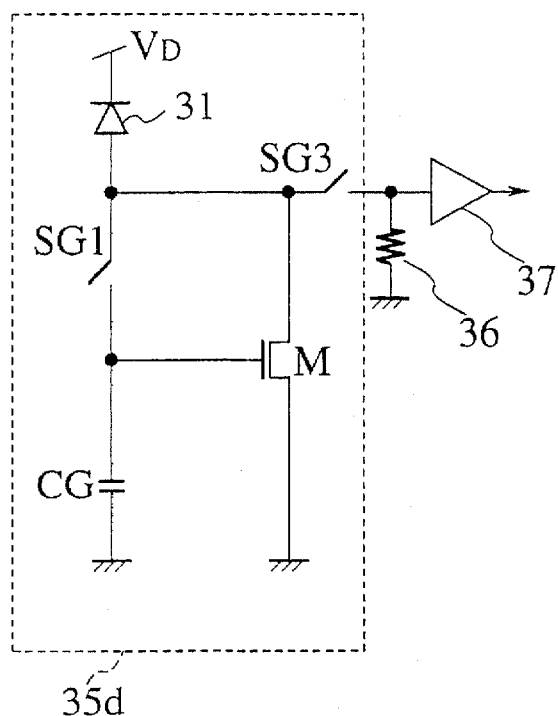
FIG. 49 is a circuit diagram of the twenty-eighth embodiment when a photosensor according to the present invention is constituted as a distance sensor.

FIG. 49 is a circuit diagram of the twenty-eighth embodiment when a photosensor according to the present invention is constituted as a distance sensor. In this embodiment, the functions of the third transistor M3 for storage and the fourth transistor M4 for reproduction in FIG. 48 are realized by one transistor M. Therefore, the number of constituent elements of the arrangement in this embodiment is least, and this arrangement is suitable for an integrated circuit. In this arrangement, in a storing operation, a switch SG1 is turned on, and a switch SG3 is turned off. In a reproducing operation, the switch SG1 is turned off, and the switch SG3 is turned on. Also in this embodiment, the parasitic capacitor between the gate and source of the transistor M can be used in place of a capacitor CG, and the capacitor CG can be omitted.

Figure 50:
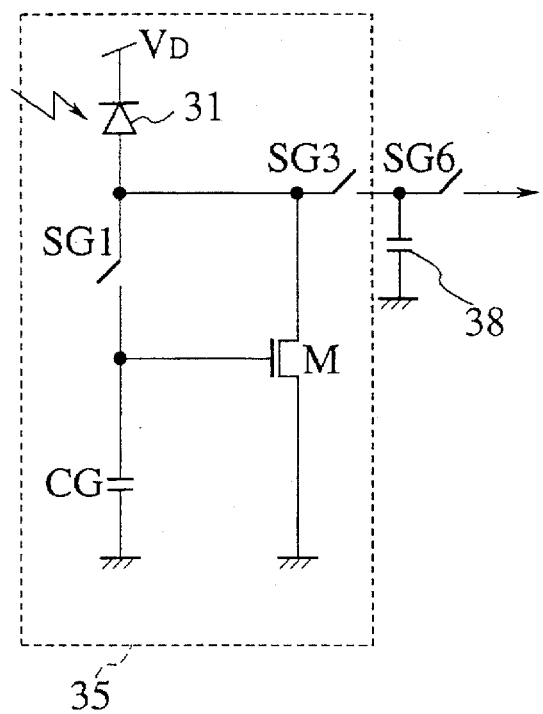
FIG. 50 is a circuit diagram of the twenty-ninth embodiment when a photosensor originally serving as a distance sensor is applied as an image sensor.

Each of the twenty-fifth embodiment to twenty-eighth embodiment is the embodiment of a photosensor mainly used as a distance sensor. However, note that the photosensor can also be used as a one-dimensional or two-dimensional image sensor. In this case, the same effects as those described in the first to twenty-fourth embodiments can be obtained. That is, first, background light can be removed without a high-speed frame transfer function and an image memory. Second, since only a signal component can be stored, when the capacitance of a capacitor for storage or the like is small, the photosensor can cope with a large change in background light component. FIG. 50 shows, as the twenty-ninth embodiment, an image sensor to which a photosensor according to the present invention is applied. Referring to FIG. 50, reference symbol SG6 denotes a pixel selecting switch; 38, a holding electrostatic capacitor in the first embodiment or the like. As in the fourth or sixth embodiment, a unit gain buffer or a source follower may be arranged between the holding electrostatic capacitor 38 and the switch SG6.

Figure 51:
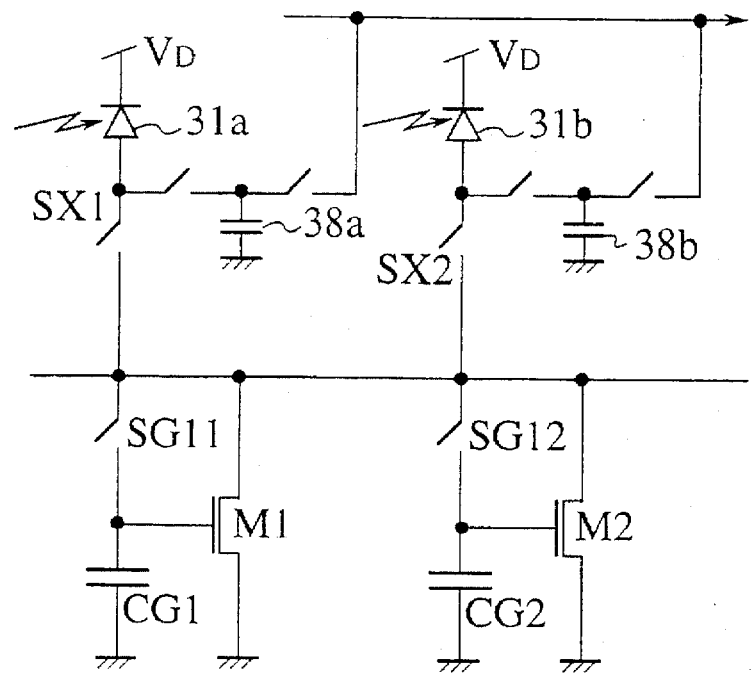
FIG. 51 is a view showing, as the thirtieth embodiment, the arrangement of two pixels of a space differential filter to which the arrangement in FIG. 50 is applied.

As in the first to twenty-fourth embodiments, arbitrary time and space filters can be realized by using a photosensor based on the twenty-fifth to twenty-eighth embodiments. For example, the arrangement of two pixels of a space differential filter to which the arrangement in FIG. 50 is applied is shown in FIG. 51 as the thirtieth embodiment. When switches SG11 and SX2 are turned off, and switches SX1 and SG12 are turned on, the photoelectric current of the left pixel can be stored in a capacitor CG2. When the switches SX1, SG11, SG12 are turned off, and the switch SX2 is turned on, the stored photoelectric current is reproduced, and a photoelectric current obtained by subtracting the reproduced photoelectric current from the photoelectric current of the right pixel is output from the right pixel as an output current. That is, the output current is the difference between the right pixel and the left pixel, and the space differential filter can be realized.

Figure 52:
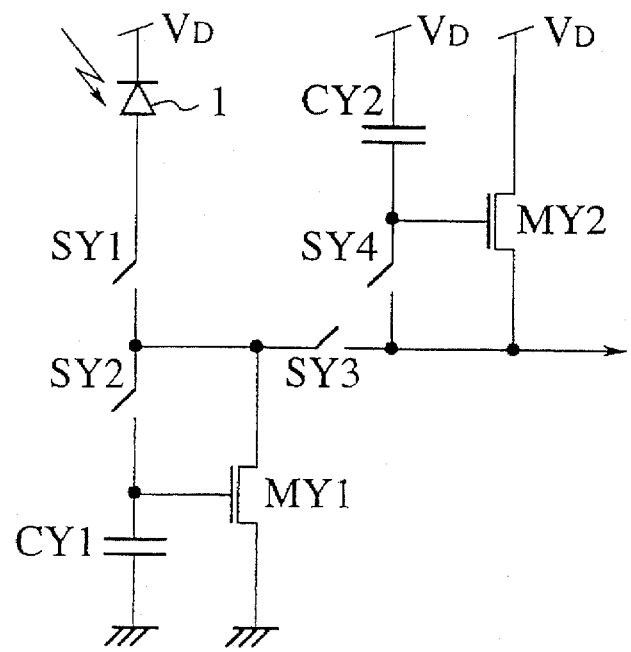
FIG. 52 is a circuit diagram of the thirty-first embodiment having a current reproduction unit, which are not grounded, of a photosensor according to the present invention.

Each of all the current reproduction units described above have one terminal which is grounded. However, in order to realize a general time and space filter, currents must be freely added to each other and subtracted from each other. Therefore, current cannot be easily added to each other without a current reproduction circuit having terminals which are not grounded. A photosensor having a current reproduction unit having terminals which are not grounded is shown in FIG. 52 as the thirty-first embodiment. Switches SY1 and SY2 are turned on, and switches SY3 and SY4 are turned off. In this case, a photoelectric current is stored and reproduced by a capacitor CY1 and a first transistor MY1. When the switches SY1 and SY2 are turned off, and the switches SY3 and SY4 are turned on, the photoelectric current reproduced by the first transistor MY1 charges a capacitor CY2 and flows in a second transistor MY2 which is diode connected. When all the switches SY1, SY2, SY3, and SY4 are turned off, a capacitor CY2 stores the photoelectric current, and the second transistor MY2 reproduces the current. In this manner, the photoelectric current stored in the capacitor CY1 and the first transistor MY1 can be transferred to the capacitor CY2 and the second transistor MY2. For example, when the switches SY1 and SY3 are turned on, and the switches SY2 and SY4 are kept in an OFF state, a photoelectric current in a conversion state at present can be easily added to a reproduced photoelectric current. Therefore, arbitrary time and space filters can be realized.

As described above the photosensor can be commonly used as a distance sensor and an image sensor. In addition, in the circuit arrangement described above, a background light component can be read and stored within a short period. However, in each of the first to twenty-fourth embodiments, a period equal to a period for storing a signal is required to read the background light component. Therefore, the photosensor described above has sensitivity higher than that of the photosensor in each of the first to twenty-fourth embodiments, and is suitable for a high-speed operation. The photosensor described above has constituent elements which are smaller in number than those of the photosensor in each of the first to twenty-fourth embodiments.

Figure 7:
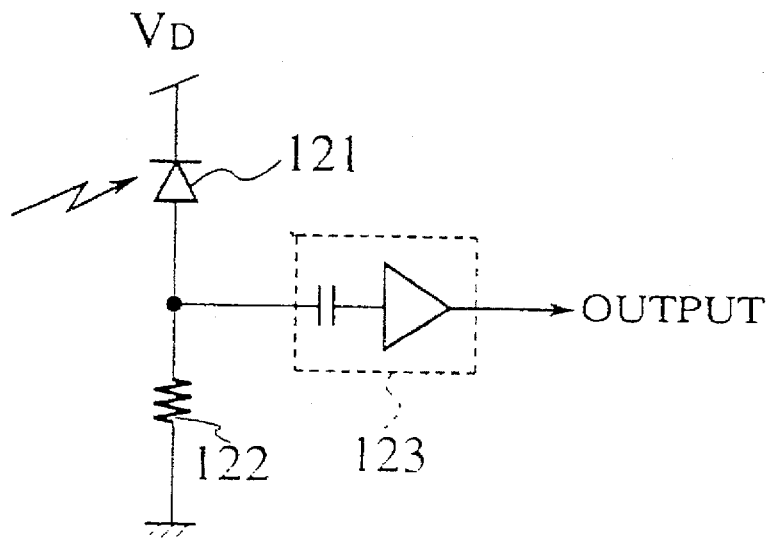
FIG. 7 is a view showing a conventional photosensor serving as a distance sensor.
Figure 8:
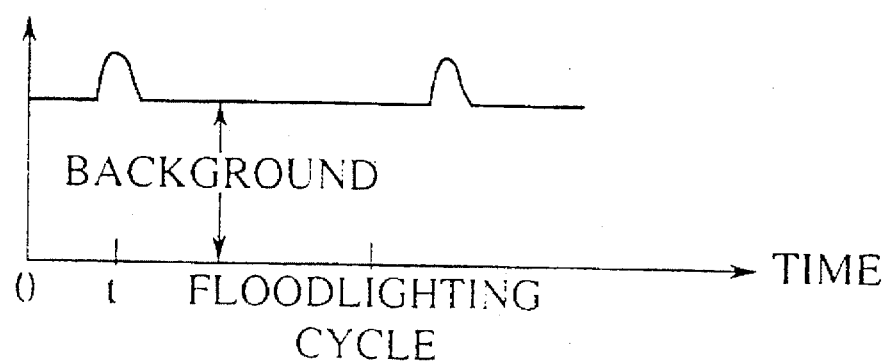
FIG. 8 is a graph showing a photoelectric current flowing in the photosensor shown in FIG. 7.

Although a pulse type distance sensor has been described, the photosensor described above can be applied to a distance sensor using random pulses which is disclosed in Japanese Unexamined Patent Publication No. 62-54189. Especially, a random pulse type distance sensor must process a signal having a frequency lower than the basic frequency of pulses by several figures. As a result, the AC amplifier described in the prior art shown in FIG. 7 is to be used, a signal having a low-frequency component must pass through the AC amplifier, and the size of a capacitor for cutting a DC component cannot be decreased. Therefore, the above photosensor is effectively used, especially, in such a case.

A case wherein the basis arrangement of a photosensor serving as the image sensor shown in FIG. 17 also functions as a distance sensor will be described below.

Figure 53:
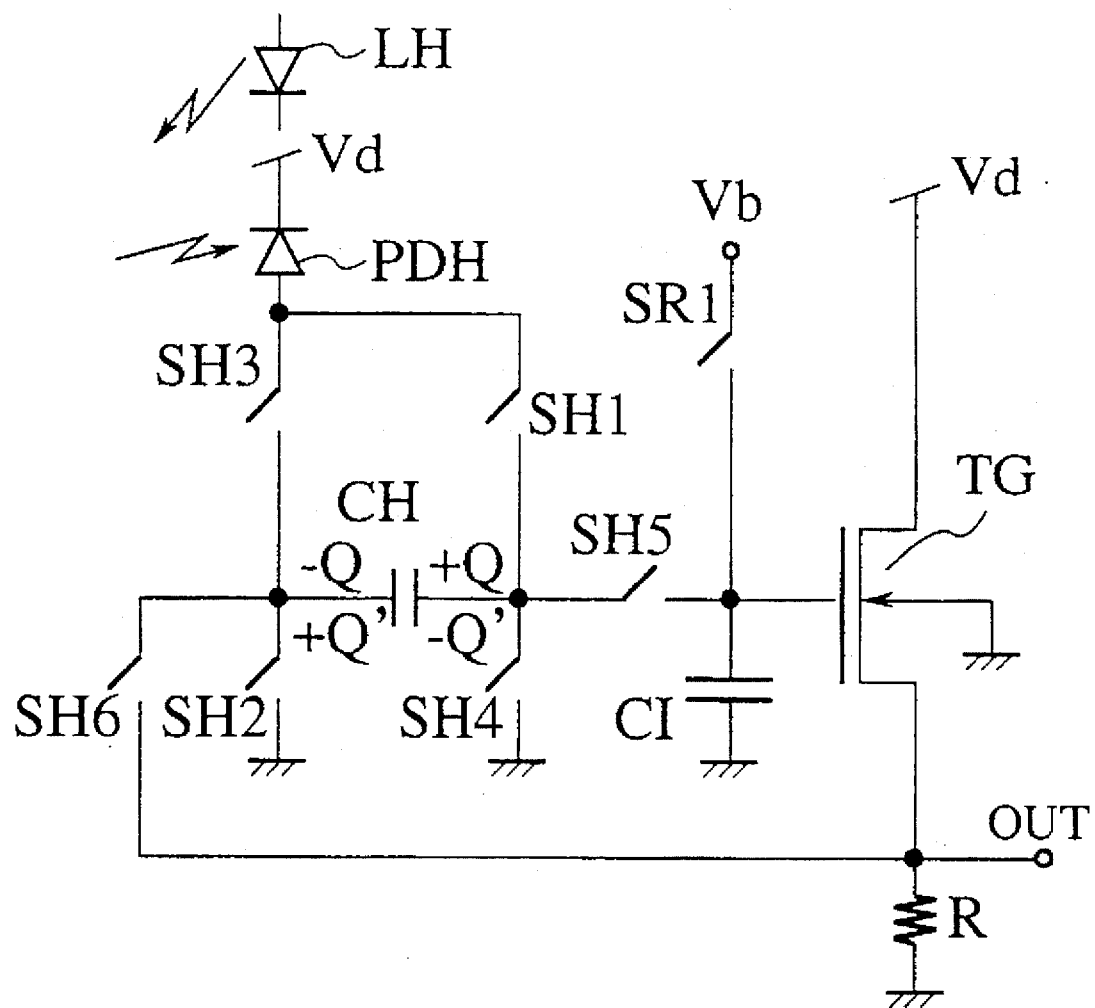
FIG. 53 is a circuit diagram of the thirty-second embodiment of a photosensor according to the present invention which has the arrangement of an image sensor and can function as a distance sensor.
Figure 54A:
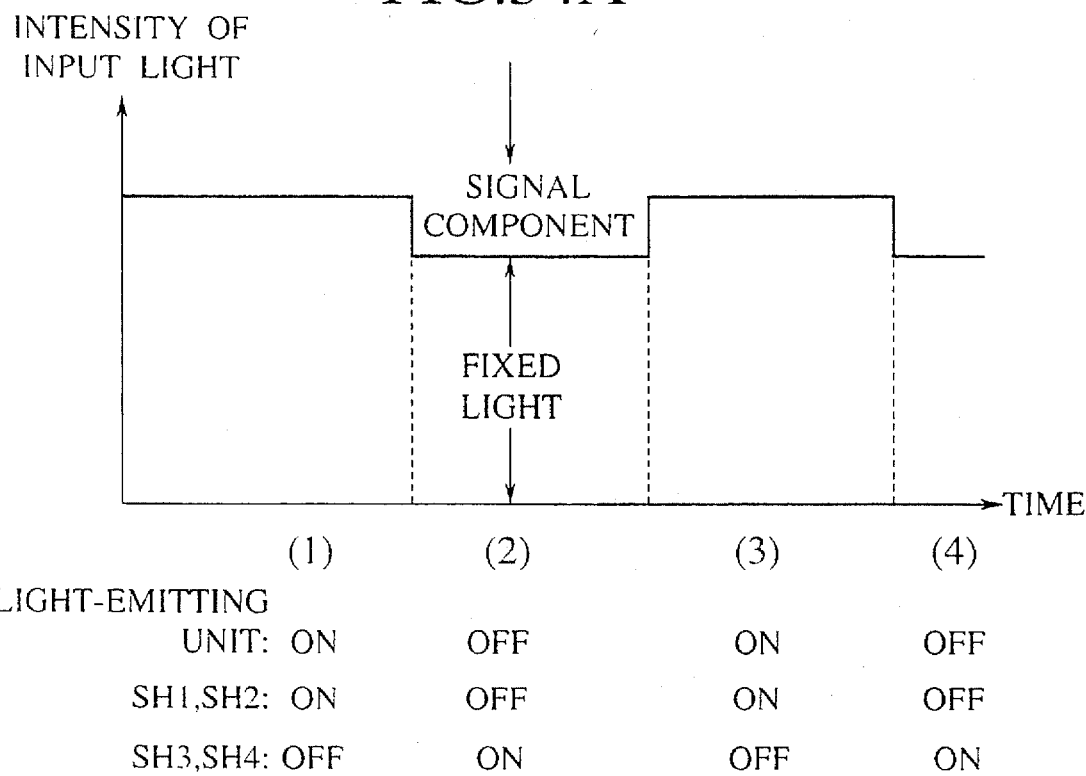
FIG. 54A and 54B are graphs for explaining the operation of the photosensor shown in FIG. 53.
Figure 54B:
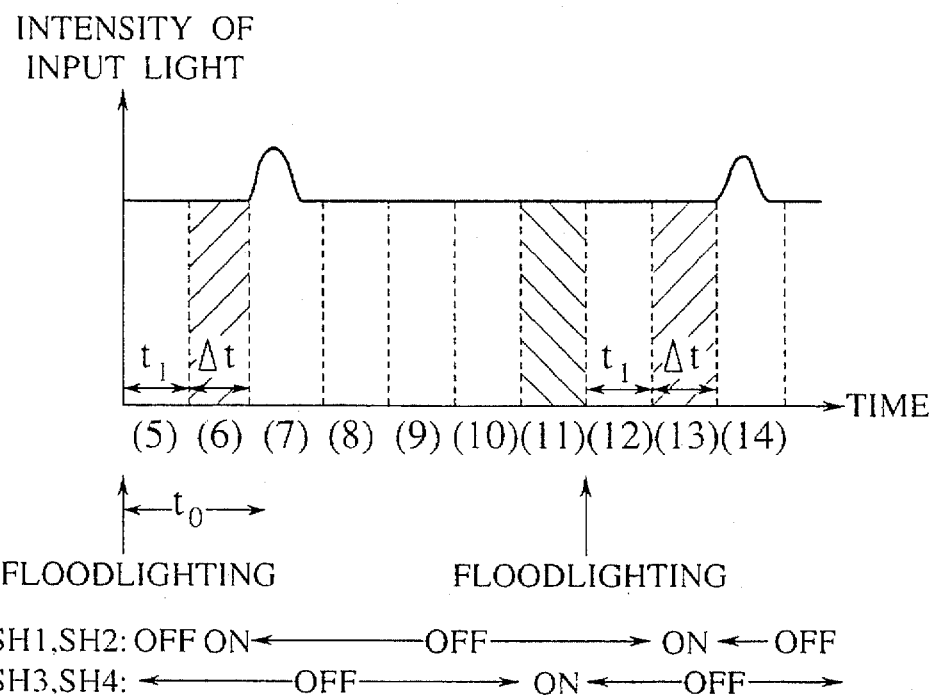

FIGS. 53 to 54B are views showing the thirty-second embodiment of a photosensor, according to the present invention, which has the same arrangement as that of an image sensor and can function as a distance sensor. FIG. 53 shows a sensor arrangement, FIG. 54A shows the operation of an image sensor function unit with a fixed light removing operation, =and FIG. 54B shows the operation of a distance sensor function unit for detecting the presence/absence of an object to be detected (to be referred to as an object hereinafter) within a predetermined distance. The sensor arrangement will be described with reference to FIG. 53. Fixed light (external light such as solar light) and light emitted from a light-emitting unit LH are reflected by the object. A PIN photodiode PDH is arranged in each pixel as a light-receiving unit which receives the reflected light as incident light including signal light. The light-receiving unit Photoelectrically converts the incident light into a photoelectric current. The output side of the photodiode PDH is connected, through switches SH1 and SH3, to the positive and negative electrodes of a storing electrostatic capacitor CH for temporarily storing charges, respectively. The positive electrode of the storing electrostatic capacitor CH is grounded through a switch SH4, and the negative electrode is grounded through a switch SH2. The positive electrode of the storing electrostatic capacitor CH is connected to the positive electrode of a holding electrostatic capacitor CI for adding and storing a signal light charge component through a switch SH5. The negative electrode of the holding electrostatic capacitor CI is grounded. Reference symbol TG denotes a source follower type MOS transistor serving as an output unit. The positive electrode of the holding electrostatic capacitor CI is connected to the gate of the MOS transistor TG, and the negative electrode of the storing electrostatic capacitor CH is connected to the source of the MOS transistor TG through a switch SH6. A relatively large gate capacitor of a MOS transistor TA can be used as the holding electrostatic capacitor CI. Reference symbol R denotes a load resistor; SR1, a reset switch of the holding electrostatic capacitor CI. The loading resistor R and the reset switch SR1 are used to set the gate voltage of the MOS transistor TG to be an initial value Vb. Reference symbol Vd denotes a power supply. Since a source potential (=output potential) Vout of the MOS transistor TG is equal to $(V_c - V_T)$ when $V_T$ is a threshold voltage of the MOS transistor TG and $V_c$ is the electrostatic potential at the positive electrode of the holding electrostatic capacitor CI, the MOS transistor TG operates as a unit gain buffer. The sensor according to this embodiment is arranged as described above and operates as an image sensor function unit or a distance sensor function unit depending on control of the switches SH1, SH2, SH3, and SH4. That is, the image sensor function unit and the distance sensor function unit are integrally constituted by common constituent elements. The operation of the image sensor function unit or the distance sensor function unit will be described below with reference to FIGS. 54A and 54B.

The operation of the image sensor function unit with a fixed light removing operation is as follows. As shown in FIG. 54A, in period (1), the image sensor function unit is controlled such that the light-emitting unit LH is turned on, the switches SH1 and SH2 are rendered conductive, and the switches SH3 and SH4 are cut. As a result, photoelectric charges corresponding to the sum of fixed light and signal light are stored in the storing electrostatic capacitor CH. In period (2), the image sensor function unit is controlled such that the light-emitting unit LH is turned off, the switches SH1 and SH2 are cut, and the switches SH3 and SH4 are rendered conductive. In this case, a fixed light charge component corresponding to the fixed light is subtracted from the photoelectric charges stored in the storing electrostatic capacitor CH. Therefore, at the end of period (2), only a signal light charge component is left in the storing electrostatic capacitor CH. When this operation is repeated, only the signal light charge component is added and stored in the storing electrostatic capacitor CH, and the signal light charge component is amplified to have a sufficiently large magnitude. In order to read the signal, the switches SH5 and SH6 are rendered conductive in a predetermined cycle, and the signal light charge component from the storing electrostatic capacitor CH is transferred to the holding electrostatic capacitor CI. That is, the switches SH5 and SH6 constitute a transfer means for transferring the signal light charge component stored in the storing electrostatic capacitor CH to the holding electrostatic capacitor CI.

The operation of the distance sensor function unit is as follows. As shown in FIG. 54B, the light-emitting unit LH emits an optical pulse. When the optical pulse is brought into contact with an object, the optical pulse is reflected from the object to return to the light-receiving unit PDH. As shown in FIG. 54B, when a time from light-emitting time to light-receiving time is represented by to, a distance d between the light-emitting unit LH and the object can be calculated as $C \cdot t_o/2$, while C is the speed of light. However, the sensor having the arrangement shown in FIG. 53 cannot directly measure the time $t_o$. For this reason, after a predetermined time $t_1$ has elapsed since the light emission, the switches SH1 and SH2 are rendered conductive for a time $\Delta t$. In FIG. 54B, this operation is indicated as period (6). When period (6) includes no reflection pulse, only fixed light is stored in the storing electrostatic capacitor CH. On the other hand, in period (7) including a reflection pulse, the fixed light and the reflection pulse are stored in the storing electrostatic capacitor CH. After a sufficiently long time, prior to next floodlighting at the end of a floodlighting cycle (period (11) in FIG. 54A), the switches SH3 and SH4 are rendered conductive. At this time, charges corresponding to the fixed light are subtracted from the charges stored in the storing electrostatic capacitor CH. As a result, when a reflection pulse is present for a time from time $t_1$ to $t_1+\Delta t$, charges are left in the storing electrostatic capacitor CH. However, when there is no reflection pulse, no charges are left in the storing electrostatic capacitor CH. In other words, depending on the presence/absence of charges left in the storing electrostatic capacitor CH, the presence/absence of an object within the range of a distance $C \cdot t_1/2$ to a distance $C (t_1+\Delta t)/2$ can be determined. At this time, the charges left in the storing electrostatic capacitor CH are read out by the same manner as described in the operation of the image sensor function unit.

In this manner, the following three types of operations can be performed in this embodiment. That is, the photosensor of this embodiment operates as (a) an image sensor, like a conventional CCD camera, in which, regardless of the light-emitting unit LH, the switches SH1 and SH2 are rendered conductive and the switches SH3 and SH4 are cut, (b) an image sensor for removing fixed light as shown in FIG. 54A, and (c) the distance sensor for determining the presence/absence of an object with in a distance as shown in FIG. 54B. As described above, the image sensor and the distance sensor can be realized by the same sensor arrangement, the number of constituent elements of the system can be reduced. As a result, the cost can be reduce, and the system can be easily decreased in size. In addition, since a double optical system is not required, the reduction of the size and the reduction of the cost can be realized, and adjustment of optical axes is not necessary. For this reason, a high accuracy can be obtained, and the cost can be reduced further more.

Since reflected light is generally very weak, the presence/absence of a reflection pulse cannot be easily determined on the basis of one light-receiving operation. In this case, as shown in FIG. 54B, sampling is performed a plurality of times, a reflection pulse can be added and integrated in the storing electrostatic capacitor CH, the reflection pulse can be amplified to have a magnitude large enough to determine the presence/absence of the reflection pulse. As a result, sensitivity is improved, and an S/N ratio is increased. In addition, not in order to determine the presence/absence of an object, but in order to determine a distance to the object, the time $t_1$ is changed to determine the presence/absence of a reflection pulse, and a position where the reflection pulse is present is stored. For example, as shown in FIG. 54B, when a floodlighting cycle is divided into short periods, and sampling is performed in order of (5), (6), (7), . . . , time $t_o$ can be found.

Figure 55:
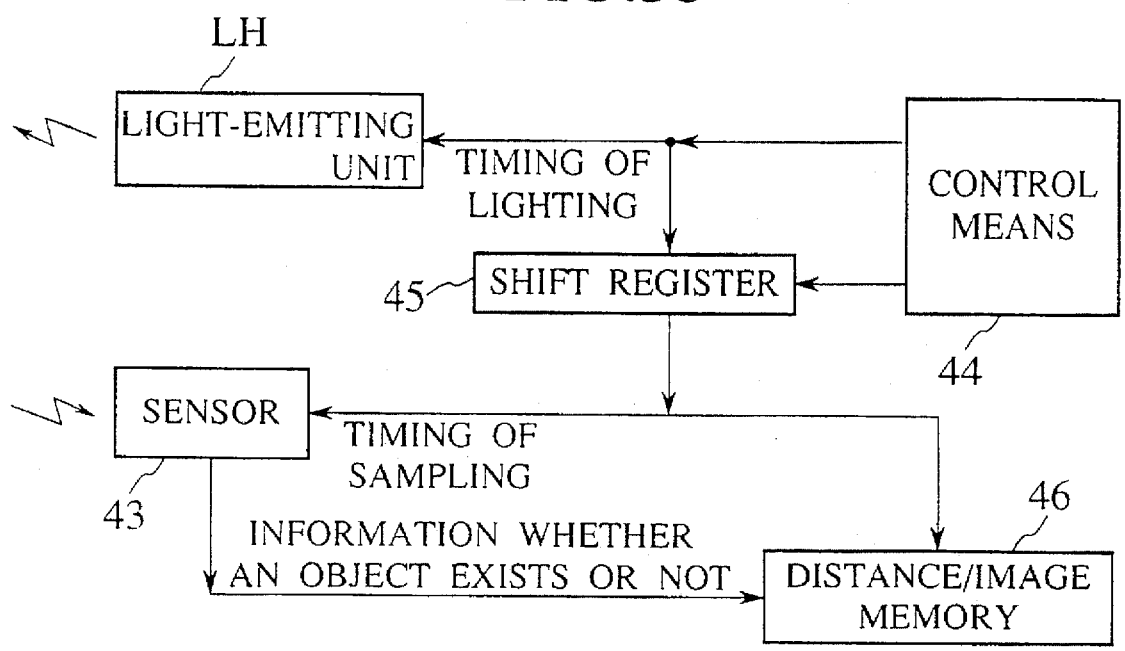
FIG. 55 is a block diagram showing the arrangement a distance sensing system for using one- or two-dimensionally arranged sensors to obtain information of a distance to an object.

FIG. 55 shows distance sensing system for acquiring information of a distance to an object by using a one- or two-dimensionally arranged sensor 43. Reference numeral 44 denotes a control means, 45, a shift register which outputs timing signals for sampling intervals such as intervals (5), (6), (7), . . . , described above, 46, distance/image memory 46 for storing the reflection pulse described above.

Figure 56:
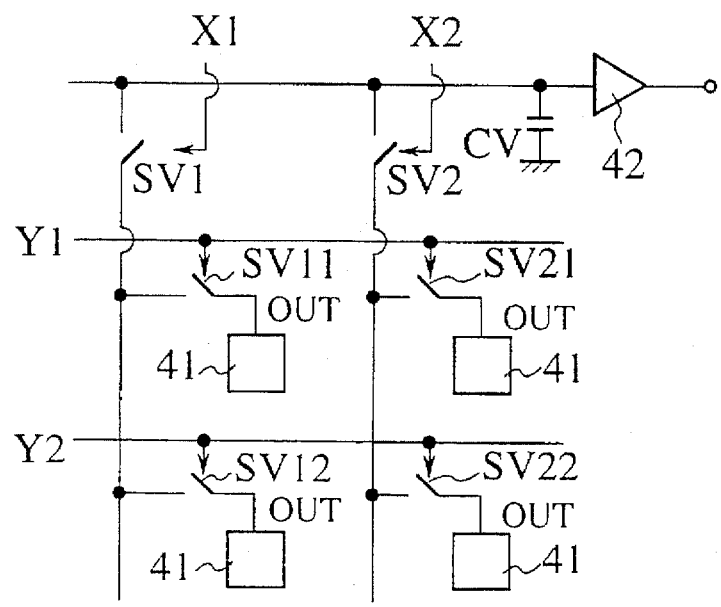
FIG. 56 is a view showing an arrangement in which photosensors shown in FIG. 55 are two-dimensionally arranged.

FIG. 56 shows an arrangement in which photosensors 41 each having the arrangement shown in FIG. 53 are two-dimensionally arranged. Reference numeral 42 denotes a pre-amplifier, and reference symbol CV denotes an input parasitic electrostatic capacitor of a wire or the pre-amplifier 42. In this manner, both an output from the image sensor (image sensor function unit) and an output from the distance sensor (distance sensor function unit) can be output through scanning switches SV11 and SV1. For this reason, different scanning switches and different wires need not be arranged, and a sensor chip can be decreased in size. In addition, since the distance sensors can be two-dimensionally arranged, a two-dimensional distance image can be obtained without mechanically scanning the light-emitting unit LH. In addition, when the distance sensors are two-dimensionally arranged, and sampling control is commonly performed to the pixels, the control can be easily performed.

Figure 57:
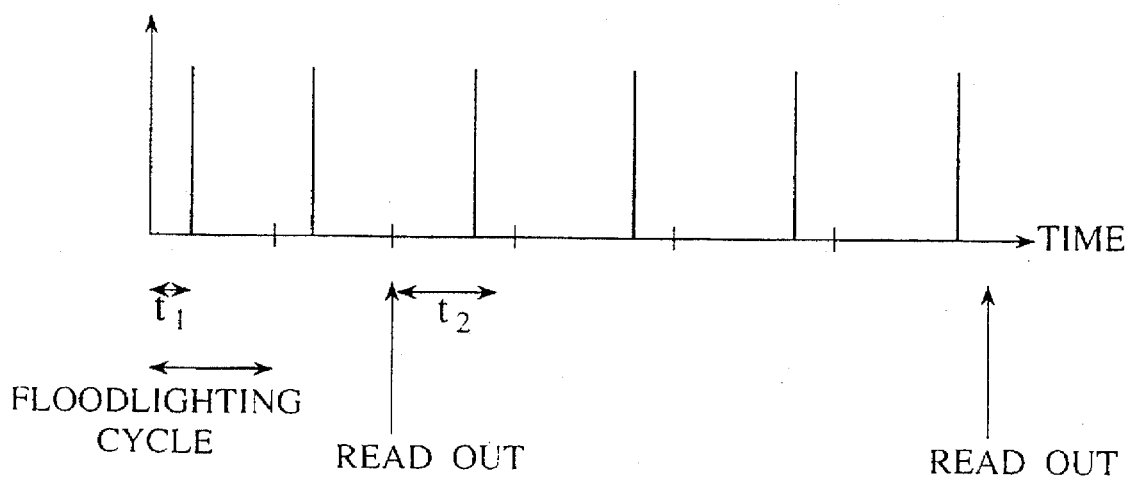
FIG. 57 is a graph showing the number of times of addition and integration of a signal light component (reflection pulse)

FIG. 57 shows the number of times of addition and integration a signal light component (reflection pulse) when the photosensor operates as a distance sensor. A light intensity is generally in inverse proportion to the square to fourth power of a distance, and decreases as a distance becomes long. For this reason, the presence/absence of an object at a near position can be determined by performing adding a small number of times, and the number of times of addition must be increased as the distance becomes long. As described above, when the number of times of addition is changed depending on a distance for search, the whole processing time can be advantageously shortened while keeping sensitivity. In addition, although a method of changing the power of a floodlighting pulse depending on the distance can also be considered, in general, the power of the floodlighting pulse can not be easily controlled. Compared with this, according to the method of changing the number of times of addition, the number of times of addition can be arbitrarily determined by only changing a processing procedure.

Figure 58:
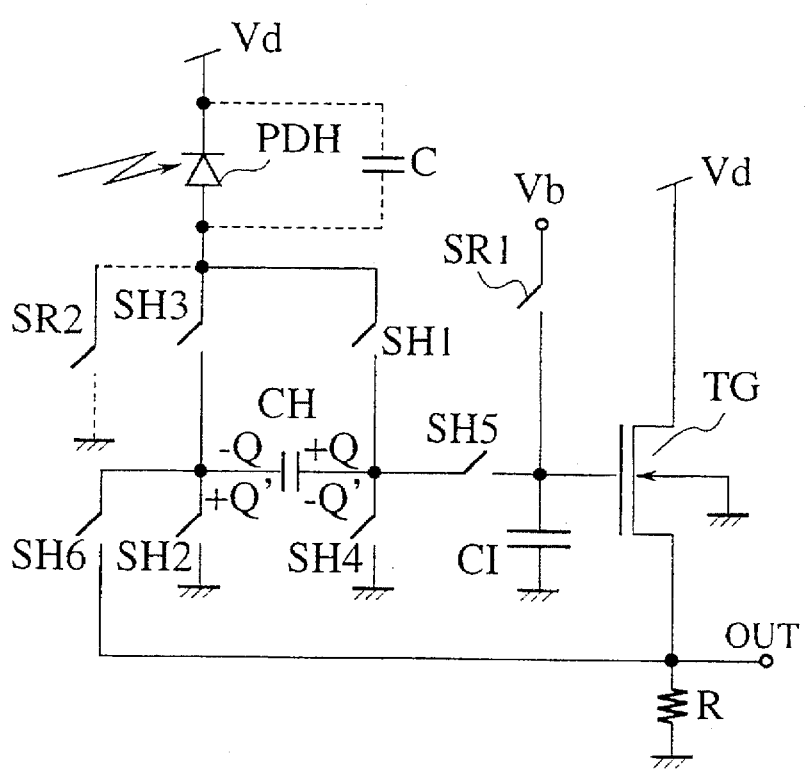
FIG. 58 is a circuit diagram of the thirty-third embodiment of a photosensor according to the present invention which has the arrangement of an image sensor and can function as a distance sensor.
Figure 59:
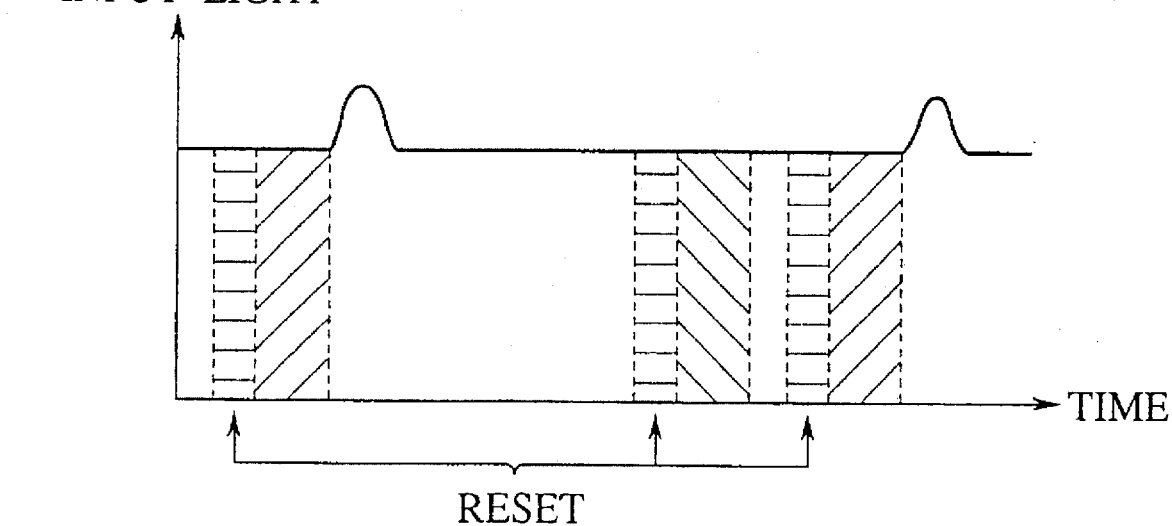
FIG. 59 is an operation timing chart of the photosensor shown in FIG. 58.

FIGS. 58 and 59 are views showing the thirty-third embodiment of a photosensor, according to the present invention, which has the same arrangement as that of an image sensor and can function as a distance sensor. FIG. 58 shows the arrangement, and FIG. 59 shows an operation timing chart. The arrangement is almost the same as that of the thirty-second embodiment (FIG. 53) except for a switch SR2 for resetting the output potential of a photodiode PDH. As previously described, a photodiode has generally a parasitic electrostatic capacitor C. For this reason, even if all switches SH1, SH2, SH3, and SH4 are in a cut-off state, a photoelectric current is stored in the electrostatic capacitor C. When the switches SH1 and SH2 or the switches SH3 and SH4 are rendered conductive, charges stored in the electrostatic capacitor C are transferred to a storing electrostatic capacitor CA. As a result, not only the reflection pulse in a sampling period as shown in FIG. 54B, but also a reflection pulse out of the sampling period are stored in a storing electrostatic capacitor CH, a distance may not be accurately detected. In contrast to this, as shown in FIG. 58, when the reset switch SR2 is rendered conductive immediately before the switches SH1 and SH2 or the switches SH3 and SH4 are rendered conductive to eliminate the charges stored in the electrostatic capacitor C, the above problem can be prevented. Even if the reset switch SR2 is not actually arranged, when the pair of switches SH3 and SH2 or the pair of switches SH1 and SH4 is rendered conductive, the electrostatic capacitor C can be reset.

Figure 60:
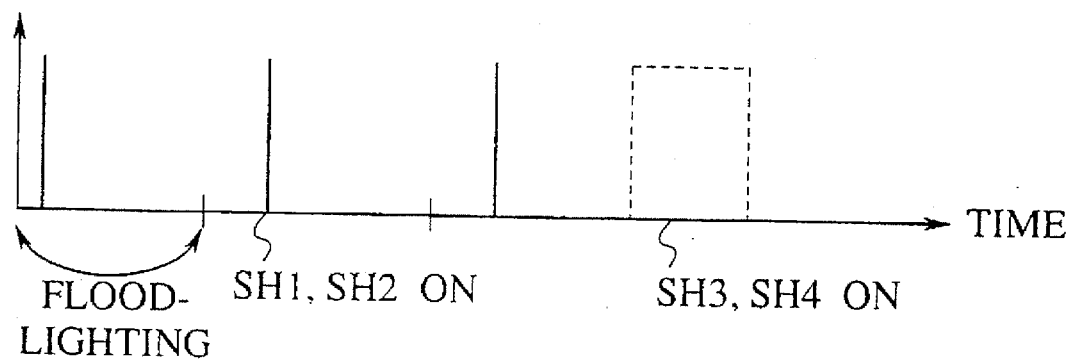
FIG. 60 is a graph showing another control method in the photosensor shown in FIG. 58.

FIG. 60 shows another control method. With considering reset, when subtraction of a fixed light component is performed every sampling, the number of times of switching increases. In order to reduce the number of times of switching, referring to FIG. 60, the switches SH1 and SH2 are rendered conductive a plurality of times, sampling is performed, and then the switches SH3 and SH4 are rendered conductive once, thereby removing a fixed light component. As a result, the number of times of switching can be reduced, and control can be easily performed.

Figure 61:
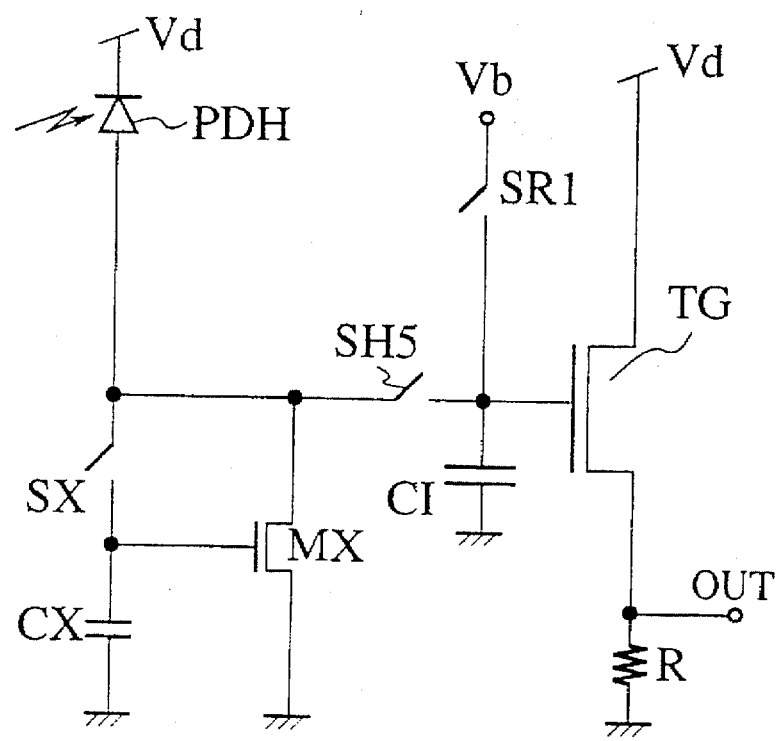
FIG. 61 is a circuit diagram of the thirty-fourth embodiment of a photosensor according to the present invention which has the arrangement of an image sensor and can function as a distance sensor.
Figure 62:
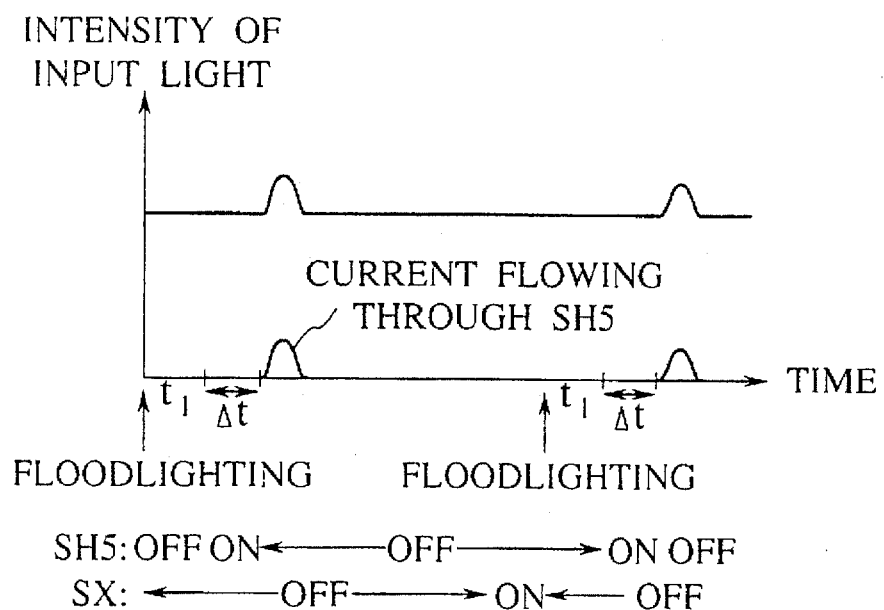
FIG. 62 is an operation timing chart of the photosensor shown in FIG. 61.

FIGS. 61 and 62 are views showing the thirty-fourth embodiment of a photosensor, according to the present invention, which has the same arrangement as that of an image sensor and can function as a distance sensor. FIG. 61 shows the arrangement of an image sensor with a fixed light removing function, and FIG. 62 shows an operation timing chart. In this case, a photoelectric current corresponding to fixed light is stored by a switch SX, an electrostatic capacitor CX, and a MOS transistor MX, and reproduced by the MOS transistor MX. That is, the electrostatic capacitor CX constitutes a fixed light current storage means. As a result, when a switch SH5 is rendered conductive, only a signal light current component free from a fixed light current component flows in the switch SH5, and is stored in a holding electrostatic capacitor CI. As is apparent from the operation timing chart in FIG. 62, the switch SH5 is rendered conductive to perform sampling. In addition, when the switch SX is rendered conductive, a fixed light charge component corresponding to fixed light is stored in the electrostatic capacitor CX. Subtraction is continuously performed depending on the flowing manner of a current. Since the photoelectric current generated by the photodiode PDH in FIG. 61 can always flow in the MOS transistor MX, no charges are stored in the parasitic electrostatic capacitor of the photodiode PDH. As a result, according to this embodiment, reset need not be performed before sampling, and the arrangement and control can be simplified.

Figure 63:
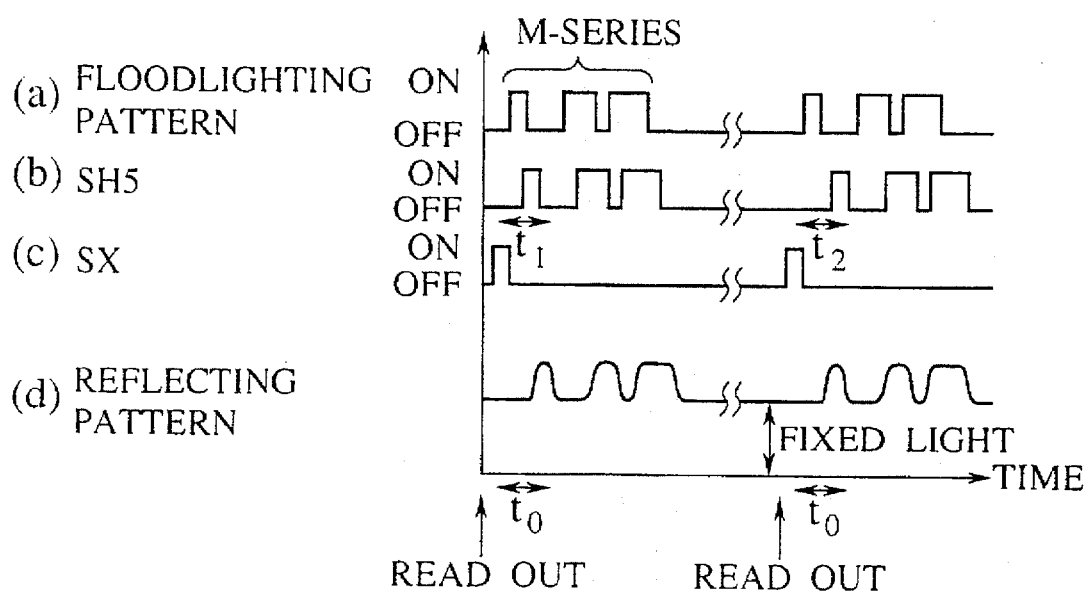
FIG. 63 is a graph showing an embodiment in which the present invention is applied to a radar using a random pulse.

The above embodiments have described that, when a photosensor operates as a distance sensor, a pulse radar operation, i.e., an operation in which a pulse having a predetermined width floodlights in a predetermined cycle to find a time for return of a reflection pulse is performed. However, the present invention can be also applied to a radar of another type. An embodiment in which the present invention is applied to a radar using a random pulse and disclosed in, e.g., Japanese Unexamined Patent Publication No. 62-54189 is shown in FIG. 63. FIG. 63 shows operation timings when M-series pulses floodlights by using the thirty-fourth embodiment (FIG. 61). When the M-series pulses shown in FIG. 63 floodlight, a reflection pulse returns delayed by a phase which is in proportion to the distance to an object returns. When, by using the switch SH5, sampling in which a reflection pulse in the same pattern of the floodlighting is delayed by a predetermined phase is performed, correlation can be obtained as an output from the sensor. When the delay of the phase of a sampling pattern is scanned, maximum correlation can be obtained when the delay of the phase coincides with the delay of the phase of the reflection pulse. Therefore, when a position where the maximum output is obtained is found, the distance to the object can be calculated.

It should be understood that many modifications and adaptations of the invention will become apparent to those skilled in the art and it is intended to encompass such obvious modifications and changes in the scope of the claims appended hereto.

What is claimed is:

1. A photo detecting apparatus for detecting reflected light from an object and excluding an external light component from the reflected light comprising:

a light-emitting unit for emitting light; and a photo detecting unit, having a plurality of pixels, for detecting light reflected from an object;

the photo detecting unit, for each pixel, having photoelectric conversion means for converting incident light into a photoelectric current; and differential electric quantity generation means for calculating a difference between an electric quantity based on a photoelectric current obtained by said photoelectric conversion means in a first period and an electric quantity based on a photoelectric current obtained by said photoelectric conversion means in a second period;

wherein the first period is a period in which the light-emitting unit is emitting light, and the second period is a period in which the light-emitting unit is not emitting light.

2. The photodetecting apparatus to claim 1, wherein:

said differential electric quantity generation means comprises:

a first storing electrostatic capacitor in which charges serving as electric quantity corresponding to the first period are stored;

a second storing electrostatic capacitor in which charges serving as electric quantity corresponding to the second period are stored;

transfer means for subtracting the charges stored in the second storing electrostatic capacitor from the charges stored in the first storing electrostatic capacitor and transferring resultant charges; and a holding electrostatic capacitor in which the charges transferred by said transfer means are stored.

3. The photodetecting apparatus according to claim 1, wherein:

said differential electric quantity generation means comprises:

a storing electrostatic capacitor in which charges serving as electric quantity corresponding to the first or second period are stored;

transfer means for transferring charges serving as electric quantity corresponding to the second or first period converted by said photoelectric conversion means and the charges stored in said storing electrostatic capacitor in characteristics opposite to each other; and a holding electrostatic capacitor in which the charges transferred by said transfer means are stored.

4. The photodetecting apparatus according to claim 1, wherein:

said differential electric quantity generation means comprises:

transfer means for transferring charges serving as electric quantity corresponding to the first period converted by said photoelectric conversion means and charges serving as electric quantity corresponding to the second period in characteristics opposite to each other; and a holding electrostatic capacitor in which the charges transferred by said transfer means are stored.

5. The photodetecting apparatus according to claim 1, wherein:

said differential electric quantity generation means comprises:

a storing electrostatic capacitor in which, after charges serving as electric quantity corresponding to the first period converted by said photoelectric conversion means are stored, charges serving as electric quantity corresponding to the second period are stored in opposite characteristics;

transfer means for transferring the charges stored in said storing electrostatic capacitor; and a holding electrostatic capacitor in which the charges transferred by said transfer means are stored.

6. The photodetecting apparatus according to claim 1, wherein:

said differential electric quantity generation means comprises:

a storing electrostatic capacitor for storing charges serving as electric quantity corresponding to the first period converted by said photoelectric conversion means and charges serving as electric quantity corresponding to the second period in characteristics opposite to each other;

transfer means for transferring the charges serving as electric quantity corresponding to the first period stored in said storing electrostatic capacitor, and after that, transferring the charges serving as electric quantity corresponding to the second period stored in said storing electrostatic capacitor; and a holding electrostatic capacitor for storing the charges transferred by said transfer means.

7. The photodetecting apparatus according to claim 2, wherein:

said differential electric quantity generation means further comprises:

storing time change means for amplifying a current stored as charges in said first storing electrostatic capacitor by a predetermined plural number, and storing, in said second storing electrostatic capacitor, charges in a period which is the predetermined plural number times as long as a predetermined period stored in said first storing electrostatic capacitor.

8. The photodetecting apparatus according to claim 2, wherein:

said differential electric quantity generation means further comprises:

storing time change means for amplifying a voltage based on charges stored in said first storing electrostatic capacitor in a predetermined period by a predetermined plural number, and storing, in said second storing electrostatic capacitor, charges in a period which is the predetermined plural number times as long as the predetermined period.

9. The photodetecting apparatus according to claim 2, wherein:

said differential electric quantity generation means further comprises:

storing time change means for setting a capacitance of said first storing electrostatic capacitor to be 1/(a predetermined number) times as large as a capacitance of said second storing electrostatic capacitor.

10. The photodetecting apparatus according to claim 2, wherein:

said differential electric quantity generation means further comprises:

storing time change means for holding charges stored in said first storing electrostatic capacitor in a predetermined period in a period which is a predetermined plural number times as long as the predetermined period, and storing charges in said second storing electrostatic capacitor every predetermined period.

11. The photodetecting apparatus according to claim 2, wherein:

said differential electric quantity generation means further comprises:

storing time changing means for storing, in said first storing electrostatic capacitor, charges obtained by detection for a time which is a predetermined plural number times as long as a predetermined time, for the predetermined time, or storing, in said first storing electrostatic capacitor, 1/(the predetermined plural number) charges obtained by detection for a time which is a predetermined plural times as long as a predetermined time, for storing charges in said second storing electrostatic capacitor for the predetermined time, and subtracting the charges stored for the predetermined time or the 1/(the predetermined plural number) charges from the charges stored in said second storing electrostatic capacitor, and for transferring resultant charges to said holding electrostatic capacitor.

12. The photodetecting apparatus according to claim 3, wherein:

said differential electric quantity generation means further comprises:

storing time change means for amplifying a current stored as charges in said storing electrostatic capacitor by a predetermined plural number, and storing, in said holding electrostatic capacitor, charges in a period which is the predetermined plural number times as long as a predetermined period stored in said storing electrostatic capacitor.

13. The photodetecting apparatus according to claim 3, wherein:

said differential electric quantity generation means further comprises:

storing time change means for amplifying a voltage based on charges stored in said storing electrostatic capacitor in a predetermined period by a predetermined plural number, and storing, in said holding electrostatic capacitor, charges in a period which is the predetermined plural number times as long as the predetermined period.

14. The photodetecting apparatus according to claim 3, wherein:

said differential electric quantity generation means further comprises:

storing time change means for setting a capacitance of said storing electrostatic capacitor to be 1/(a predetermined number) times as large as a capacitance of said holding electrostatic capacitor.

15. The photodetecting apparatus according to claim 3, wherein:

said differential electric quantity generation means further comprises:

storing time change means for holding charges stored in said storing electrostatic capacitor in a predetermined period in a period which is a predetermined plural number times as long as the predetermined period, and storing charges in said holding electrostatic capacitor every predetermined period.

16. The photodetecting apparatus according to claim 6, wherein:

said differential electric quantity generation means further comprises:

storing time change means for amplifying a current which corresponds to the first period and is stored as charges in said storing electrostatic capacitor in a predetermined period by a predetermined plural number, and storing, in said storing electrostatic capacitor, charges corresponding to the second period in a period which is the predetermined plural number times as long as the predetermined period.

17. The photodetecting apparatus according to claim 6, wherein:

said differential electric quantity generation means further comprises:

storing time change means for amplifying a voltage based on charges which correspond to the first period and are stored in said storing electrostatic capacitor in a predetermined period by a predetermined plural number, and storing, in said holding electrostatic capacitor, charges corresponding to the second period in a period which is the predetermined plural number times as long as the predetermined period.

18. The photodetecting apparatus according to claim 2, wherein:

said transfer means comprises, an electric switch comprising an arithmetic amplifier and a MOSFET, an electric switch comprising a unit gain buffer comprising a voltage follower and a MOSFET, or an electric switch including a source follower type MOSFET and a MOSFET.

19. The photodetecting apparatus according to claim 2, wherein:

at least part of said storing electrostatic capacitor, said first storing electric capacitor, or said second storing electric capacitor is formed by a junction capacitor of said photoelectric conversion means or a parasitic capacitor of a wiring.

20. The photodetecting apparatus according to claim 2, wherein:

at least part of said holding electrostatic capacitor is formed by an input capacitor of said arithmetic amplifier or said unit gain buffer or a parasitic capacitor of a wire.

21. A photosensor group, comprising:

a plurality of photosensors, each photosensor comprising, photoelectric conversion means for converting incident light into a photoelectric current, and differential electric quantity generation means for calculating a difference between an electric quantity based on a photoelectric current obtained by said photoelectric conversion means in a first period and an electric quantity based on a photoelectric current obtained by said photoelectric conversion means in a second period, said first period being a period in which a light emitting unit is emitting light, and said second period being a period in which the light emitting unit is not emitting light; said differential electric quantity generation means including, a first storing electrostatic capacitor in which charges serving as electric quantity corresponding to the first period are stored, a second storing electrostatic capacitor in which charges serving as electric quantity corresponding to the second period are stored, transfer means for subtracting the charges stored in the second storing electrostatic capacitor from the charges stored in the first storing electrostatic capacitor and transferring resultant charges, and a holding electrostatic capacitor in which the charges transferred by said transfer means are stored;

a wire for one- or two-dimensionally connecting said plurality of photosensors to each other; and a plurality of scanning switches for selecting said plurality of photosensors, respectively.

22. A photosensor, comprising:

photoelectric conversion means for converting incident light into a photoelectric current, and differential electric quantity generation means for calculating a difference between an electric quantity based on a photoelectric current obtained by said photoelectric conversion means in a first period and an electric quantity based on a photoelectric current obtained by said photoelectric conversion means in a second period, said first period being a period in which a light emitting unit is emitting light, and said second period being a period in which the light emitting unit is not emitting light; wherein, said differential electric quantity generation means comprises:

storage means for storing electric quantity based on a photoelectric current in the first period;

reproduction means for reproducing, in the second period, the electric quantity stored in said storage means; and generation means for performing addition or subtraction of electric quantity based on a photoelectric current in the second period and the electric quantity reproduced by said reproduction means to generate a difference therebetween as electric quantity.

23. A photosensor according to claim 22, wherein:

said reproduction means comprises a MOSFET, and said storage means comprises a gate capacitor of said MOSFET.

24. The photosensor group, comprising:

a plurality of photosensors, each photosensor comprising a photosensor according to claim 22, a wire for one- or two-dimensionally connecting said plurality of photosensors to each other; and a plurality of scanning switches for selecting said plurality of photosensors, respectively.

25. The photosensor group of claim 24, wherein the reproduction means of each said photosensor comprises a MOSFET, and the corresponding storage means of each said photosensor comprises a gate capacitor of said MOSFET.

26. A photo detecting apparatus for detecting reflected light from an object and excluding external light component from the reflected light, comprising:

a light-emitting unit for emitting light; and a photo detecting unit, having a plurality of pixels, for detecting light reflected from an object;

the photo detecting unit, for each pixel, having a photoelectric conversion device for converting the detected light into current;

a high-pass filter or a bandpass filter for passing a time frequency component, having a frequency higher than a predetermined frequency, of an output from said photoelectric conversion means under a state that said light-emitting unit is emitting light on the object; and a holding electrostatic capacitor in which the charged having passed through the filter are stored.

27. The photo detecting apparatus according to claim 26 wherein:

a holding electrostatic capacitor which is at least part of an integrator is arranged, an output terminal of said high-pass filter or said bandpass filter is connected to said integrator constituted by said holding electrostatic capacitor, and said high-pass filter or said bandpass filter has an order of not less than 2.

28. The photodetecting apparatus according to claim 26, wherein:

said high-pass filter or said bandpass filter is constituted by a switched capacitor type circuit.

29. A method of sensing distance using a light-emitting unit and a photosensor, said photosensor comprising photoelectric conversion means for converting incident light into a photoelectric current and differential electric quantity generation means for calculating a difference between an electric quantity based on a photoelectric current obtained by said photoelectric conversion means in a first period and an electric quantity based on a photoelectric current obtained by said photoelectric conversion means in a second period, said first period being a period in which the light emitting unit is emitting light, and said second period being a period in which the light emitting unit is not emitting light and wherein the incident light related to the first period is regarded as fixed light and the incident light related to the second period is regarded as reflected light related to light emitted from said light-emitting means, wherein said differential electric quantity generation means comprises, storage means for storing electric quantity based on a photoelectric current in the first period, reproduction means for reproducing, in the second period, the electric quantity stored in said storage means, and generation means for performing addition or subtraction of electric quantity based on a photoelectric current in the second period and the electric quantity reproduced by said reproduction means to generate a difference therebetween as electric quantity, said method comprising:

emitting light from said light emitting unit;

detecting light reflecting from an object; and measuring a time from light emission of said light emitting unit to generation of an electric quantity by said generation means.

30. The method of claim 29, wherein said reproduction means comprises a MOSFET, and said storage means comprises a gate capacitor of said MOSFET.

31. In a photosensor group including a plurality of photosensors, each photosensor comprising photoelectric conversion means for converting incident light into a photoelectric current, and differential electric quantity generation means for calculating a difference between an electric quantity based on a photoelectric current obtained by said photoelectric conversion means in a first period and an electric quantity based on a photoelectric current obtained by said photoelectric conversion means in a second period, said first period being a period in which a light emitting unit is emitting light, and said second period being a period in which the light emitting unit is not emitting light, wherein said differential electric quantity generation means comprises.

storage means for storing electric quantity based on a photoelectric current in the first period, reproduction means for reproducing, in the second period, the electric quantity stored in said storage means, and generation means for performing addition or subtraction of electric quantity based on a photoelectric current in the second period and the electric quantity reproduced by said reproduction means to generate a difference therebetween as electric quantity;

a wire for one- or two-dimensionally connecting said plurality of photosensors to each other; and a plurality of scanning switches for selecting said plurality of photosensors, respectively;

a method for sensing an image, comprising:

sensing the incident light with said plurality of photosensors;

processing the incident light related to the first period as noise light; and processing the incident light related to the second period as imaging light including the noise light and reflected light from an object to be photographed.

* * * * *